(12) United States Patent
Li et al.

(10) Patent No.: US 6,451,942 B1
(45) Date of Patent: Sep. 17, 2002

(54) SUBSTRATES CARRYING POLYMERS OF LINKED SANDWICH COORDINATION COMPOUNDS AND METHODS OF USE THEREOF

(75) Inventors: Junzhong Li; Dorota Gryko; Jonathan S. Lindsey, all of Raleigh, NC (US)

(73) Assignee: North Carolina State University, Raleigh, NC (US)

( * ) Notice: Subject to any disclaimer, the term of this patent is extended or adjusted under 35 U.S.C. 154(b) by 0 days.

(21) Appl. No.: 09/605,587

(22) Filed: Jun. 28, 2000

Related U.S. Application Data

(63) Continuation-in-part of application No. 09/483,500, filed on Jan. 14, 2000, now Pat. No. 6,212,093.

(51) Int. Cl.[7] .............................................. C08F 26/06
(52) U.S. Cl. ....................... 526/258; 526/263; 526/308; 526/259
(58) Field of Search ................................ 526/263, 308, 526/258, 259

(56) References Cited

U.S. PATENT DOCUMENTS 3,637,581 A * 1/1972 Horiguchi et al. ..... 260/41.5 R 4,618,509 A 10/1986 Bulkowski (List continued on next page.)

FOREIGN PATENT DOCUMENTS

| EP | 0 272 935 A2 | 6/1988 | ............ G11B/9/08 |
| EP | 0 307 210 A2 | 3/1989 | ............ G11B/21/00 |
| EP | 0 307 211 A2 | 3/1989 | ............ G11B/21/00 |
| EP | 0 363 147 A2 | 4/1990 | ............ G11B/9/00 |

OTHER PUBLICATIONS

Oriol et al., Prog. Polym. Sci., 22, 873–911, 1997.*
Bao et al., Trends in Polymer Science, 3(5), 159–164 (1995).*

(List continued on next page.)

Primary Examiner—David W. Wu
Assistant Examiner—Ling-Siu Choi
(74) Attorney, Agent, or Firm—Myers Bigel Sibley & Sajovec

(57) ABSTRACT

The present invention provides high density, non-volatile memory devices incorporating polymers comprised of sandwich coordination compounds. Such polymers can have multiple different and distinguishable oxidation states (e.g., ten different and distinguishable oxidation states), and thus provide molecules, information storage media and apparatus that store multiple bits of information. In addition, the polymers can be immobilized or bound to a substrate to produce other useful articles, such as electrochromic displays, molecular capacitors, and batteries.

46 Claims, 46 Drawing Sheets-

U.S. PATENT DOCUMENTS

| | | | |
|---|---|---|---|
| 4,670,860 A | | 6/1987 | Wilson ........................ 365/106 |
| 4,728,724 A | * | 3/1988 | Jones, Jr. et al. ............. 430/19 |
| 5,010,451 A | | 4/1991 | Ueyama et al. ............. 361/504 |
| 5,016,063 A | | 5/1991 | Beratan et al. ................ 357/8 |
| 5,035,835 A | | 7/1991 | Asakawa et al. ........... 252/500 |
| 5,063,417 A | | 11/1991 | Hopfield ........................ 357/8 |
| 5,091,502 A | | 2/1992 | Narang et al. .............. 528/229 |
| 5,135,637 A | | 8/1992 | Eida et al. ................... 205/317 |
| 5,252,698 A | | 10/1993 | Bhardwaj et al. ........... 528/230 |
| 5,264,876 A | | 11/1993 | Kawade et al. .......... 346/153.1 |
| 5,280,183 A | | 1/1994 | Batzel et al. |
| 5,312,896 A | | 5/1994 | Bhardwaj et al. ........... 528/353 |
| 5,434,842 A | * | 7/1995 | Weiss et al. ................ 369/126 |
| 5,506,420 A | | 4/1996 | Kossovsky et al. ........... 257/40 |
| 5,525,811 A | | 6/1996 | Sakurai et al. |
| 5,539,100 A | | 7/1996 | Wasielewski et al. ....... 540/145 |
| 5,547,774 A | | 8/1996 | Gimzewski et al. ........ 428/694 |
| 5,744,598 A | | 4/1998 | Skalkos et al. ............. 540/472 |
| 5,858,666 A | | 1/1999 | Weiss ............................ 435/6 |
| 6,031,756 A | | 2/2000 | Gimzewski et al. |
| 6,128,214 A | | 10/2000 | Kuekes et al. |
| 6,212,093 B1 | | 4/2001 | Lindsey |

OTHER PUBLICATIONS

Roth, Kristian, et al., Molecular approach toward information storage based on the redox properties of porphyrins in self–assembled monolayers, *J. Vac. Sci. Technol.*, vol. B 18, No. 5, pp. 1–5 (Sep./Oct. 2000).

Jiang, Jianzhuang, et al., Heteroleptic triple–decker (phthalocyaninato)–(porphyrinato) europium (III) complexes: synthesis and electrochemical study, *Inorganica Chimica Acta*, vol. 268, pp. 49–53 (1998).

Cotton, F. Albert, et al., *Basic Inorganic Chemistry*, pp. 125, 497, 518 (1976).

Fungo, Fernando, et al., Synthesis of porphyrin dyads with potential use in solar energy conversion, *J. Mater. Chem.*, vol. 10, pp. 645–650 (2000).

International Search Report, International Application No. PCT/US01/00316 dated Apr. 23, 2001.

Gorman; Encapsulated Electroactive Molecules, *Adv. Mater.*, 9(14):1117–1119 (1997).

Gorman et al.; Molecular Structure–Property Relationships for Electron–Transfer Rate Attenuation in Redox–Active Core Dendrimers, *J. Am. Chem. Soc.*, 121(43):9958–9966 (1999).

Ferrocene–Molecule of the Month Jun. 1996, University of Oxford Web Page, http://www.ncl.ox.ac.uk/mom/ferrocene/ferrocene2.html.

Ferrocene—Synthesis, University of Oxford Web Page, htp:/www.ncl.ox.ac.uk/mom/ferrocene/synthesis.html.

Collier et al.; Electronically Configurable Molecular–Based Logic Gates, *Science*, 285:391–394 (1999).

Bocian et al.; U.S. patent application entitled High Density Non–Volatile Memory Device, Ser. No. 09/346,228; Filed Jul. 1, 1999.

Gryko et al.; U.S. patent application entitled High Density Non–Volatile Memory Device Incorporating Thoil–Derivatized Porphyrins, Ser. No. 09/346,221; Filed Jul. 1, 1999.

* cited by examiner

X-axis Logic
(Two Levels
of Working
Electrodes)

Y-axis Logic
(Common
Reference
Electrode)

(Pc)M(Pc)

(Por)M(Pc)

(Por)M(Por)

Pc-M-Por-M-Pc

Triple decker I    Ar =

Triple decker II    Ar =

Triple decker I     Ar =

Triple decker II     Ar =

| porphyrin | R¹ | R² | R³ |
|---|---|---|---|
| IPT-Por | I | $CH_3$ | H |
| IET-Por | TMS-ethynyl | $CH_3$ | I |
| EB-Por | TMS-ethynyl | t-butyl | t-butyl |
| ET-Por | TMS-ethynyl | $CH_3$ | $CH_3$ |

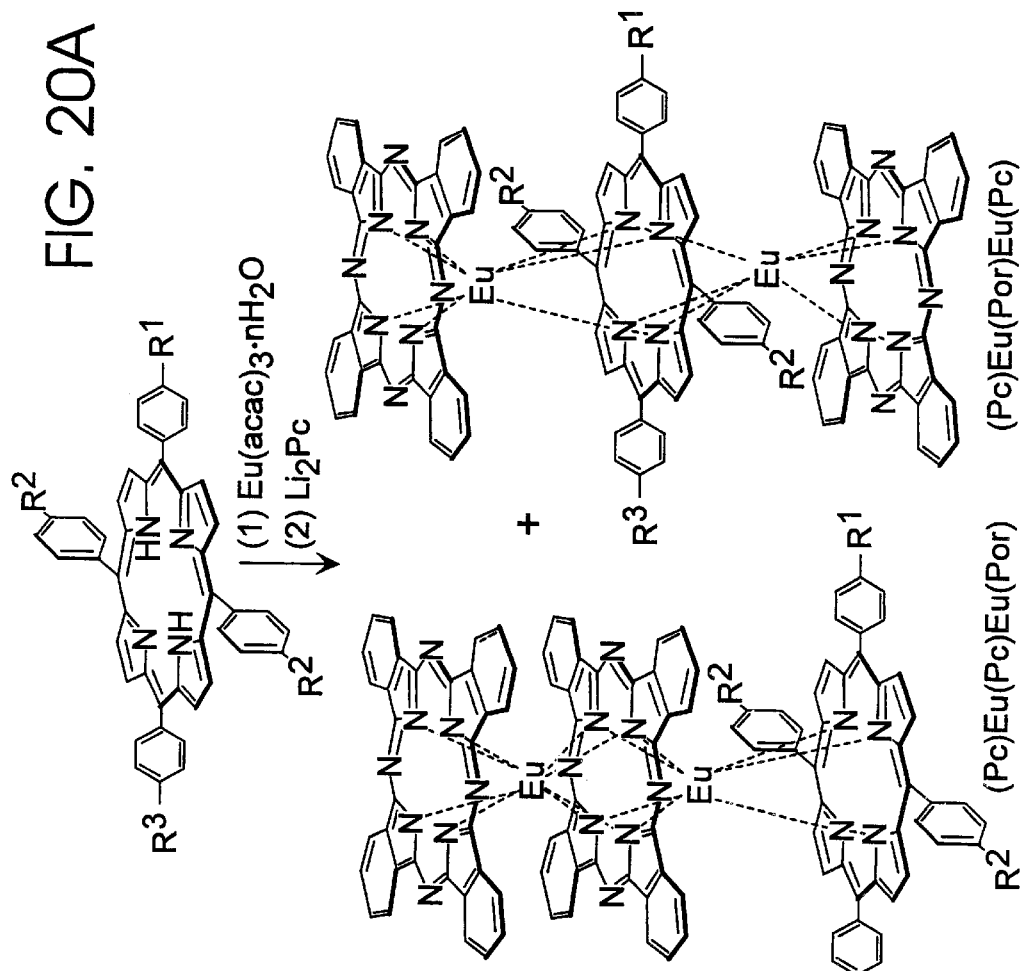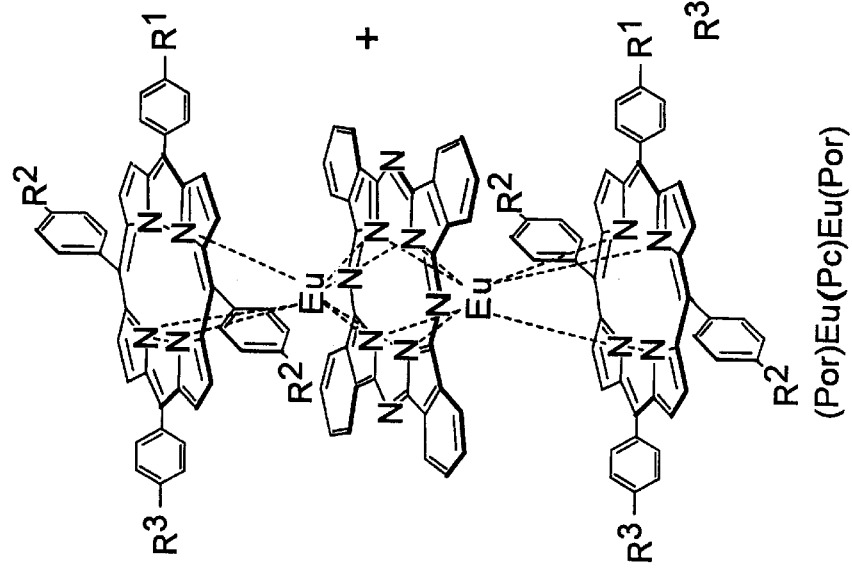
FIG. 20
| FIG. 20A | FIG. 20B |
FIG. 20A

| Triple decker | R¹ | R² | R³ |
|---|---|---|---|
| (Pc)Eu(Pc)Eu(IPT-Por) | I | $CH_3$ | H |
| (Pc)Eu(Pc)Eu(IET-Por) | TMS-ethynyl | $CH_3$ | I |
| (Pc)Eu(Pc)Eu(EB-Por) | TMS-ethynyl | t-butyl | t-butyl |
| (Pc)Eu(Pc)Eu(ET-Por) | TMS-ethynyl | $CH_3$ | $CH_3$ |
| (Pc)Eu(Pc)Eu(E'T-Por) | ethynyl | $CH_3$ | $CH_3$ |
| (Pc)Eu(Pc)Eu(E'B-Por) | ethynyl | t-butyl | t-butyl |

E-dyad-1 contaminated with homo-coupled product (butadiyne-linked dyad)

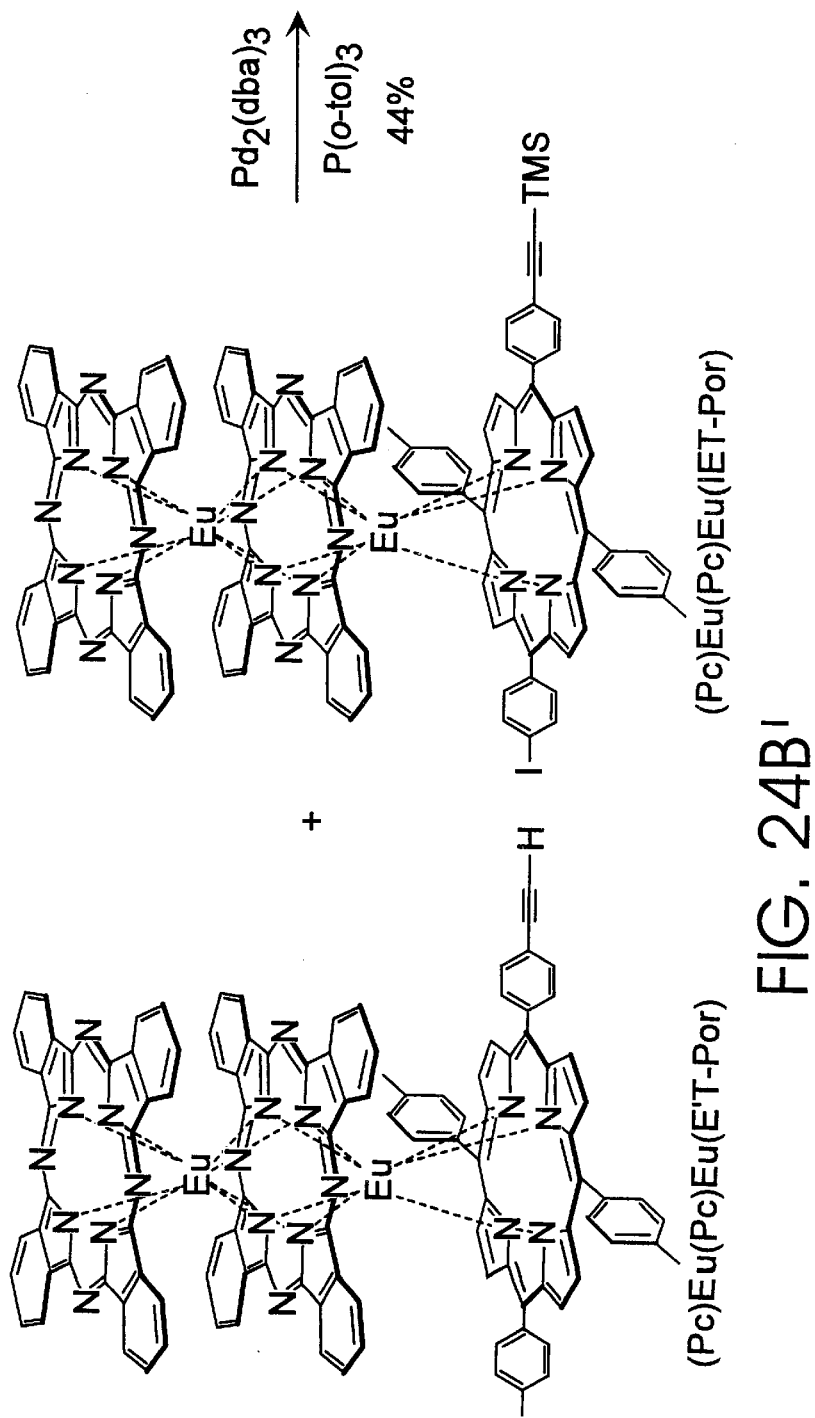

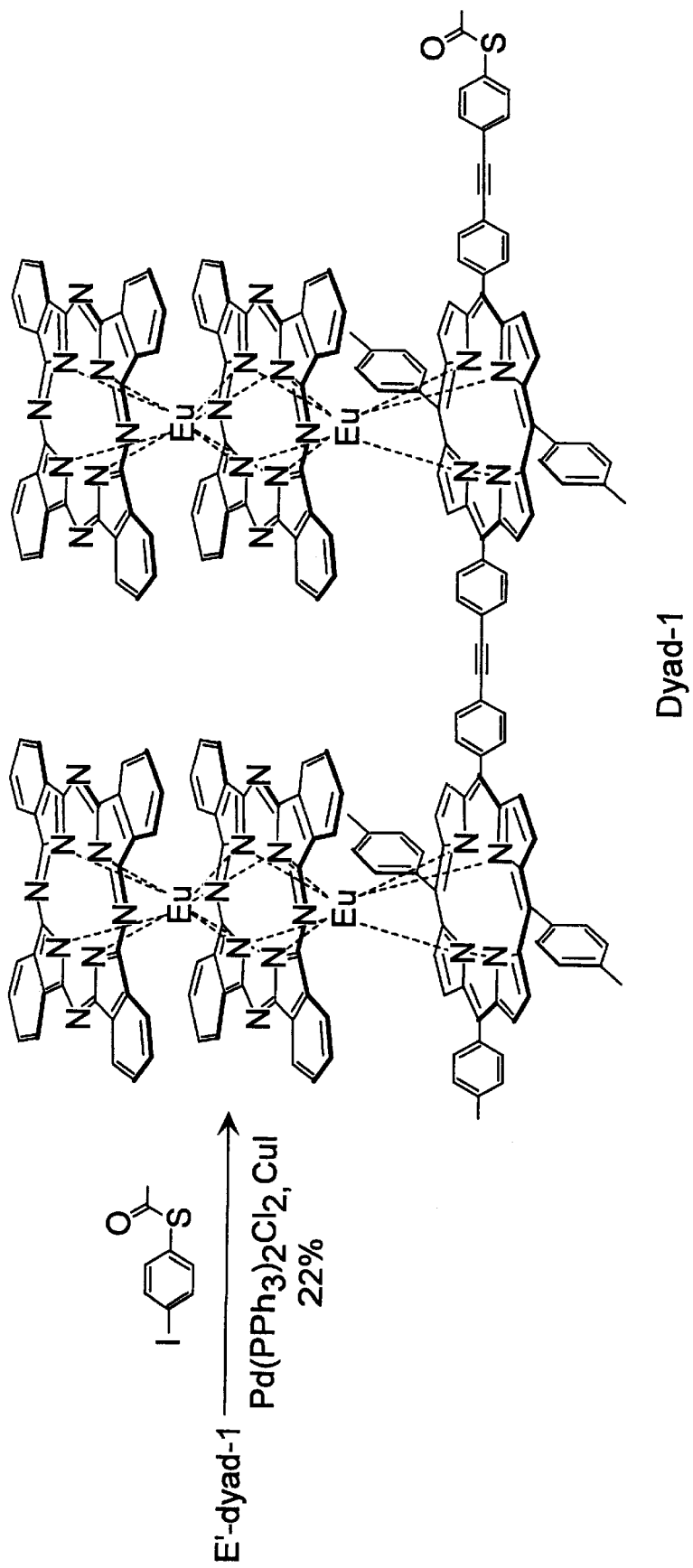
FIG. 24B III

| FIG. 26A | FIG. 26B |
| --- | --- |
|  | FIG. 26C |

| Complex | $R^1$ | $R^2, R^3$ | Metal |
|---|---|---|---|
| 3a, 3b, 3c | p-CH$_3$C$_6$H$_4$ | $R^2 = R^3 = H$ | Eu |
| 4a, 4b, 4c | p-CH$_3$C$_6$H$_4$ | $R^2 = R^3 = OC_8H_{17}$ (2,3,9,10,16,17,23,24) | Eu |
| 5a, 5b, 5c | p-CH$_3$C$_6$H$_4$ | $R^2 = R^3 = OC_4H_9$ (1,4,8,11,15,18,22,25) | Eu |
| 6a, 6b, 6c | p-CH$_3$C$_6$H$_4$ | $R^2 = H, R^3 = (CH_3)_3C$ | Eu |
| 7a, 7b, 7c | C$_5$H$_{11}$ | $R^2 = R^3 = OC_8H_{17}$ (2,3,9,10,16,17,23,24) | Eu |
| 8a, 8b, 8c | C$_5$H$_{11}$ | $R^2 = R^3 = OC_4H_9$ (1,4,8,11,15,18,22,25) | Eu |
| 9a, 9b, 9c | C$_5$H$_{11}$ | $R^2 = H, R^3 = (CH_3)_3C$ | Eu |
| 10a, 10b, 10c | C$_5$H$_{11}$ | $R^2 = R^3 = CH_3$ (2,3,9,10,16,17,23,24) | Eu |
| 11a, 11b, 11c | C$_5$H$_{11}$ | $R^2 = R^3 = CH_3$ (2,3,9,10,16,17,23,24) | Ce |
| 12 a | C$_5$H$_{11}$ | $R^2, R^3$ = annulation for naphthalocyanine | Eu |

FIG. 26C

Scheme 2

| FIG. 27A |
| FIG. 27B |

SUBSTRATES CARRYING POLYMERS OF LINKED SANDWICH COORDINATION COMPOUNDS AND METHODS OF USE THEREOF

RELATED APPLICATIONS

This application is a continuation-in-part of commonly owned, application Ser. No. 09/483,500 of Jonathan S. Lindsey, filed Jan. 14, 2000, now issued as U.S. Pat. No. 6,212,093, the disclosure of which is incorporated by reference herein in its entirety.

This invention was made with Government support under Grant No. N00014-99-1-0357 from the Office of Naval Research. The Government has certain rights to this invention.

FIELD OF THE INVENTION

This invention relates to the articles of manufacture comprising a substrate having electric storage molecules bound thereto, along with methods of use thereof.

BACKGROUND OF THE INVENTION

Basic functions of a computer include information processing and storage. In typical computer systems, these arithmetic, logic. and memory operations are performed by devices that are capable of reversibly switching between two states often referred to as "0" and "1". In most cases. such switching devices are fabricated from semiconducting devices that perform these various functions and are capable of switching between two states at a very high speed using minimum amounts of electrical energy. Thus, for example, transistors and transistor variants perform the basic switching and storage functions in computers.

Because of the huge data storage requirements of modern computers, a new, compact, low-cost, very high capacity, high speed memory configuration is needed. To reach this objective, molecular electronic switches, wires, microsensors for chemical analysis, and opto-electronic components for use in optical computing have been pursued. The principal advantages of using molecules in these applications are high component density (upwards of $10^{10}$ bits per square centimeter), increased response speeds, and high energy efficiency.

A variety of approaches have been proposed for molecular-based memory devices. While these approaches generally employ molecular architectures that can be switched between two different states, all of the approaches described to date have intrinsic limitations making their uses in computational devices difficult or impractical.

For example, such approaches to the production of molecular memories have involved photochromic dyes, electrochromic dyes, redox dyes, and molecular machines, all having fundamental limitations that have precluded their application as viable memory elements. These molecular architectures are typically limited by reading/writing constraints. Furthermore, even in cases where the effective molecular bistability is obtained, the requirement for photochemical reading restricts the device architecture to a 2-dimensional thin film. The achievable memory density of such a film is unlikely to exceed $10^{10}$ bits/cm$^2$. Such limitations greatly diminish the appeal of these devices as viable molecular memory elements.

SUMMARY OF THE INVENTION

The present invention provides a polymer comprising or consisting of a plurality of covalently joined monomeric units, the monomeric units comprising sandwich coordination compounds. The covalently joined monomeric units in the polymer may be the same sandwich coordination compounds (e.g., the polymer is a homopolymer) or different sandwich coordination compounds (e.g., the polymer is a copolymer). The polymers may be covalently bound (direct or through a linker) or noncovalently bound (via ionic linkage or non-ionic "bonding", etc.) to a substrate (a carrier substrate) to produce an article of manufacture. The substrate may be any of a variety of materials, including conductors, semiconductors, insulators, and composites thereof. Particular materials include metals, metal oxides, organic polymers, etc. The polymers may be bonded singly or co-deposited with one or more other polymers and/or other information storage molecules.

Such articles of manufacture are useful for a variety of purposes. For example, these polymers and articles of manufacture afford promising electrochromic display materials, potentially offering high contrast and a wide variety of colors by tuning the applied electric potential. These materials also find potential applications as intrinsic molecular semiconductors. The rich electrochemical properties of these materials also make them useful as potential battery materials and for applications in molecular-based information storage devices.

Polymers of the present invention may be represented by Formula I:

  (I)

wherein:

m is at least 1 (e.g., 1, 2, or 3 to 10, 20, 50 or 100 or more) and $X^1$ through $X^{m+1}$ are sandwich coordination compounds (each of which may be the same or different).

Specific examples of polymers of Formula I are polymers of Formula II:

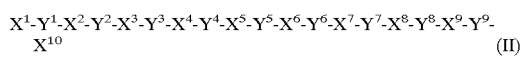  (II)

wherein:

$X^1$ through $X^{10}$ are each independently selected sandwich coordination compounds;

$Y^1$ through $Y^9$ are independently selected linking groups or linkers; and $X^3$ through $X^{10}$ (and $Y^3$ through $Y^9$) may each independently or consecutively be present or absent (e.g., to provide a polymer of anywhere from 2 to 10 sandwich coordination compounds).

Articles of manufacture of the present invention may be represented by Formula III:

  (III)

wherein:

A is a substrate (e.g., a conductor. a semiconductor, an insulator, or a composite thereof);

m is at least 1 (e.g., 1, 2, or 3 to 10, 20, 50 or 100 or more); and $X^1$ through $X^{m+1}$ are sandwich coordination compounds (each of which may be the same or different).

Specific examples of articles of manufacture of Formula IIII are articles of Formula IV:

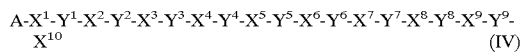  (IV)

wherein:
A is a substrate (e.g., a conductor, a semiconductor, an insulator, or a composite thereof);
$X^1$ through $X^{10}$ are each independently selected sandwich coordination compounds;
$Y^1$ through $Y^9$ are independently selected linking groups or linkers; and
$X^3$ through $X^{10}$ (and $Y^3$ through $Y^9$) may each independently or consecutively be present or absent (e.g., to provide a polymer of anywhere from 2 to 10 sandwich coordination compounds).

Particular examples of sandwich coordination compounds that may be used to carry out the present invention have the Formula XI (for double-decker sandwich compounds) or Formula XII (for triple-decker sandwich compounds):

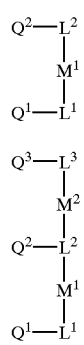

(XI)

(XII)

wherein:
$M^1$ and $M^2$ (when present) are metals independently selected from the group consisting of metals of the lanthanide series (Ln=La, Ce, Pr, Nd, Pm, Sm, Eu, Gd, Tb, Dy, Ho, Er, Tm, Yb, Lu, as well as Y, Zr, Hf, and Bi, and in the actinide series Th and U (radioactive elements such as Pm are generally less preferred);
$L^1$, $L^2$ and $L^3$ (when present) are independently selected ligands (e.g., porphyrinic macrocycles); and
$Q^1$, $Q^2$ and $Q^3$ may be present or absent and when present are independently selected linkers (the linker preferably including a protected or unprotected reactive group such as thio, seleno or telluro group). Preferably, at least one of $Q^1$, $Q^2$, and $Q^3$ is present.

In one particular embodiment, this invention provides an apparatus for storing data (e.g., a "storage cell"). The storage cell includes a fixed electrode electrically coupled to a "storage medium" comprising a polymer as described above, the polymer having a plurality of different and distinguishable oxidation states where data is stored in the (preferably non-neutral) oxidation states by the addition or withdrawal of one or more electrons from said storage medium via the electrically coupled electrode.

In preferred storage cells, the storage medium stores data at a density of at least one bit, and preferably at a density of at least 2 bits. Thus, preferred storage media have at least 2, and preferably at least 4, 8 or 10 or more different and distinguishable oxidation states. In particularly preferred embodiments, the bits are all stored in non-neutral oxidation states. In a most preferred embodiment, the different and distinguishable oxidation states of the storage medium can be set by a voltage difference no greater than about 5 volts, more preferably no greater than about 2 volts, and most preferably no greater than about 1 volt.

The storage medium is electrically coupled to the electrode(s) by any of a number of convenient methods including, but not limited to, covalent linkage (direct or through a linker), ionic linkage, non-ionic "bonding", simple juxtaposition/apposition of the storage medium to the electrode(s), or simple proximity to the electrode(s) such that electron tunneling between the medium and the electrode(s) can occur. The storage medium can contain or be juxtaposed to or layered with one or more dielectric material(s). Preferred dielectric materials are imbedded with counterions (e.g. Nafion® fluoropolymer). The storage cells of this invention are fully amenable to encapsulation (or other packaging) and can be provided in a number of forms including, but not limited to, an integrated circuit or as a component of an integrated circuit, a non-encapsulated "chip", etc. In some embodiments, the storage medium is electronically coupled to a second electrode that is a reference electrode. In certain preferred embodiments, the storage medium is present in a single plane in the device. The apparatus of this invention can include the storage medium present at a multiplicity of storage locations, and in certain configurations, each storage location and associated electrode(s) forms a separate storage cell. The storage medium may be present on a single plane in the device (in a two dimensional or sheet-like device) or on multiple planes in the device (in a three-dimensional device). Virtually any number (e.g., 16, 32, 64, 128, 512, 1024, 4096, etc.) of storage locations and storage cells can be provided in the device. Each storage location can be addressed by a single electrode or by two or more electrodes. In other embodiments, a single electrode can address multiple storage locations and/or multiple storage cells.

In preferred embodiments, one or more of the electrode(s) is connected to a voltage source (e.g. output of an integrated circuit, power supply, potentiostat, microprocessor (CPU), etc.) that can provide a voltage/signal for writing, reading, or refreshing the storage cell(s). One or more of the electrode(s) is preferably connected to a device (e.g., a voltammetric device, an amperometric device, a potentiometric device, etc.) to read the oxidation state of said storage medium. In particularly preferred embodiments, the device is a sinusoidal voltammeter. Various signal processing methods can be provided to facilitate readout in the time domain or in the frequency domain. Thus, in some embodiments, the readout device provides a Fourier transform (or other frequency analysis) of the output signal from said electrode. In certain preferred embodiments, the device refreshes the oxidation state of said storage medium after reading said oxidation state.

Particularly preferred methods and/or devices of this invention utilize a "fixed" electrode. Thus, in one embodiment, methods and/or devices in which the electrode(s) are moveable (e.g. one or more electrodes is a "recording head", the tip of a scanning tunneling microscope (STM), the tip of an atomic force microscope (AFM), or other forms in which the electrode is movable with respect to the storage medium) are excluded. Similarly in certain embodiments, methods and/or devices and/or storage media, in which the storage molecules are responsive to light and/or in which the oxidation state of a storage molecule is set by exposure to light are excluded.

In another embodiment, this invention provides an information storage medium. The information storage medium can be used to assemble storage cells and/or the various memory devices described herein. In a preferred embodiment the storage medium comprises one or more different storage molecules. When different species of storage molecule are present, the oxidation state(s) of each species is preferably different from and distinguishable from the oxidation state(s) of the other species of storage molecule comprising the storage medium.

This invention also provides methods of storing data. The methods involve i) providing an apparatus, e.g., comprising one or more storage cells as described herein, and ii) applying a voltage to the electrode at sufficient current to set an oxidation state of said storage medium (the storage medium comprising one or more storage cells). In preferred embodiments, the voltage range is less than about 5 volts, more preferably less than about 2 volts, and most preferably less than about 1 or less than about 0.5 volts. The voltage can be the output of any convenient voltage source (e.g. output of an integrated circuit, power supply, logic gate, potentiostat, microprocessor (CPU), etc.) that can provide a voltage/signal for writing, reading, or refreshing the storage cell(s).

The method can further involve detecting the oxidation state of the storage medium and thereby reading out the data stored therein. The detection (read) can optionally involve refreshing the oxidation state of the storage medium. The read (detecting) can involve analyzing a readout signal in the time or frequency domain and can thus involve performing a Fourier transform on the readout signal. The detection can be by any of a variety of methods including, but not limited to a voltammetric method.

This invention additionally provides the memory devices of this invention (e.g. memory cells) in a computer system. In addition computer systems utilizing the memory devices of this invention are provided. Preferred computer systems include a central processing unit, a display, a selector device, and a memory device comprising the storage devices (e.g. storage cells) of this invention.

DETAILED DESCRIPTION OF THE PREFERRED EMBODIMENTS

Figure 1:
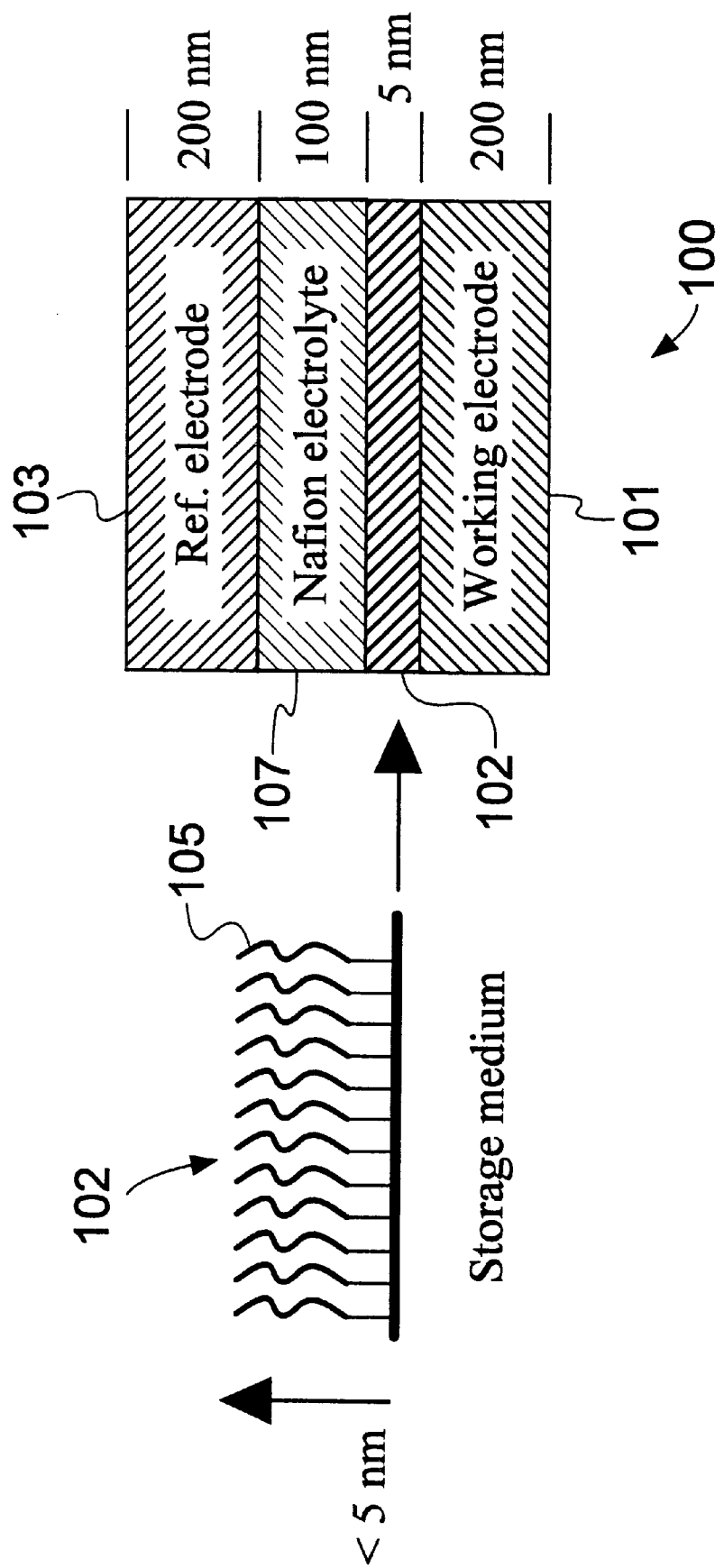
FIG. 1 illustrates a basic molecular memory unit "storage cell" of the present invention.

As noted above, this invention provides novel high density memory devices that are electrically addressable permitting effective reading and writing, that provide a high memory density (e.g. $10^{15}$ bits/cm$^3$), that provide a high degree of fault tolerance, and that are amenable to efficient chemical synthesis and chip fabrication.

The terms "sandwich coordination compound" or "sandwich coordination complex" refer to a compound of the formula $L^N M^{n-1}$, where each L is a heterocyclic ligand (as described below), each M is a metal, n is 2 or more, most preferably 2 or 3, and each metal is positioned between a pair of ligands and bonded to one or more hetero atom (and typically a plurality of hetero atoms, e.g., 2, 3, 4, 5) in each ligand (depending upon the oxidation state of the metal). Thus sandwich coordination compounds are not organometallic compounds such as ferrocene, in which the metal is bonded to carbon atoms. The ligands in the sandwich coordination compound are generally arranged in a stacked orientation (i.e., are generally cofacially oriented and axially aligned with one another, although they may or may not be rotated about that axis with respect to one another). See, e.g., D. Ng and J. Jiang, Sandwich-type heteroleptic phthalocyaninato and porphyrinato metal complexes, *Chemical Society Reviews* 26, 433–442 (1997).

The term "double-decker sandwich coordination compound" refers to a sandwich coordination compound as described above where n is 2, thus having the formula $L^1-M^1-L^2$, wherein each of $L^1$ and $L^2$ may be the same or different. See, e.g., J. Jiang et al, Double-decker Yttrium (III) Complexes with Phthalocyaninato and Porphyrinato Ligands, *J. Porphyrins Phthalocyanines* 3, 322–328 (1999).

The term "triple-decker sandwich coordination compound" refers to a sandwich coordination compound as described above where n is 3, thus having the formula $L^1-M^1-L^2-M^2-L^3$, wherein each of $L^1$, $L^2$ and $L^3$ may be the same or different, and $M^1$ and $M^2$ may be the same or different. See, e.g., D. Arnold et al., Mixed Phthalocyaninato-Porphyrinato Europium(III) Triple-decker Sandwich Complexes containing a Conjugated Dimeric Porphyrin Ligand, *Chemistry Letters* 483–484 (1999).

The term "homoleptic sandwich coordination compound" refers to a sandwich coordination compound as described above wherein all of the ligands L are the same.

The term "heteroleptic sandwich coordination compound" refers to a sandwich coordination compound as described above wherein at least one ligand L is different from the other ligands therein.

The term "heterocyclic ligand" as used herein generally refers to any heterocyclic molecule consisting of carbon atoms containing at least one, and preferably a plurality of, hetero atoms (e.g., N, O, S, Se, Te), which hetero atoms may be the same or different, and which molecule is capable of forming a sandwich coordination compound with another heterocyclic ligand (which may be the same or different) and a metal. Such heterocyclic ligands are typically macrocycles, particularly tetrapyrrole derivatives such as the phthalocyanines, porphyrins, and porphyrazines. See, e.g., T.-H. Tran-Thi, Assemblies of phthalocyanines with porphyrins and porphyrazines: ground and excited state optical properties, *Coordination Chemistry Reviews* 160, 53–91 (1997).

The term "oxidation" refers to the loss of one or more electrons in an element, compound, or chemical substituent/subunit. In an oxidation reaction, electrons are lost by atoms of the element(s) involved in the reaction. The charge on these atoms must then become more positive. The electrons are lost from the species undergoing oxidation and so electrons appear as products in an oxidation reaction. An oxidation is taking place in the reaction $Fe^{2+}(aq) \rightarrow Fe^{3+}(aq) + e^-$ because electrons are lost from the species being oxidized, $Fe^{2+}(aq)$, despite the apparent production of electrons as "free" entities in oxidation reactions. Conversely the term reduction refers to the gain of one or more electrons by an element, compound, or chemical substituent/subunit.

An "oxidation state" refers to the electrically neutral state or to the state produced by the gain or loss of electrons to an element, compound, or chemical substituent/subunit. In a preferred embodiment, the term "oxidation state" refers to states including the neutral state and any state other than a neutral state caused by the gain or loss of electrons (reduction or oxidation).

The term "multiple oxidation states" means more than one oxidation state. In preferred embodiments, the oxidation states may reflect the gain of electrons (reduction) or the loss of electrons (oxidation).

The term "different and distinguishable" when referring to two or more oxidation states means that the net charge on the entity (atom, molecule, aggregate, subunit, etc.) can exist in two different states. The states are said to be "distinguishable" when the difference between the states is greater than thermal energy at room temperature (e.g. 0° C. to about 40° C.).

The term "electrode" refers to any medium capable of transporting charge (e.g. electrons) to and/or from a storage molecule. Preferred electrodes are metals or conductive organic molecules. The electrodes can be manufactured to virtually any 2-dimensional or 3-dimensional shape (e.g. discrete lines, pads, planes, spheres, cylinders, etc.).

The term "fixed electrode" is intended to reflect the fact that the electrode is essentially stable and unmovable with respect to the storage medium. That is, the electrode and storage medium are arranged in an essentially fixed geometric relationship with each other. It is of course recognized that the relationship alters somewhat due to expansion and contraction of the medium with thermal changes or due to changes in conformation of the molecules comprising the electrode and/or the storage medium. Nevertheless, the overall spatial arrangement remains essentially invariant. In a preferred embodiment this term is intended to exclude systems in which the electrode is a movable "probe" (e.g. a writing or recording "head", an atomic force microscope (AFM) tip, a scanning tunneling microscope (STM) tip, etc.).

The term "working electrode" is used to refer to one or more electrodes that are used to set or read the state of a storage medium and/or storage molecule.

The "term reference electrode" is used to refer to one or more electrodes that provide a reference (e.g. a particular reference voltage) for measurements recorded from the working electrode. In preferred embodiments, the reference electrodes in a memory device of this invention are at the same potential although in some embodiments this need not be the case.

The term "electrically coupled" when used with reference to a storage molecule and/or storage medium and electrode refers to an association between that storage medium or molecule and the electrode such that electrons move from the storage medium/molecule to the electrode or from the electrode to the storage medium/molecule and thereby alter the oxidation state of the storage medium/molecule. Electrical coupling can include direct covalent linkage between the storage medium/molecule and the electrode, indirect covalent coupling (e.g. via a linker), direct or indirect ionic bonding between the storage medium/molecule and the electrode, or other bonding (e.g. hydrophobic bonding). In addition, no actual bonding may be required and the storage medium/molecule may simply be contacted with the electrode surface. There also need not necessarily be any contact between the electrode and the storage medium/molecule where the electrode is sufficiently close to the storage medium/molecule to permit electron tunneling between the medium/molecule and the electrode.

The term "redox-active unit" or "redox-active subunit" refers to a molecule or component of a molecule that is capable of being oxidized or reduced by the application of a suitable voltage.

The term "subunit", as used herein, refers to a redox-active component of a molecule.

The terms "storage molecule" or "memory molecule" refer to a molecule having one or more oxidation states that can be used for the storage of information (e.g. a molecule comprising one or more redox-active subunits). Preferred storage molecules have two or more different and distinguishable non-neutral oxidation states. In addition to the polymers of Formula I and Formula II herein, a wide variety of additional molecules can be used as storage molecules and hence further comprise the storage medium. Preferred molecules include, but are not limited to a porphyrinic macrocycle, a metallocene, a linear polyene, a cyclic polyene, a heteroatom-substituted linear polyene, a heteroatom-substituted cyclic polyene, a tetrathiafulvalene, a tetraselenafulvalene, a metal coordination complex, a buckminsterfullerene (.e., a "buckyball"), a triarylamine, a 1,4-phenylenediamine, a xanthene, a flavin, a phenazine, a phenothiazine, an acridine, a quinoline, a 2,2'-bipyridyl, a 4,4'-bipyridyl, a tetrathiotetracene, and a peri-bridged naphthalene dichalcogenide. Even more preferred molecules include a porphyrin, an expanded porphyrin, a contracted porphyrin, a ferrocene, a linear porphyrin polymer, and porphyrin array. Certain particularly preferred storage molecules include a porphyrinic macrocycle substituted at a β-position or at a meso-position. Molecules well suited for use as storage molecules include the molecules described herein.

The term "storage medium" refers to a composition comprising a storage molecule of the invention, preferably bonded to a substrate.

The term "electrochemical cell" consists minimally of a reference electrode, a working electrode, a redox-active medium (e.g. a storage medium), and, if necessary, some means (e.g., a dielectric) for providing electrical conductivity between the electrodes and/or between the electrodes and the medium. In some embodiments, the dielectric is a component of the storage medium.

The terms "memory element", "memory cell", or "storage cell" refer to an electrochemical cell that can be used for the storage of information. Preferred "storage cells" are discrete regions of storage medium addressed by at least one and preferably by two electrodes (e.g. a working electrode and a reference electrode). The storage cells can be individually addressed (e.g. a unique electrode is associated with each memory element) or, particularly where the oxidation states of different memory elements are distinguishable, multiple memory elements can be addressed by a single electrode. The memory element can optionally include a dielectric (e.g. a dielectric impregnated with counterions).

The term "storage location" refers to a discrete domain or area in which a storage medium is disposed. When addressed with one or more electrodes, the storage location may form a storage cell. However if two storage locations contain the same storage media so that they have essentially the same oxidation states, and both storage locations are commonly addressed, they may form one functional storage cell.

Addressing a particular element refers to associating (e.g., electrically coupling) that memory element with an electrode such that the electrode can be used to specifically determine the oxidation state(s) of that memory element.

The term "storage density" refers to the number of bits per volume and/or bits per molecule that can be stored. When the storage medium is said to have a storage density greater than one bit per molecule, this refers to the fact that a storage medium preferably comprises molecules wherein a single molecule is capable of storing at least one bit of information.

The terms "read", "detect" or "interrogate" interchangeably refer to the determination of the oxidation state(s) of one or more molecules (e.g. molecules comprising a storage medium).

The term "refresh" when used in reference to a storage molecule or to a storage medium refers to the application of a voltage to the storage molecule or storage medium to re-set the oxidation state of that storage molecule or storage medium to a predetermined state (e.g. the oxidation state the storage molecule or storage medium was in immediately prior to a read).

The term "$E_{1/2}$" refers to the practical definition of the formal potential (B°) of a redox process as defined by B−B°+(RT/nF)ln($D_{ox}$/$D_{red}$) where R is the gas constant. T is temperature in K (Kelvin), n is the number of electrons involved in the process, F is the Faraday constant (96,485 Coulomb/mole), $D_{ox}$ is the diffusion coefficient of the oxidized species and $D_{red}$ is the diffusion coefficient of the reduced species.

A voltage source is any source (e.g. molecule, device, circuit, etc.) capable of applying a voltage to a target (e.g. an electrode).

The term "present on a single plane", when used in reference to a memory device of this invention refers to the fact that the component(s) (e.g. storage medium, electrode (s), etc.) in question are present on the same physical plane in the device (e.g. are present on a single lamina). Components that are on the same plane can typically be fabricated at the same time, e.g., in a single operation. Thus, for example, all of the electrodes on a single plane can typically be applied in a single (e.g., sputtering) step (assuming they are all of the same material).

The phrase "output of an integrated circuit" refers to a voltage or signal produced by one or more integrated circuit(s) and/or one or more components of an integrated circuit.

A "voltammetric device" is a device capable of measuring the current produced in an electrochemical cell as a result of the application of a voltage or change in voltage.

An "amperometric device" is a device capable of measuring the current produced in an electrochemical cell as a result of the application of a specific field potential ("voltage").

A potentiometric device is a device capable of measuring potential across an interface that results from a difference in the equilibrium concentrations of redox molecules in an electrochemical cell.

A "coulometric device" is a device capable of measuring the net charge produced during the application of a potential field ("voltage") to an electrochemical cell.

A "sinusoidal voltammeter" is a voltammetric device capable of determining the frequency domain properties of an electrochemical cell.

The term "porphyrinic macrocycle" refers to a porphyrin or porphyrin derivative. Such derivatives include porphyrins with extra rings ortho-fused, or ortho-perifused, to the porphyrin nucleus, porphyrins having a replacement of one or more carbon atoms of the porphyrin ring by an atom of another element (skeletal replacement), derivatives having a replacement of a nitrogen atom of the porphyrin ring by an atom of another element (skeletal replacement of nitrogen), derivatives having substituents other than hydrogen located at the peripheral (meso-, β-) or core atoms of the porphyrin, derivatives with saturation of one or more bonds of the porphyrin (hydroporphyrins, e.g., chlorins, bacteriochlorins, isobacteriochlorins, decahydroporphyrins, corphins, pyrrocorphins, etc.), derivatives obtained by coordination of one or more metals to one or more porphyrin atoms (metalloporphyrins). derivatives having one or more atoms, including pyrrolic and pyrromethenyl units, inserted in the porphyrin ring (expanded porphyrins), derivatives having one or more groups removed from the porphyrin ring (contracted porphyrins, e.g., corrin, corrole) and combinations of the foregoing derivatives (e.g. phthalocyanines, porphyrazines, naphthalocyanines, subphthalocyanines, and porphyrin isomers). Preferred porphyrinic macrocycles comprise at least one 5-membered ring.

The term porphyrin refers to a cyclic structure typically composed of four pyrrole rings together with four nitrogen atoms and two replaceable hydrogens for which various metal atoms can readily be substituted. A typical porphyrin is hemin.

The term "multiporphyrin array" refers to a discrete number of two or more covalently-linked porphyrinic macrocycles. The multiporphyrin arrays can be linear, cyclic, or branched.

A linker is a molecule used to couple two different molecules, two subunits of a molecule, or a molecule to a substrate. When all are covalently linked, they form units of a single molecule.

A substrate is a, preferably solid, material suitable for the attachment of one or more molecules. Substrates can be formed of materials including, but not limited to glass, plastic, silicon, minerals (e.g. quartz), semiconducting materials, ceramics, metals, etc.

The term "aryl" refers to a compound whose molecules have the ring structure characteristic of benzene, naphthalene, phenanthrene, anthracene, etc. (i.e., either the 6-carbon ring of benzene or the condensed 6-carbon rings of the other aromatic derivatives). For example, an aryl group may be phenyl ($C_6H_5$) or naphthyl ($C_{10}H_7$). It is recognized that the aryl, while acting as substituent can itself have additional substituents (e.g. the substituents provided for $S^n$ in the various formulas herein).

The term "alkyl" refers to a paraffinic hydrocarbon group which may be derived from an alkane by dropping one hydrogen from the formula. Examples are methyl ($CH_3$—), ethyl ($C_2H_5$—), propyl ($CH_3CH_2CH_2$—), isopropyl (($CH_3)_2$CH—).

The term "halogen" refers to one of the electronegative elements of group VIIA of the periodic table (fluorine, chlorine, bromine, iodine, astatine).

The term "nitro" refers to an —$NO_2$ group.

The term "amino" refers to an —$NH_2$ group.

The term "perfluoroalkyl" refers to an alkyl group where every hydrogen atom is replaced with a fluorine atom.

The term "perfluoroaryl" refers to an aryl group where every hydrogen atom is replaced with a fluorine atom.

The term "pyridyl" refers to an aryl group where one CR unit is replaced with a nitrogen atom.

The term "cyano" refers to an —CN group.

The term "thiocyanato" refers to an —SCN group.

The term "sulfoxyl" refers to a group of composition RS(O)— where R is some alkyl, aryl, cycloalkyl, perfluoroalkyl, or perfluoroaryl group. Examples include, but are not limited to methylsulfoxyl, phenylsulfoxyl, etc.

The term "sulfonyl" refers to a group of composition $RSO_2$— where R is some alkyl, aryl, cycloalkyl, perfluoroalkyl, or perfluoroaryl group. Examples include, but are not limited to methylsulfonyl, phenylsulfonyl, p-toluenesulfonyl, etc.

The term "carbamoyl" refers to the group of composition $R^1(R^2)NC(O)$— where $R^1$ and $R^2$ are H or some alkyl, aryl, cycloalkyl, perfluoroalkyl, or perfluoroaryl group. Examples include, but are not limited to N-ethylcarbamoyl, N,N-dimethylcarbarnoyl, etc.

The term "amido" refers to the group of composition $R^1CON(R^2)$— where $R^1$ and $R^2$ are H or some alkyl, aryl, cycloalkyl, perfluoroalkyl, or perfluoroaryl group. Examples include, but are not limited to acetamido, N-ethylbenzamido, etc.

The term "acyl" refers to an organic acid group in which the -OH of the carboxyl group is replaced by some other substituent (RCO—). Examples include, but are not limited to acetyl, benzoyl, etc.

In preferred embodiments, when a metal is designated by "M" or "$M^n$", where n is an integer, it is recognized that the metal may be associated with a counterion.

The term "substituent" as used in the formulas herein, particularly designated by S or $S^n$ where n is an integer, in a preferred embodiment refer to redox-active groups (subunits) that can be used to adjust the redox potential(s) of the subject compound. Preferred substituents include, but are not limited to, aryl, phenyl, cycloalkyl, alkyl, halogen, alkoxy, alkylthio, perfluoroalkyl, perfluoroaryl, pyridyl, cyano, thiocyanato, nitro, amino, alkylamino, acyl, sulfoxyl, sulfonyl, amido, and carbamoyl. In preferred embodiments, a substituted aryl (group is attached to a porphyrin or a porphyrinic macrocycle, and the substituents on the aryl group are selected from the group consisting of aryl, phenyl, cycloalkyl, alkyl, halogen, alkoxy, alkylthio, perfluoroalkyl, perfluoroaryl, pyridyl, cyano, thiocyanato, nitro, amino, alkylamino, acyl, sulfoxyl, sulfonyl, amido, and carbamoyl. Additional substituents include, but are not limited to, 4-chlorophenyl, 4-trifluoromethylphenyl, and 4-methoxyphenyl. Preferred substituents provide a redox potential range of less than about 5 volts, preferably less than about 2 volts, more preferably less than about 1 volt.

The phrase "provide a redox potential range of less than about X volts" refers to the fact that when a substituent providing such a redox potential range is incorporated into a compound, the compound into which it is incorporated has an oxidation potential less than or equal to X volts, where X is a numeric value.

One embodiment of this invention is illustrated in FIG. 1. The basic memory device, a "storage cell" 100 comprises a working electrode 101 electrically coupled to a storage medium 102 comprising a multiplicity of storage molecules 105. The storage cell optionally includes an electrolyte 107 and a reference electrode 103. The storage medium has a multiplicity of different and distinguishable oxidation states, preferably a multiplicity of different and distinguishable non-neutral oxidation states, and can change oxidation (charge) state when a voltage or signal is applied thereby adding or removing one or more electrons. Each oxidation state may be used to represent stored information.

The storage medium may remain in the set oxidation state until another voltage is applied to alter that oxidation state, can be refreshed, or the information content can be allowed to dissipate over time. The oxidation state of the storage medium can be readily determined using a wide variety of electronic (e.g. amperometric, coulometric, voltammetric) methods thereby providing rapid readout.

The storage medium comprises molecules having a single oxidation state and/or molecules having multiple different and distinguishable non-neutral oxidation states. Thus, for example, in one embodiment, the storage medium can comprise eight different species of storage molecules each having one non-neutral oxidation state and thereby store three bits, or one byte if the oxidation states are independently accessed. In another embodiment, the storage medium can comprise one species of molecule that has eight different and distinguishable oxidation states and likewise store three bits or one byte in that manner as well. As explained herein, a large number of different molecules having different numbers of oxidation states can be used for the storage medium.

Because molecular dimensions are so small (on the order of angstroms) and individual molecules in the devices of this invention can store multiple bits, the storage devices of this invention therefore offer remarkably high storage densities (e.g. $>10^{15}$ bits/cm$^3$).

Moreover, unlike prior art, the devices of this invention are capable of a degree of self-assembly and hence easily fabricated. Because the devices are electrically (rather than optically) addressed, and because the devices utilize relatively simple and highly stable storage elements, they are readily fabricated utilizing existing technologies and easily incorporated into electronic devices. Thus, the molecular memory devices of this invention have a number of highly desirable features.

Because the storage medium of the devices described herein is electrically-addressed, the devices are amenable to the construction of a multilayered chip architecture. An architecture compatible with such a three-dimensional structure is essential to achieve the objective of $10^{15}$ bits/cm$^3$. In addition, because writing and reading is accomplished electrically, many of the fundamental problems inherent with photonics are avoided. Moreover, electrical reading and writing is compatible with existing computer technology for memory storage.

In addition. the devices of this invention achieve a high level of defect tolerance. Defect tolerance is accomplished through the use of clusters of molecules (up to several million in a memory cell). Thus, the failure of one or a few molecules will not alter the ability to read or write to a given memory cell that constitutes a particular bit of memory. In preferred embodiments, the basis for memory storage relies on the oxidation state(s) of porphyrins or other porphyrinic macrocycles of defined energy levels. Porphyrins and porphyrinic macrocycles are well known to form stable radical cations. Indeed, the oxidation and reduction of porphyrins provide the foundation for the biological processes of photosynthesis and respiration. Porphyrin radical cations can be formed chemically on the benchtop exposed to air. Double and triple decker sandwich molecules comprises of porphyrinic ligands exhibit essentially the same phenomena.

Preferred storage molecules of this invention molecule can hold multiple holes, corresponding to multiple bits. In contrast, the dyes (photochromic, electrochromic, redox) and molecular machines are invariably bistable elements. Bistable elements exist either in a high/low state and hence can only store a single bit.

Reading can be accomplished non-destructively or destructively as required in different chip applications. The speed of reading is conservatively estimated to lie in the MHz to GHz range. Oxidation of the porphyrins or other porphyrinic macrocycles can be achieved at relatively low potential (and at predesignated potentials through synthetic design), enabling memory storage to be achieved at very low power. Porphyrins and porphyrin radical cations are stable across a broad range of temperatures, enabling chip applications at low temperature, room temperature, or at elevated temperatures. Double and triple decker sandwich molecules comprised of porphyrinic ligands exhibit essentially the same phenomena.

Fabrication of the devices of this invention relies on known technology. The synthesis of the storage media takes advantage of established building block approaches in porphyrin and other porphyrinic macrocycle chemistry. Synthetic routes have been developed to make the porphyrin and porphyrinic macrocycle building blocks, to join them in covalent nanostructures, and to purify them to a high level (>99%).

In preferred embodiments, the storage medium nanostructures are designed for directed self-assembly on gold surfaces. Such self-assembly processes are robust, result in the culling out of defective molecules, and yield long-range order in the surface-assembled cluster.

Porphyrin-thiols have been assembled on electroactive surfaces. The arrays that define the addressable bits of memory can be achieved through conventional microfabrication techniques. The storage molecules are self-assembled onto these electrode arrays and attached to the gold surface using conventional dipping methods.

I. Uses of the Storage Device

One of ordinary skill in the art will appreciate that the memory devices of this invention have wide applicability in specialized and general-purpose computer systems. Of course commercial realization of the device(s) will be facilitated by the adoption of computer architecture standards compatible with this technology. In addition. commercial adoption of this technology will be facilitated by the use of other molecular electronic components that will serve as on-chip buffers and decoders (that is, molecular logic gates), and the like. In addition, commercialization will be facilitated by the development of a full manufacturing infrastructure.

Regardless, prior to the development of a fully integrated design and manufacturing platform for molecular electronic information storage and transfer, even early generation prototype molecular memory devices described herein have utility in a variety of personal or industrial applications. For example, a prototype 1024/512-bit molecular memory device has sufficient capacity to hold a substantial base of personal and/or other proprietary information. This information could be transported anywhere in the world virtually undetected owing to the extremely small size of the device. If detected, the memory device is easily erased simply by applying a low potential reverse bias current across all memory cells. This protection mechanism can be readily incorporated into any type of transport architecture designed for the memory device.

Among other things, the memory devices of this invention have sufficient capacity to hold information that could be used in a wide assortment of personal digital assistants or "smart cards". Even a memory device that degrades upon multiple read cycles is extremely useful if the number of read cycles is highly limited (perhaps only one). A memory device that degrades upon multiple read cycles or simply with time is also useful in applications where long-term data persistence is not needed. Thus, numerous applications for early generation memory devices present themselves. Successes of the memory devices in these applications will foster even more rapid full-scale commercialization of the technology.

II. Architecture of the Storage Device

Figure 2:
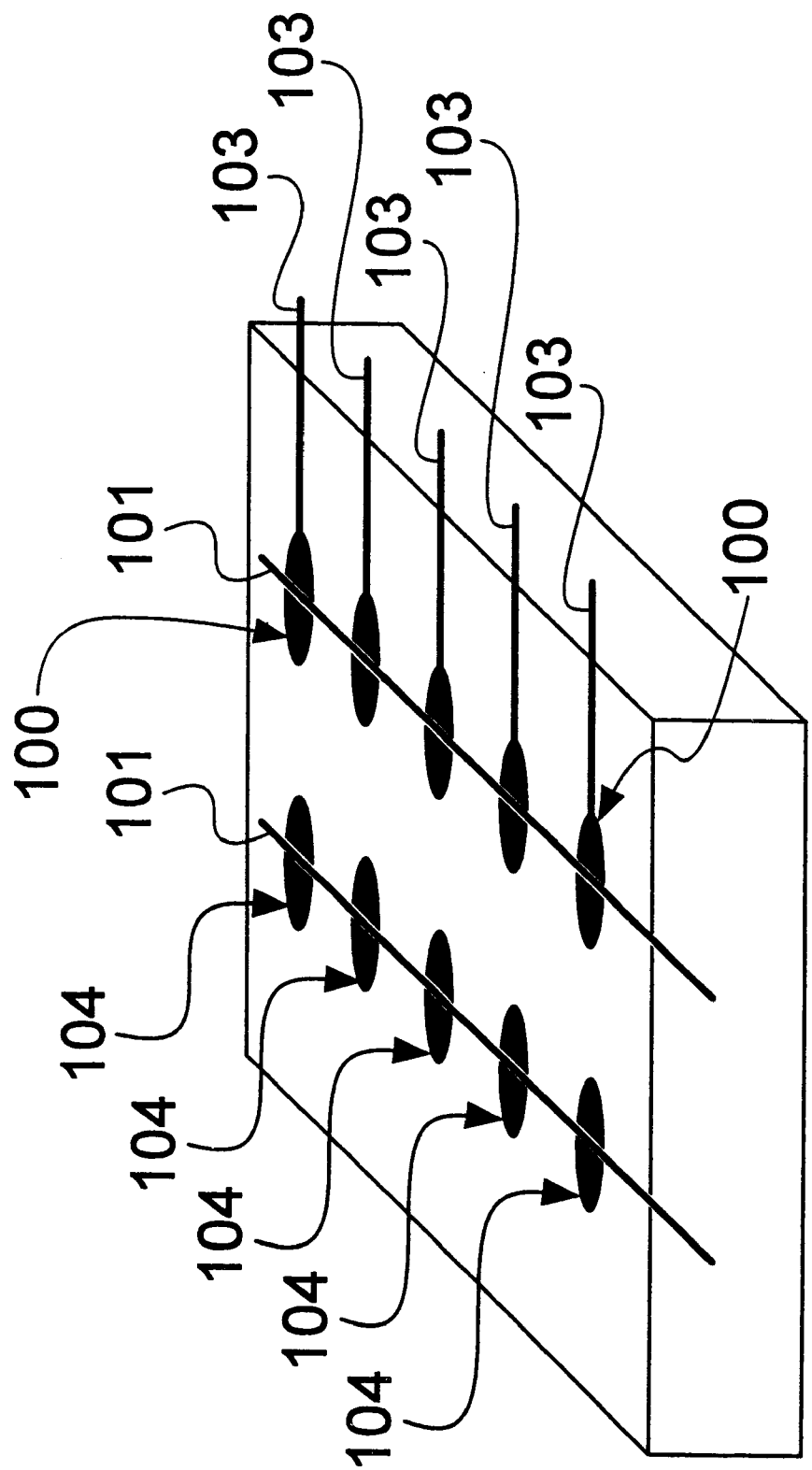
FIG. 2 illustrates the disposition of the storage cell(s) of the invention on a chip.

The basic storage cell (electrode(s) and storage medium) of this invention can be incorporated into a functional device in a wide variety of configurations. One chip-based embodiment of this invention is illustrated in FIG. 2. As illustrated in FIG. 2 the storage medium 102 is disposed in a number of storage locations 104. Each storage location is addressed by a working electrode 101 and a reference electrode 103 so that the storage medium 102 combined with the electrodes forms a storage cell 100 at each storage location.

Figure 3:
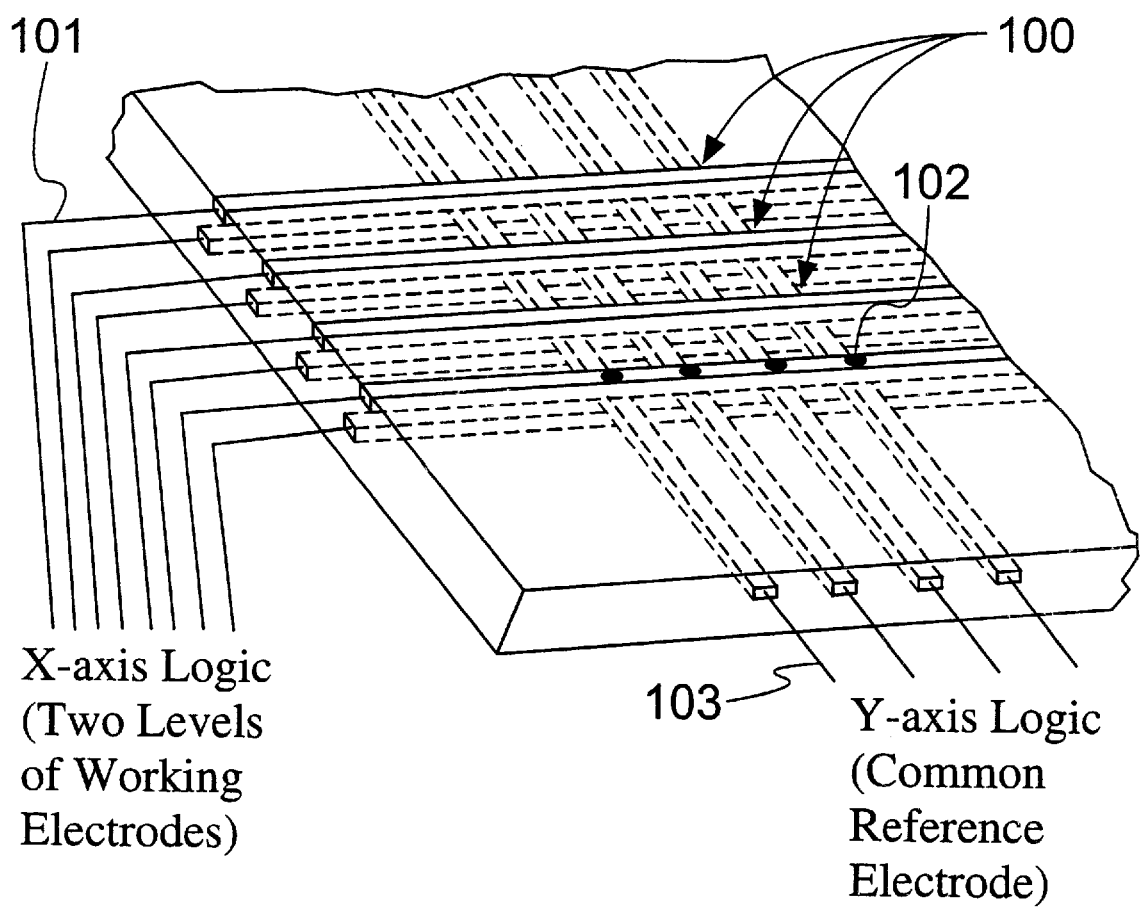
FIG. 3 illustrates a preferred chip-based embodiment of this invention. A two-level chip is illustrated showing working electrodes 101, orthogonal reference electrodes 103, and storage elements 102.

One particularly preferred chip-based embodiment is illustrated in FIG. 3. In the illustrated embodiment, a plurality of working electrodes 101 and reference electrodes 103 are illustrated each addressing storage media 102 localized at discrete storage locations thereby forming a plurality of storage cells 100. Multiple storage cells can be associated with a single addressing electrode as long as oxidation states of the storage cells are distinguishable from each other. It should be noted that this forms a functional definition of a storage cell. Where two discrete areas of storage medium are addressed by the same electrode(s) if the storage media comprise the same species of storage molecule the two discrete areas will functionally perform as a single storage cell, i.e. the oxidation states of both locations will be commonly set, and/or read, and/or reset. The added storage location, however, will increase the fault tolerance of the storage cell as the functional storage cell will contain more storage molecules. In another embodiment, each individual storage cell is associated with a single addressing electrode.

In preferred embodiments, the storage medium comprising the storage cells of a memory device is electrically coupled to one or more reference electrodes. The reference electrode(s) can be provided as discrete electrodes or as a common backplane.

The chip illustrated in FIG. 3 has two levels of working electrodes and hence two levels of storage cells 100 (with numerous storage cells on each level). Of course, the chip can be fabricated with a single level of electrodes and memory element or literally hundreds or thousands of different levels of storage cell(s), the thickness of the chip being limited essentially by practical packaging and reliability constraints.

In particularly preferred embodiments, a layer of dielectric material optionally imbedded with counterions to ensure electrical connectivity between the working and reference electrode(s) and stability of the cationic species in the absence of applied potential (latching) is disposed in the storage cell. In some embodiments, the dielectric material can be incorporated into the storage medium itself.

While, in some preferred embodiments, feature sizes are rather large (e.g. memory elements approximately ($10\times10\times 10\,\mu m$) and electrode thickness ~200 nm, feature size can be reduced at will so that feature sizes are comparable to those in conventional silicon-based devices (e.g., 50 nm–100 nm on each axis).

Figure 4:
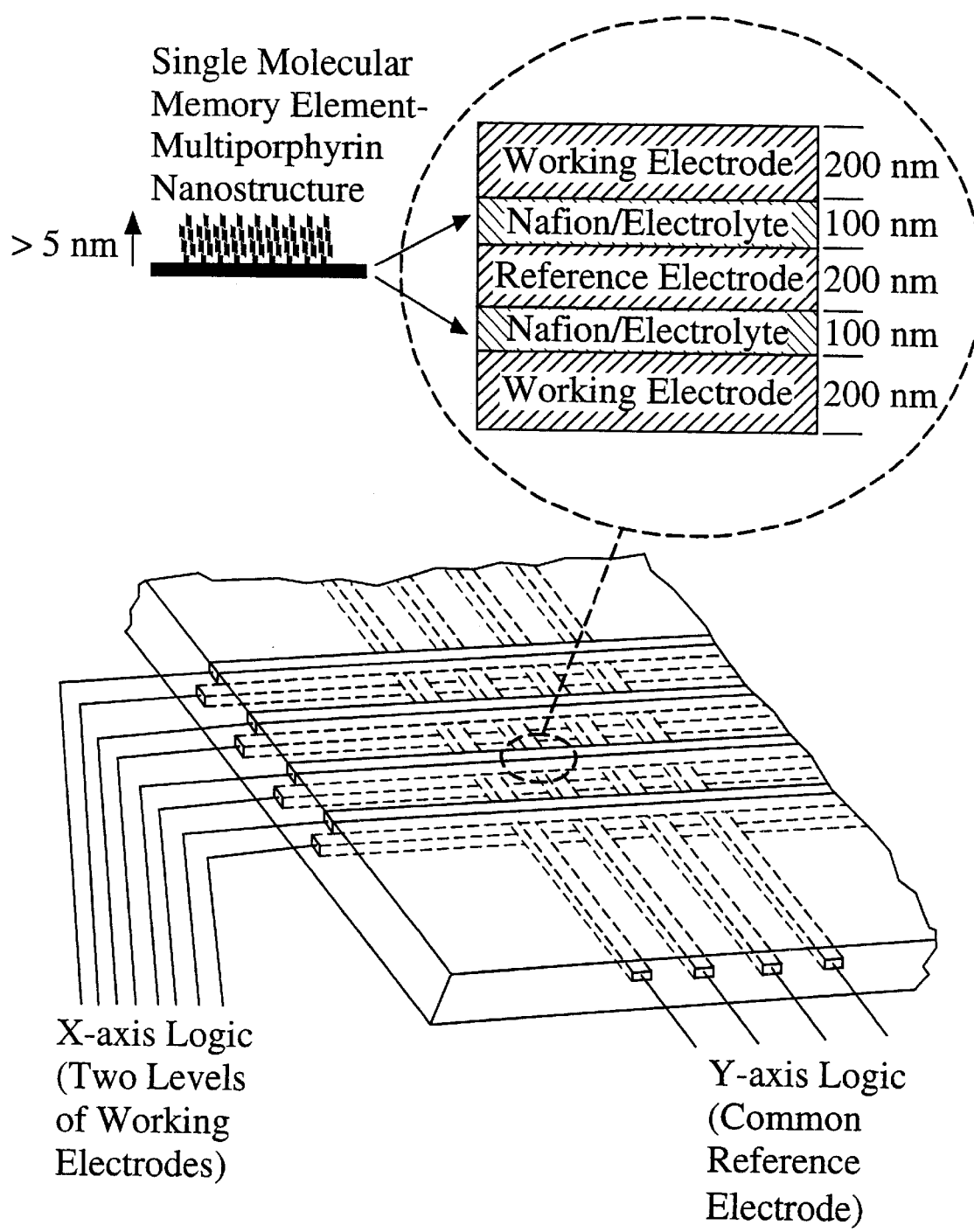
FIG. 4 illustrates the three-dimensional architecture of a single memory storage cell (memory element) on the chip.

In a preferred embodiment, the storage device includes: (1) A gold working electrode (e g., 200 nm thick), deposited on a nonconducting base, and line-etched to achieve electrode widths of 10's to 100's of nm. (2) A monolayer of self-assembled nanostructures (storage molecules 105) attached to the gold surface via the sulfur atom of the p-thiophenyl group. (3) A 100-nm thick layer of dielectric material 107 embedded with counterions to ensure electrical connectivity to the reference electrode and stability of the cationic species in the absence of applied potential (latching). (4) A 200-nm thick nonpolarizable reference electrode 103 line-etched in the same fashion as those of the working electrode 101, but assembled with lines orthogonal to the latter electrode. (5) A mirror image construct that utilizes the same reference electrode. Thus, in one embodiment, the three-dimensional architecture of a single memory storage location (memory element) on the chip will look as indicated in FIG. 4.

While the discussion herein of electrodes is with respect to gold electrodes, it will be recognized that numerous other materials will be suitable. Thus, electrode materials include, but are not limited to gold, silver, copper, other metals. metal alloys, organic conductors (e.g. doped polyacetylene, doped polythiophene, etc.), nanostructures, crystals, etc.

Similarly, the substrates used in the fabrication of devices of this invention include, but are not limited to glasses, silicon, minerals (e.g. quartz), plastics, ceramics, membranes, gels, aerogels, and the like.

III. Fabrication and Characterization of the Storage Device

A. Fabrication.

The memory devices of this invention can be fabricated using standard methods well known to those of skill in the art. In a preferred embodiment, the electrode layer(s) are applied to a suitable substrate (e.g. silica, glass, plastic, ceramic, etc.) according to standard well known methods (see, e.g., Rai-Choudhury (1997) *The Handbook of Microlithography, Micromachining, and Microfabrication.* SPIE Optical Engineering Press; Bard & Faulkner (1997) *Fundamentals of Microfabrication*). In addition, examples of the use of micromachining techniques on silicon or borosilicate glass chips can be found in U.S. Pat. Nos. 5,194,133, 5,132,012, 4,908,112, and 4,891,120.

In one preferred embodiment a metal layer is beam sputtered onto the substrate (e.g., a 10 nm thick chromium adhesion layer is sputtered down followed by a 200 nm thick layer of gold). Then maskless laser ablation lithography (see below, performed e.g., with a Nd:YAG laser, is used to create features with micron dimensions, or with an excimer laser to create features of nanometer dimensions) will create an array of parallel lines of conductor (e.g., gold), used as the working electrodes with dimensions ranging between a few microns to tens of nanometers.

Once the electrode array is formed, the entire array, or portions of the array, or individual electrodes are wetted (e.g. immersed or spotted) with one or more solutions of the appropriate derivatized storage media (e.g. thiol-substituted porphyrin nanostructures), and the constituents of the memory medium (e.g., monomeric porphyrin subunits) self-assemble on the micro-sized gold arrays to form the memory elements. It will be appreciated that different solutions can be applied to different regions of the electrode array to produce storage cells comprising different storage media. Methods of spotting different reagents on surfaces (e.g. on glass surfaces) at densities up to tens of thousands of different species/spots per $cm^2$ are known (see, e.g., U.S. Pat. No. 5,807,522).

Then a suitable electrolyte layer (e.g. a thin layer of Nafion® polymer) approximately 1 nm to 1000 nm, preferably about 100 nm to about 500 nm, more preferably about 10 nm to about 100 nm and most preferably about one hundred nanometers thick) will be cast over the entire surface of the chip. This polymer serves to hold the electrolyte for electrochemical reaction. Finally, the entire chip is coated with a layer (e.g., 10 nm to about 1000 nm, more preferably 100 nm to about 300 nm and most preferably about 200 nm of conducting material (e.g. silver) which acts as a reference electrode 103.

The chip is then turned 90 degrees, and maskless laser ablation lithography will be performed again to create a second array of parallel lines that are perpendicular to the original set. This forms a three dimensional array of individual memory elements, where each element is formed by the intersection of these two perpendicular linear arrays (see FIG. 4).

Each individual element can be addressed by selecting the appropriate X and Y logic elements, corresponding to one gold working electrode and one reference electrode separated by the Nafion® polymer/electrolyte layer. Since this structure is inherently three dimensional, it should be possible to extend the array into the Z-direction, creating a 3-D array of memory elements as large as it is feasible to connect to.

These structures are initially created on the micron scale. It is possible to decrease the size of these structures to sub-micron dimensions. It is possible to create these structures on a scale similar to silicon microstructures created with conventional nanolithographic techniques (i.e. 100–200 nm). This would allow the interfacing of the memory elements with conventional silicon-based semiconductor electronics.

In the laser-ablation lithography discussed above, coherent light is sent through a beam splitter (50% transmittance) and reflected by a mirror to make two nearly parallel identical beams (Rosenwald et al. (1998) *Anal. Chem.*, 70: 1133–1140). These beams are sent through e.g., a 50 cm focal length lens for ease in focusing to a common point. The placement of the beams is fine-tuned to allow complete overlap of the mode structure of the laser spot. Higher order interference patterns are minimized through the use of high quality optics (1/10 wave surface flatness). This ensures that the variation between intensity maxima and minima in the first order will be several orders of magnitude larger than those formed with second and higher orders. This produces a well-defined pattern of lines across the electrode surface, where the spacing between points of positive interference (D) can be approximated by the Bragg Equation: $n\lambda=2D \sin(\theta/2)$, where $\lambda$=wavelength, $\theta$=angle between the beams, and n is order. For example, when a Nd:YAG is used at 1064 nm, the recombination of the two beams in this manner generates an interference pattern with ~2 micron spacing when the angle between the 2 beams is 15°. The interference pattern spacing can easily be changed by modifying the angle between the beams. Attenuation of the beam was accomplished by inserting one or more neutral density filters before the beam splitter. In this way, the exposure of the gold layer to the Nd-YAG interference pattern can be performed at different beam attenuations to produce power densities between 1 and 100 $MW/cm^2$.

B. Electrically Coupling Storage Medium to Electrode.

In the storage devices of this invention, the storage medium is electrically coupled to one or more electrodes. The term "electrical coupling" is used to refer to coupling schemes that permit the storage medium to gain or lose electrons to the electrode. The coupling can be a direct attachment of the storage medium to the electrode, or an indirect attachment (e.g. via a linker). The attachment can be a covalent linkage, an ionic linkage, a linkage driven by hydrogen bonding or can involve no actual chemical attachment. but simply a juxtaposition of the electrode to the storage medium. In some embodiments, the electrode can be some distance (e.g. about 5 Å to about 50 Å) from the storage medium and electrical coupling can be via electron tunneling.

In some preferred embodiments, a "linker" is used to attach the molecule(s) of the storage medium to the electrode. The linker can be electrically conductive or it can be short enough that electrons can pass directly or indirectly between the electrode and a molecule of the storage medium.

The manner of linking a wide variety of compounds to various surfaces is well known and is amply illustrated in the literature. Means of coupling the molecules comprising the storage medium will be recognized by those of skill in the art. The linkage of the storage medium to a surface can be covalent, or by ionic or other non-covalent interactions. The surface and/or the molecule(s) may be specifically derivatized to provide convenient linking groups (e.g. thiol, hydroxyl, amino, etc.).

The linker can be provided as a component of the storage medium molecule(s) or separately. Linkers, when not joined to the molecules to be linked are often either hetero- or homo-bifunctional molecules that contain two or more reactive sites that may each form a covalent bond with the respective binding partner (i.e. surface or storage medium molecule). When provided as a component of a storage molecule, or attached to a substrate surface, the linkers are preferably spacers having one or more reactive sites suitable for bonding to the respective surface or molecule.

Linkers suitable for joining molecules are well known to those of skill in the art and include, but are not limited to any of a variety of, straight or branched chain carbon linkers, heterocyclic linkers, amino acid or peptide linkers, and the like. Particularly preferred linkers are described in greater detail below.

C. Addressing the Memory Cells.

Addressing of the storage cell(s) in the devices of this invention is relatively straightforward. In a simple approach a discrete pair of electrodes (one working and one reference electrode) can be connected to every storage cell. Individual reference electrodes, however are not required and can be replaced with one or more common reference electrodes connected to all or to a subset of all of the storage elements in a particular device. Alternatively, the common reference electrodes can be replaced with one or more conductive "backplanes" each communicating to all,. or to a subset, of the storage cells in a particular device.

Where the storage cells contain identical storage media, each storage cell is preferably addressed with a separate working electrode so that the storage (oxidation) states of the storage cells can be distinguished from each other. Where the storage cells contain different storage media such that the oxidation states of one storage cell are different and distinguishable from the oxidation states of another storage cell, the storage cells are preferably addressed by a common working electrode thereby reducing the number of electrodes in a device.

In one preferred embodiment, the storage devices of this invention contain 64, 128, 256, 512, 1024 or more storage locations per layer (64, 128, 256, 512, 1024 or more locations in the mirror image architecture) with each location capable of holding a two bit word. Accordingly, a preferred 1024-bit or a preferred 512-bit chip will contain 8 wiring interconnects on each of the three electrode grids in the 3-dimensional architecture illustrated in FIG. 4.

D. Characterization of the Memory Device.

The performance (e.g. operating characteristics) of the memory devices of this invention is characterized by any of a wide variety of methods, most preferably by electrochemical methods (amperometry and sinusoidal voltammetry, see, e.g., Howell et al. (1986) *Electroanal. Chem.*, 209: 77–90; Singhal and Kuhr. (1997) *Anal. Chem.*, 69: 1662–1668), optical spectroscopy (Schick et al. (1989) *J. Am. Chem. Soc.* 111: 1344–1350), atomic force microscopy, electron microscopy and imaging spectroscopic methods. Surface-enhanced resonance and Raman spectroscopy are also used to examine the storage medium on the electrodes.

Among other parameters, characterization of the memory devices (e.g., memory cells) involves determining the number of storage medium molecules (e.g., double and triple decker porphyrin arrays) required for defect-tolerant operation. Defect tolerance includes factors such as reliably depositing the required number of holes to write the desired digit and accurately detecting the numbers/transfer rates of the holes.

The long-term resistance of electron/holes to charge-recombination in the solid-phase medium of the device package is also determined. Using these parameters, the device architecture can be optimized for commercial fabrication.

IV. Architecture of the Storage Medium.

The storage medium used in the devices of this invention comprises one or more species of storage molecule. A preferred storage medium is characterized by having a multiplicity of oxidation states. Those oxidation states are provided by one or more redox-active units. A redox-active unit refers to a molecule or to a subunit of a molecule that has one or more discrete oxidation states that can be set by application of an appropriate voltage. Thus, for example, in one embodiment, the storage medium can comprise one species of redox-active molecule where that molecule has two or more (e.g. 4) different and distinguishable oxidation states. Where each species of storage molecule has a single, non-neutral, oxidation state, the storage medium achieves multiple bit storage by having a plurality of such molecules where each molecule has a different and distinguishable oxidation state (e.g. each species of molecule oxidizes at a different and distinguishable potential). Of course, each species of molecule preferably has a plurality of different and distinguishable oxidation states.

As indicated above, the storage medium can be broken down into individual, e.g., spatially segregated, storage locations. Each storage element can have a storage medium that is the same or different from the other storage elements in the chip and/or system. Where the storage elements are of identical composition, in preferred embodiments, they are separately addressed so that information in one element can be distinguished from information in another element. Where the storage elements are of different composition they can be commonly addressed (where the oxidation states of the commonly addressed storage elements are distinguishable) or they can be individually addressed.

In certain preferred embodiments the storage medium is juxtaposed to a dielectric medium to insure electrical connectivity to a reference voltage (e.g. a reference electrode, a reference backplane, etc.). In particularly preferred embodiments, a layer of dielectric material is imbedded with counterions to ensure electrical connectivity to the reference electrode and stability of the cationic species in the absence of applied potential (latching) disposed between the reference working electrode(s).

Dielectric materials suitable for the devices of this invention are well known to those of skill in the art. Such materials include, but are not limited to Nafion® polymer, cellulose acetate, polystyrene sulfonate, poly (vinylpyridine), electronically conducting polymers such as polypyrrole and polyaniline, etc.

The sandwich coordination compounds identified herein are ideally suited for molecular based memory storage. These compounds have unique electroactive properties, available modular synthetic chemistry, and in conjunction with thiols, and other linkers described herein, undergo directed self-assembly on electroactive surfaces.

A. Sandwich Coordination Compounds.

Figure 5:
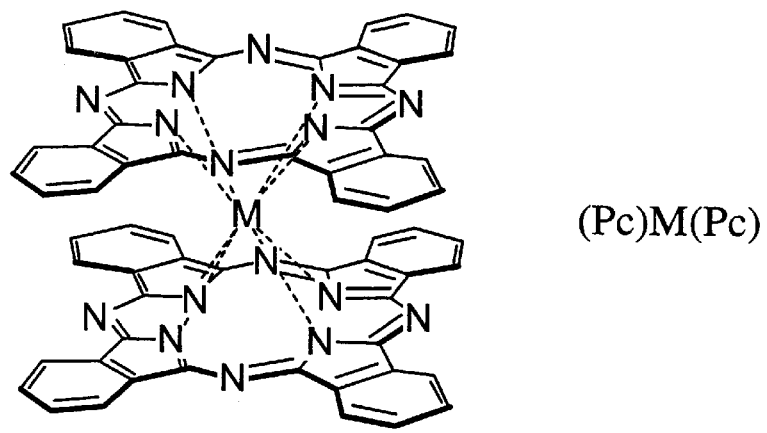
FIG. 5 shows examples of double-decker sandwich coordination compound architectures.
Figure 5:
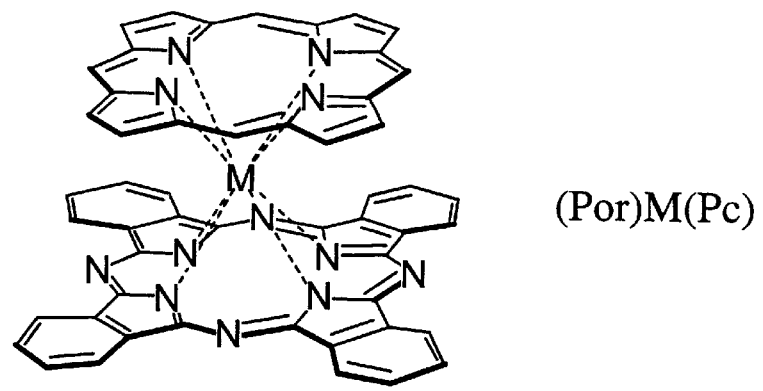
Figure 5:
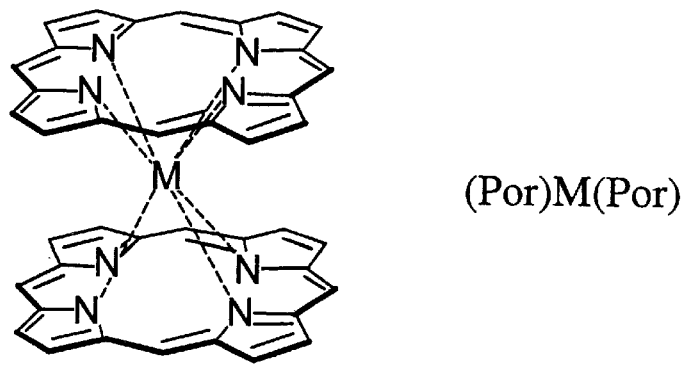

Over the past two decades a variety of double-decker and triple-decker sandwich molecules comprised of porphyrinic macrocycles and metals has been created ((J. Jiang et al. *Inorg. Chim. Acta* 1997, 255, 59–64; D. Ng et al., *Chem. Soc. Rev.* 1997, 26, 433–442; D. Chabach et al., *Angew. Chem. Int. Ed. Engl.* 1996, 35, 898–899)). The metals are generally comprised of the lanthanide series and Y, as well as others discussed below, which have properties similar to those of the lanthanides. In fact the only lanthanide that has not been incorporated into a porphyrin sandwich complex is the radioactive element Pm. Examples of various double-decker architectures are shown in FIG. 5. The architectures include a bis-phthalocyanine sandwich molecule ((Pc)M (Pc)), a bis-porphyrin sandwich molecule ((Por)M(Por)), and a hybrid phthalocyanine-porphyrin sandwich molecule ((Pc)M(Por)). It is understood that each porphyrinic macrocycle can bear substituents at the peripheral β- or meso-carbon atoms (not shown). In the bis-porphyrinic sandwich molecules, the two macrocycles can be identical (homoleptic) or different (heteroleptic).

Figure 6:
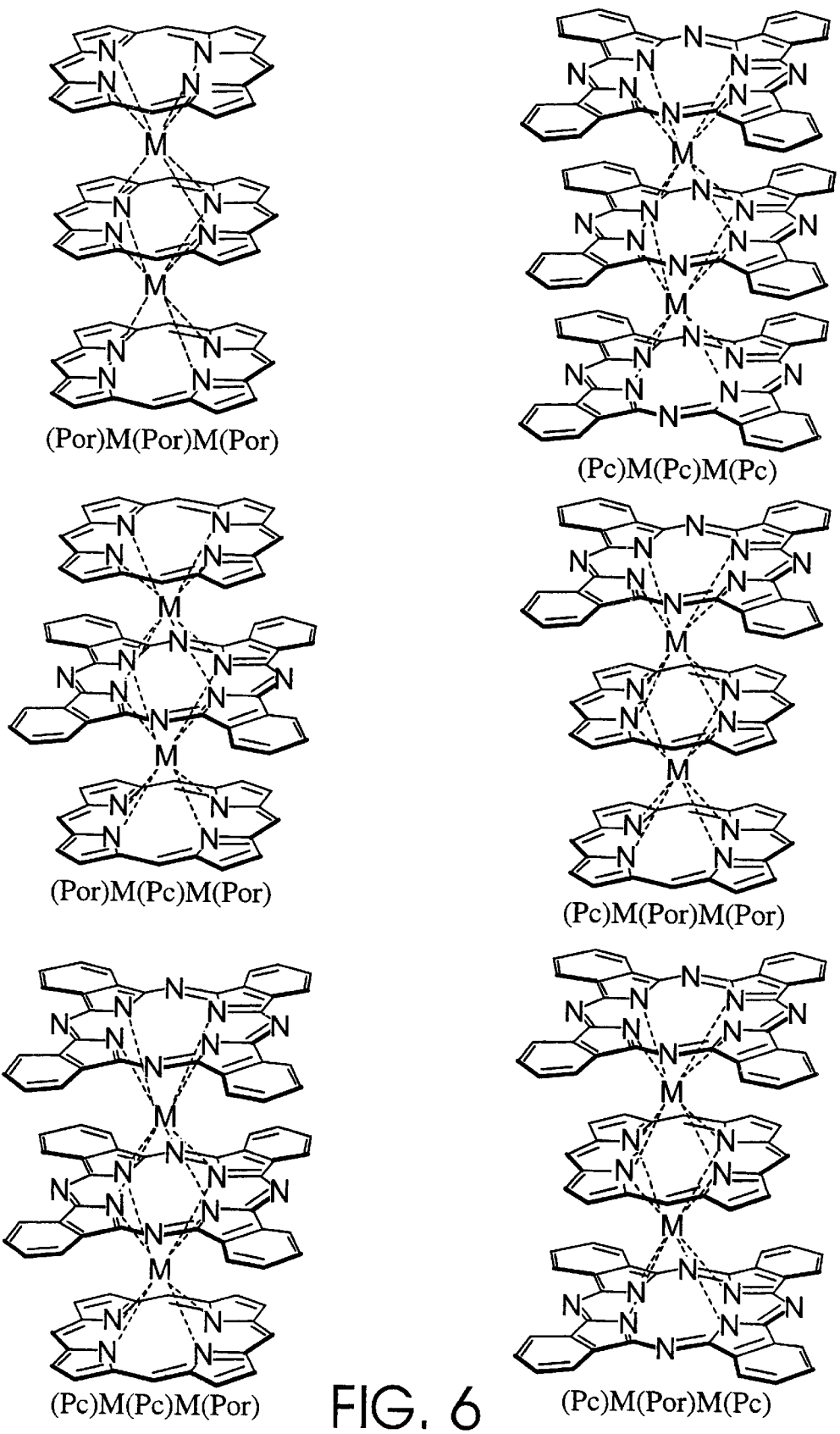
FIG. 6 shows examples of triple-decker sandwich coordination compound architectures.

Examples of various triple-decker architectures are shown in FIG. 6. The architectures include an all-phthalocyanine sandwich molecule ((Pc)M(Pc)M(Pc)), an all-porphyrin sandwich molecule ((Por)M(Por)M(Por)), two configurations of two porphyrins and one phthalocyanine ((Por)M(Pc)M(Por), (Pc)M(Por)M(Por)) and two configurations of one porphyrin and two phthalocyanines ((Pc)M(Por)M(Pc), (Pc)M(Pc)M(Por)). It is understood that each porphyrinic macrocycle can bear substituents at the peripheral carbon atoms (not shown). It is also understood that the two metals in the triple decker can be identical or different (not shown). Heteronuclear heteroleptic or homoleptic complexes can also be prepared (heteronuclear refers to the use of different metals in the triple decker coordination compound)

The triple deckers are attractive for molecular-based information storage due to the multiple accessible oxidation states (which in turn are a consequence of the tight coupling of the porphyrinic macrocycles in the sandwich architectures). The triple deckers generally exhibit four oxidation potentials in the range −0.2 to 1.4 V (vs. Ag/Ag$^+$). (Note that all potentials denoted here are referenced to, or have been scaled to, the Ag/Ag$^+$ electrode for internal consistency. Reported values measured against the saturated calomel electrode have had 170 mV subtracted in order to give a value appropriate for the Ag/Ag$^+$ electrode, based on the use of ferrocene as a standard.) For example, the (Por)Eu(Pc)Eu(Por) triple decker with Ar=4-t-butylphenyl on the four meso positions of the porphyrin gave anodic waves at 0.23, 0.62, 0.95, and 1.23 V, corresponding to formation of the monocation, dication, trication, and tetracation, respectively (J. Jiang et al, *Inorg. Chim. Acta* 1998, 268. 49–53).

Particular examples of sandwich coordination compounds that may be used to carry out the present invention have the Formula XI (for double-decker sandwich compounds) or Formula XII (for triple-decker sandwich compounds):

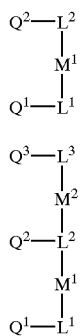

(XI)

(XII)

wherein:
- $M^1$ and $M^2$ (when present) are metals independently selected from the group consisting of metals of the lanthanide series (Ln=La, Ce, Pr, Nd, Pm, Sm, Eu, Gd, Tb, Dy, Ho, Er, Tm, Yb, Lu, as well as Y, Zr, Hf, and Bi, and in the actinide series Th and U (radioactive elements such as Pm are generally less preferred);
- $L^1$, $L^2$ and $L^3$ (when present) are independently selected ligands (e.g., porphyrinic macrocycles); and
- $Q^1$, $Q^2$ and $Q^3$ may be present or absent and when present are independently selected linkers as described in section III B above (the linker preferably including a protected or unprotected reactive group such as thio, seleno or telluro group). Preferably, at least one of $Q^1$, $Q^2$ and $Q^3$ is present.

It will also be appreciated that each ligand L may be substituted with a single linker Q, or may be multiply substituted with linkers Q, as explained in greater detail below. Thus the molecule of Formula XI or Formula XII may be covalently linked to an electrode or substrate by at least one of $Q^1$, $Q^2$, or $Q^3$.

Each ligand L may be further substituted without departing from the scope of the compounds of Formula XI or Formula XII above. For example, and as explained in greater detail below, ligands may be covalently joined to a metallocene group, to another porphyrinic macrocycle, to a ligand of another sandwich coordination compound, etc.

Particular embodiments of the compounds of Formula XI and XII above, which provide additional memory storage as discussed in section IV C below, are those represented by Formula XIII and Formula XIV:

(XIII)

(XIV)

wherein:

- $M^1$ and $M^2$ are as given above;
- $L^1$, $L^2$ and $L^3$ are as given above;
- $Q^1$, $Q^2$ and $Q^3$ are as given above; and
- $P^1$, $P^2$, and $P^3$ may be present or absent and, when present, represent an independently selected oxidizable group such as a porphyrinic macrocycle, a metallocene such as ferrocene, etc. (which may be joined to the corresponding $L^n$ through a linker as described below).

Thus, particular embodiments of Formulas I and II above, and which also provide additional storage capability as discussed in section IV C below, include the case where two sandwich coordination compounds are linked together, as represented by Formula XV and Formula XVI below:

(XV)

-continued

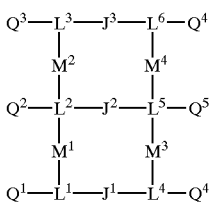

(XVI)

wherein:

$M^1$ and $M^2$ are as given above and $M^3$ and $M^4$ are independently selected from the same group as $M^1$ and $M^2$;

$L^1$, $L^2$ and L3 are as given above, and $L^4$, $L^5$, and $L^6$ are independently selected from the same group as $L^1$, $L^2$, and $L^3$;

$Q^1$, $Q^2$ and $Q^3$ may be present or absent and are as given above, and $Q^4$, $Q^5$, and $Q^6$ may be present or absent and are independently selected from the same group as $Q^1$, $Q^2$, and $Q^3$ (subject to the proviso that at least one of $Q^1$ through $Q^6$ is present); and $J^1$, $J^2$, and $j^3$ may be present or absent and when present represent independently selected linkers (subject to the proviso that at least one of $J^1$, $J^2$, or $J^3$ is present). Each linker $J^n$ can be a linker of the same category or structure as described with respect to linker $Q^1$ herein, but is preferably a linear linker.

Compounds of Formula XV and XVI above may be further substituted in the manner described in connection with the compounds of Formulas XIII and XIV above, to provide compounds of Formula XVII and Formula XVIII below (such compounds, particularly those of Formula XVIII, provide an architecture that enables the storage of information for counting of from 0 to 10. as discussed in section IV D below):

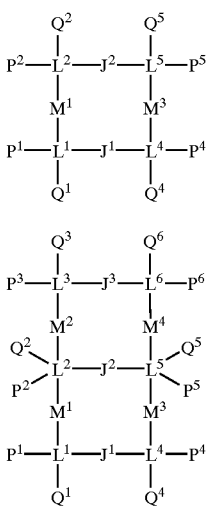

wherein:

$M^1$, $M^2$, $M^3$ and $M^4$ are as given above;

$L^1$, $L^2$, $L^3$, $L^4$, $L^5$, and $L^6$ are as given above;

$Q^1$, $Q^2$, $Q^3$, $Q^4$, $Q^5$, and $Q^6$ are as given above;

$J^1$, $J^2$, and $J^3$ may be present or absent and when present represent independently selected linkers (subject to the proviso that at least one of $J^1$, $J^2$, or $J^3$ is present);

$P^1$, $P^2$, and $P^3$ are as given above, and $P^4$, $P^5$, and $P^6$ are independently selected from the same group as $P^1$, $P^2$ and $P^3$.

In the compounds of Formula XV and XVII above, $L^5$ could further be substituted or extended with $-M^4-L^6-Q^6$, or $-M^4-L^6-Q^6P^6$, as where a double decker compound is linked to a triple decker compound.

Particular examples of porphyrinic macrocycles that may be used as ligands to carry out the present invention include compounds of the Formula XX and Formula XXI below:

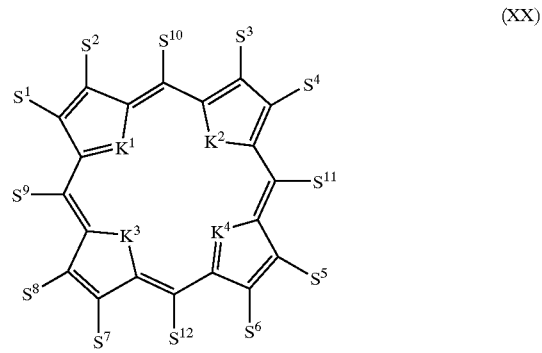

(XX)

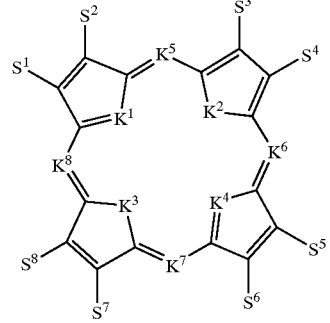

(XXI)

wherein:

$K^1$, $K^2$, $K^3$, $K^4$, $K^5$, $K^6$, $K^7$, and $K^8$ are independently selected from the group consisting of N, O, S, Se, Te, and CH;

$S^1$, $S^2$, $S^3$, $S^4$, $S^5$, $S^6$, $S^7$, $S^8$, $S^9$, $S^{10}$, $S^{11}$, and $S^{12}$ are independently selected substituents that preferably provide a redox potential of less than about 5, 2 or even 1 volt. Example substituents $S^1$, $S^2$, $S^3$, $S^4$ include, but are not limited to, H, aryl, phenyl, cycloalkyl, alkyl, halogen, alkoxy, alkylthio, perfluoroalkyl, perfluoroaryl, pyridyl, cyano, thiocyanato, nitro, amino, alkylamino, acyl, sulfoxyl, sulfonyl, imido, amido, and carbamoyl.

In addition, each pair of $S^1$ and $S^2$, $S^3$ and $S^4$, $S^5$ and $S^6$, and $S^7$ and $S^8$, may independently form an annulated arene, such as a benzene, naphthalene, or anthracene, which in turn may be unsubstituted or substituted one or more times with a substituent that preferably provides a redox potential of less than about 5, 2 or even 1 volt, such as H, aryl, phenyl, cycloalkyl. alkyl, halogen, alkoxy, alkylthio, perfluoroalkyl, perfluoroaryl, pyridyl, cyano, thiocyanato, nitro, amino, alkylamino, acyl, sulfoxyl, sulfonyl, imido, amido, and carbamoyl. Examples of such annulated arenes include, but are not limited to:

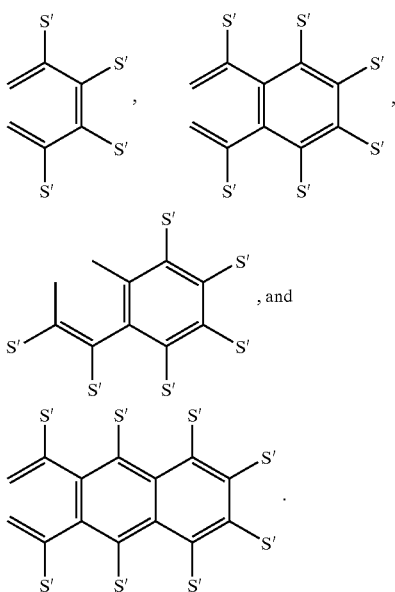

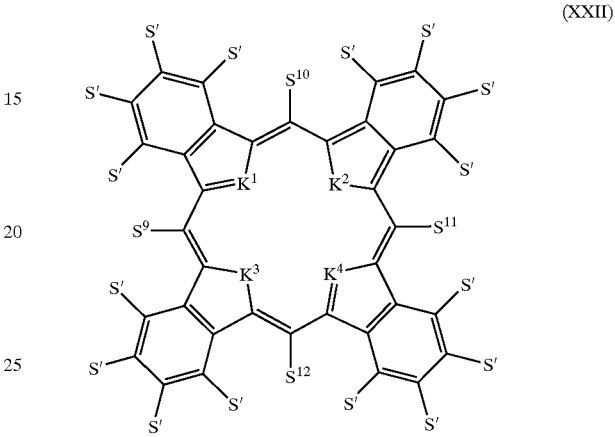

(It being understood that the rings are appropriately conjugated to retain aromaticity of the fused rings); and wherein each substituent S' is independently selected and preferably provides a redox potential of less than about 5, 2 or even 1 volt. Examples of such substituents include, but are not limited to, H, aryl, phenyl, cycloalkyl, alkyl, halogen, alkoxy, alkylthio, perfluoroalkyl, perfluoroaryl, pyridyl, cyano, thiocyanato, nitro, amino, alkylamino, acyl, sulfoxyl, sulfonyl, imido, amido, and carbamoyl. Particular examples of compounds of Formulas XX and XXI containing annulated arenes are exemplified by Formulas XXII–XXV below.

To link the sandwich coordination compound to a substrate, or to another compound such as another sandwich coordination compound in the manners described above, at least one ligand in the sandwich coordination compound will have to contain at least one substituent $S^1$ through $S^n$ or $S'$ which is a linker, particularly a linker containing a reactive group (where multiple linkers are substituted on the ligand, the linkers may be the same or independently selected). Such linkers are designated as X-Q- herein, where: Q is a linker, and X is a substrate, a reactive site or group that can covalently couple to a substrate, or a reactive site or group that can ionically couple to a substrate.

Q may be a linear linker or an oblique linker, with linear linkers currently preferred. Examples of oblique linkers include, but are not limited to, 4,3'-diphenylethyne, 4,3'-diphenylbutadiyne, 4,3'-biphenyl, 1,3-phenylene, 4,3'-stilbene, 4,3'-azobenzene, 4,3'-benzylideneaniline, and 4,3"-terphenyl. Examples of linear linkers include, but are not limited to, 4,4'-diphenylethyne, 4,4'-diphenylbutadiyne, 4,4'-biphenyl, 1,4-phenylene, 4,4'-stilbene, 1,4-bicyclooctane, 4,4'-azobenzene, 4,4'-benzylideneaniline, and 4,4"-terphenyl.

X may be a protected or unprotected reactive site or group on the linker such as a thio, seleno or telluro group.

Thus, examples of linear linkers for X-Q- are: 4-(2-(4-mercaptophenyl)ethynyl)phenyl, 4-mercaptomethylphenyl, 4-hydroselenophenyl, 3-(2-(4-hydrosclenopenyl)ethynyl)phenyl, 4-hydrotellurophenyl, and 4-(2-(4-hydrotellurophenyl)ethynyl)phenyl. Examples of oblique linkers for X-Q- are: 3-(2-(4-mercaptophenyl)ethynyl)phenyl, 3-mercaptomethylphenyl, 3-hydroselenophenyl, 3-(2-(4-hydroselenopenyl)ethynyl)phenyl, 3-hydrotellurophenyl, and 3-(2-(4-hydrotellurophenyl)ethynyl)phenyl.

Other suitable linkers include, but are not limited to, 2-(4-mercaptophenyl)ethynyl, 2-(4-hydroselenophenyl)ethynyl, and 2-(4-hydrotellurophenyl)ethynyl.

Examples of ligands that contain annulated arenes as described above include, but are not limited to, ligands of Formula XXII, XXIII, XXIV and XXV below:

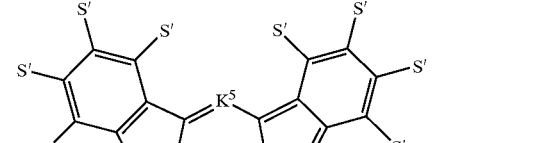

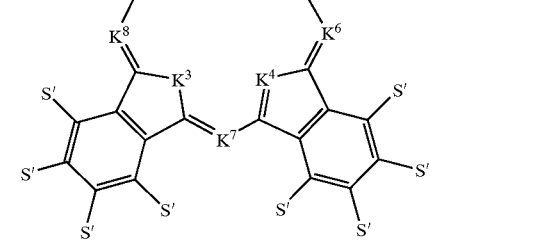

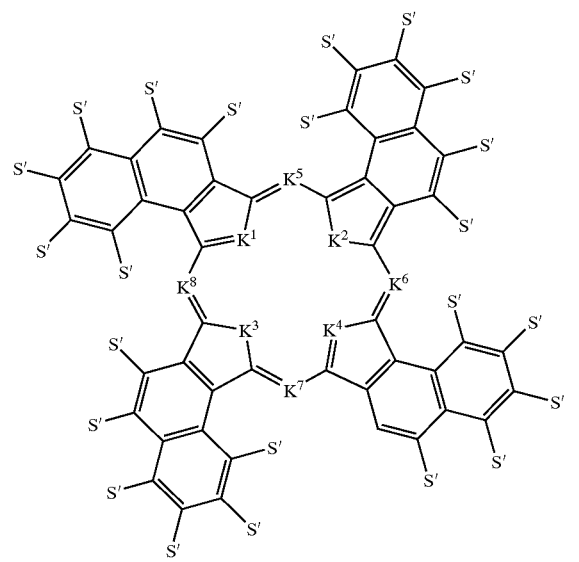

-continued (XXV)

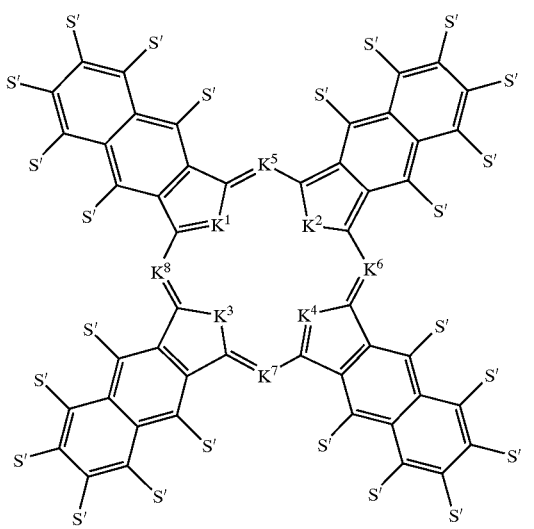

wherein each substituent S' is independently selected and preferably provides a redox potential of less than about 5, 2 or even 1 volt. Examples of such substituents include, but are not limited to, H, aryl, phenyl, cycloalkyl, alkyl, halogen, alkoxy, alkythio, perfluoroalkyl, perfluoroaryl, pyridyl, cyano, thiocyanato, nitro, amino, alkylamino, acyl, sulfoxyl, sulfonyl, imido, amido, and carbamoyl. Again, to link the sandwich coordination compound to a substrate, or to another compound such as another sandwich coordination compound in the manners described above, at least one ligand in the sandwich coordination compound will have to contain at least one substituent S' which is a linker, particularly a linker containing a reactive group (where multiple linkers are substituted on the ligand, the linkers may be the same or independently selected). Such linkers are as described above.

B. Double-decker and Triple-decker Molecules for Memory Storage.

Figure 7A:
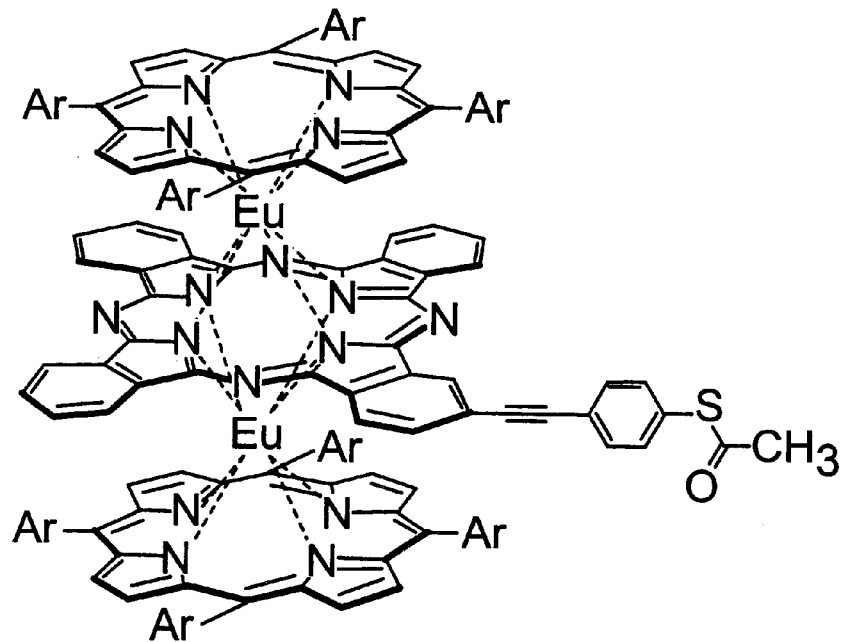
FIG. 7A shows triple-decker sandwich compounds for attachment to an electroactive surface with a thiol linker. with vertical arrangment of the macrocycles with respect to the surface.
Figure 7A:
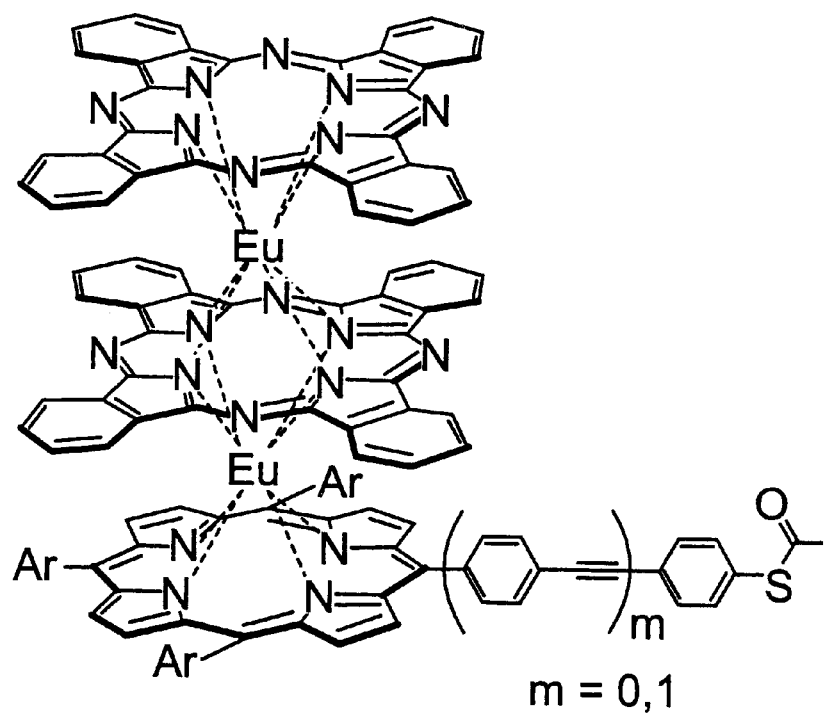
Figure 7B:
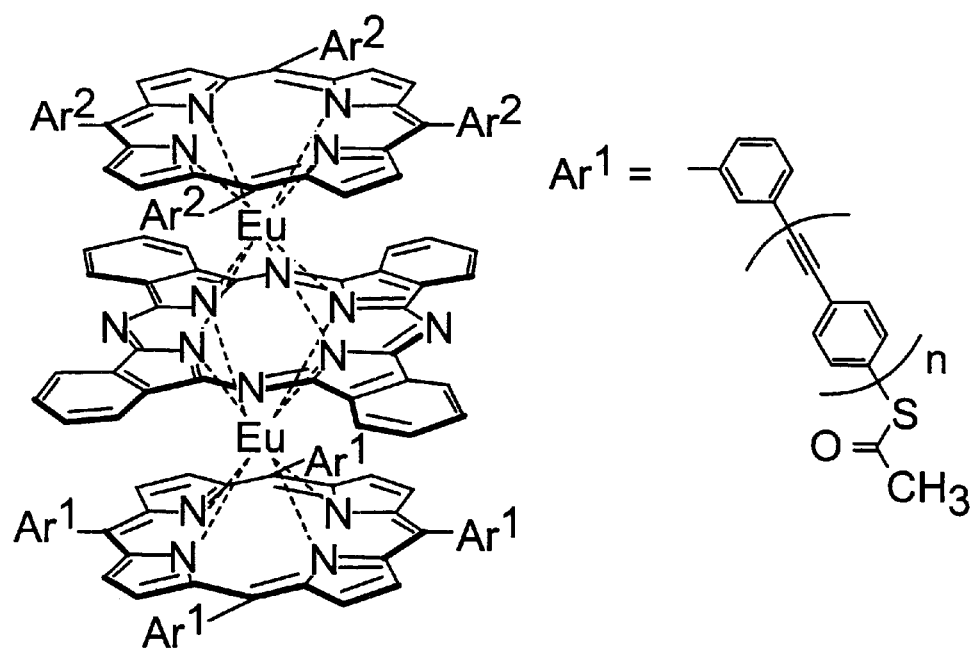
FIG. 7B shows triple-decker sandwich compounds for attachment to an electroactive surface with a thiol linker, with horizontal arrangment of the macrocycles with respect to the surface.
Figure 7B:
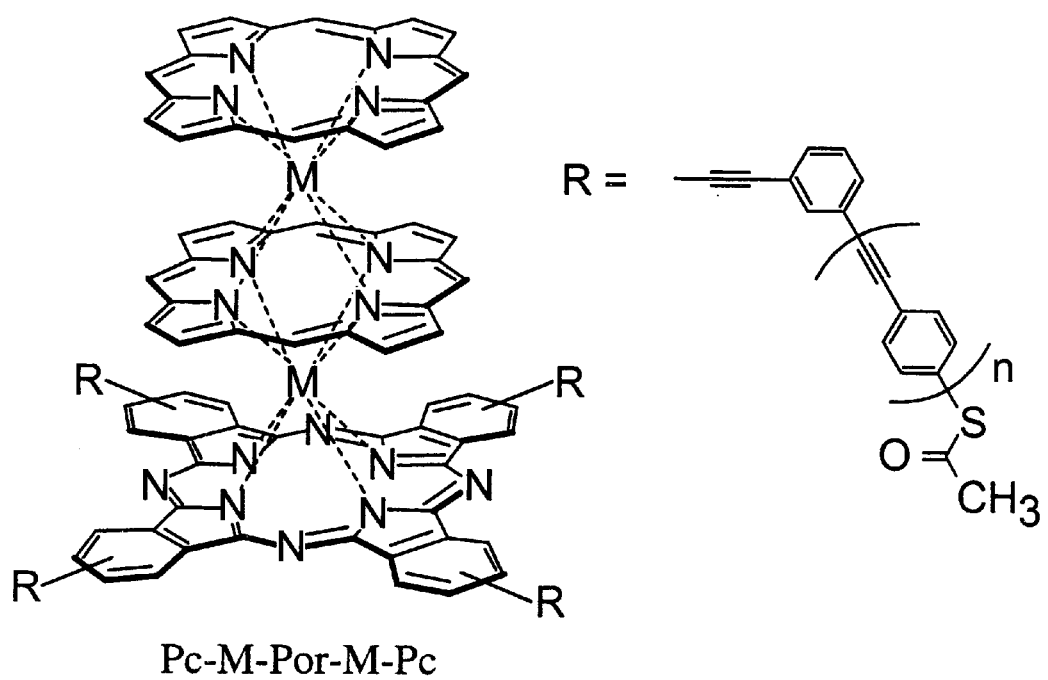

The double- or triple-decker porphyrinic sandwich molecules can be attached to an electroactive surface in one of several ways. A preferred attachment strategy involves the use of a thiol linker, which can be appended either to the phthalocyanine or porphyrin unit. These examples are shown in FIG. 7A, which afford a vertical arrangement of the macrocycles with respect to the surface of the electroactive material. Related approaches afford a horizontal orientation as shown in FIG. 7B. Note that the requisite synthetic components, ethynyl porphyrins and ethynyl phthalocyanines, are available (R. Wagner et al., *J. Am. Chem. Soc.* 1996, 118, 11166–11180; M. Ravikanth et al., *Tetrahedron* 1998, 54, 7721–7734; Maya et al., (1999), *Chem. Eur. J.* 5, 2004–2013)). It has previously been demonstrated that thiol-derivatized porphyrins and thiol-derivatized ferrocenes can be attached to electroactive surfaces (Gryko, D. T.; Clausen, P. C.; Lindsey, J. S., *J. Org. Chem.* 1999, 64, 8635–8647; S. Sachs et al., *J. Am. Chem. Soc.* 1997, 119, 10563–10564; S. Creager et al., *J. Am. Chem. Soc.* 1999, 121, 1059–1064). The thiol-derivatized porphyrins were designed for horizontal or vertical orientation with respect to the surface of the electroactive material.

Each of the triple deckers shown in FIG. 7 enables four charged oxidation states to be accessed. With the neutral state defined as zero, the four charged oxidation states provide a means of counting from 0 to 4.

Figure 8:
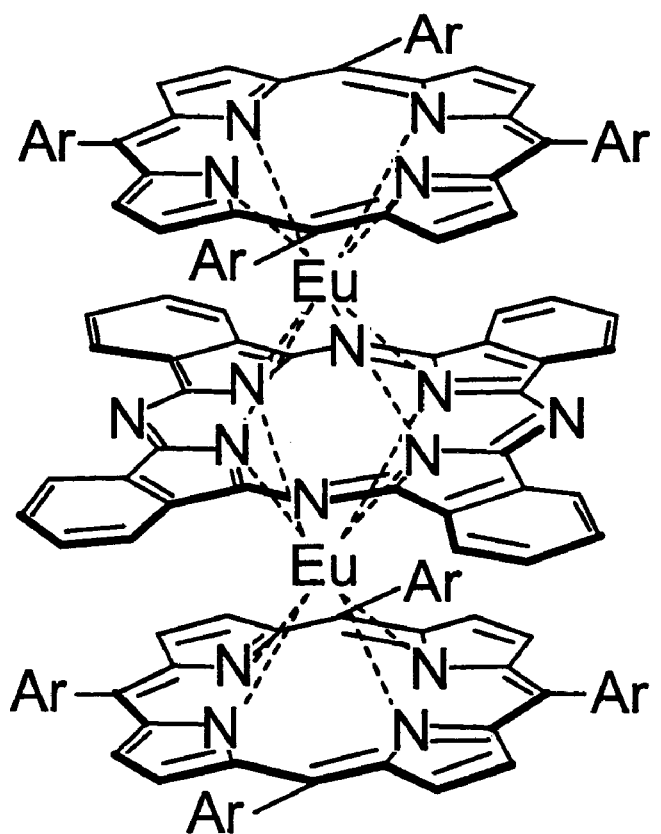
FIG. 8 illustrates two triple decker coordination compounds, whose oxidation potentials are shown in Table 1.
Figure 8:
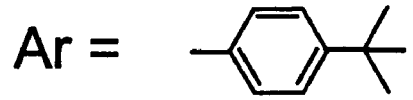
Figure 8:
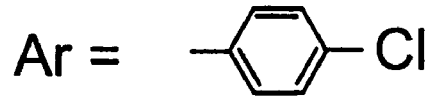

In order to store additional information in a single memory location, two triple deckers can be employed. The oxidation potentials of the two triple deckers shown in FIG. 8 are given in Table 1. (J. Jiang et al., *Inorg. Chim. Acta* 1998, 268, 49–53). In each case four charged oxidation states are accessible, and the two triple deckers have potentials offset from one another.

TABLE 1

Oxidation potentials of triple deckers.

| $E_{1/2}$ (V)[a] | Triple decker I | Triple decker II |
|---|---|---|
| $E_{ox}(1)$ | 0.23 | 0.40 |
| $E_{ox}(2)$ | 0.62 | 0.77 |
| $E_{ox}(3)$ | 0.95 | 1.09 |
| $E_{ox}(4)$ | 1.23 | 1.35 |

[a]In Volts vs. Ag/Ag$^+$ (values from the literature are scaled appropriately for this electrode).

Figure 9:
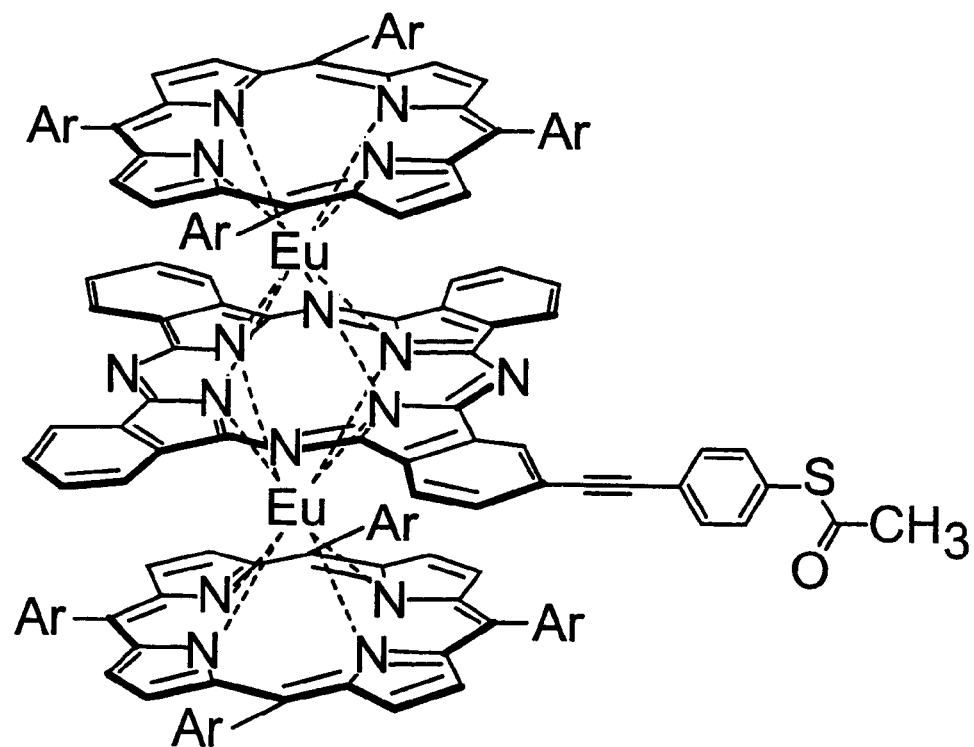
FIG. 9 shows the triple decker compounds of FIG. 8 derivatized for attachment to an electroactive surface with a thiol linker.
Figure 9:
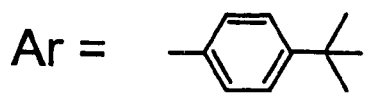
Figure 9:
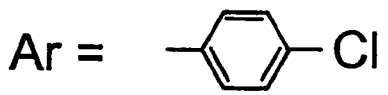

These triple deckers can be employed in a mixed assembly. where equal amounts of triple decker I and II are utilized in a given memory location. In this manner, eight distinct and different charged oxidation states can be accessed due to the interleaving of oxidation potentials of the respective triple-decker molecules. In order to attach these molecules to an electroactive surface, a thiol linker is employed as shown in FIG. 9.

A family of such molecules can be created. Tuning of the oxidation potentials can be achieved by variation in the nature of the porphyrin meso-substituents, the porphyrin β-substituents, the phthalocyanine substituents (R=alkyl, perfluoroalkyl, alkoxy, alkylthio, etc.), replacement of the skeletal atoms of the porphyrin or phthalocyanine macrocycles, and the nature of the two sandwiched metals ($M^1$, $M^2$). It is understood that such variations in molecular structure (not displayed in the Figures) can be utilized in order to tune the electrochemical potentials as desired.

C. More Elaborate Architectures for Memory Storage.

Figure 10:
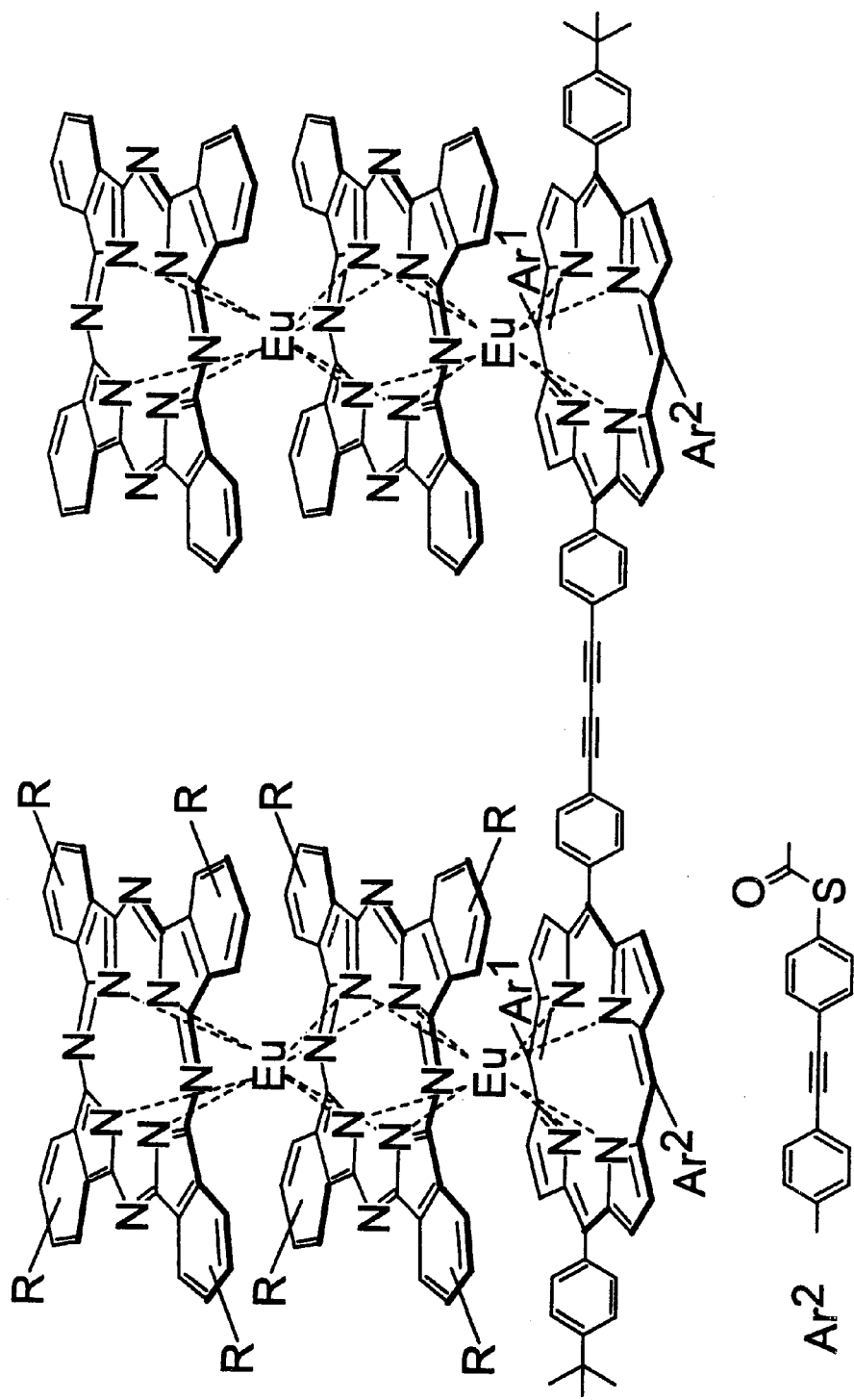
FIG. 10 shows covalently linked triple-decker sandwich molecules that are useful for accessing multiple oxidation states.
Figure 11:
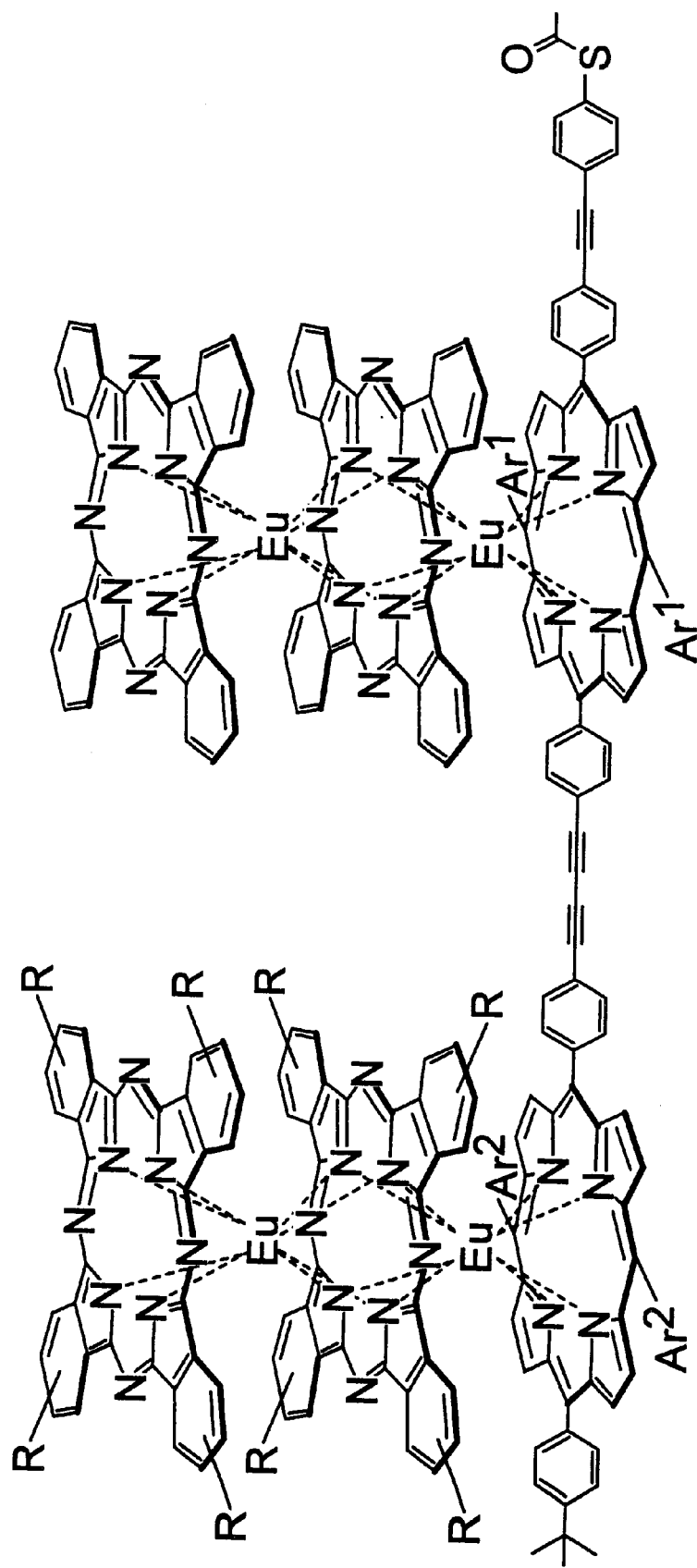
FIG. 11 shows the achievement of a vertical orientation on an electroactive surface with only one of the two triple deckers directly attached thereto.

The same interleaving of oxidation potentials can be achieved with other triple-decker molecules. In order to access multiple states in a molecular architecture, thereby sidestepping the formation of mixed monolayers, the triple-decker sandwich molecules can be covalently linked, as illustrated in Formula XV and Formula XVI. One example is illustrated in FIG. 10. Here both of the triple deckers are directly attached to the electroactive surface via the thiol linkers, affording a horizontal orientation. In FIG. 11, a vertical orientation is achieved with only one of the two triple deckers directly attached to the electroactive surface. In each case shown in FIGS. 7 and 8, eight charged oxidation states can be accessed through interleaving of the oxidation potentials of the two triple-decker molecules. The tuning of the potentials is achieved by variation in the nature of the phthalocyanine substituents (R), peripheral groups attached to the porphyrin, skeletal atom replacements in the porphyrin and the phthalocyanine, and in addition different metals as described above can be employed (Eu is displayed).

Figure 12:
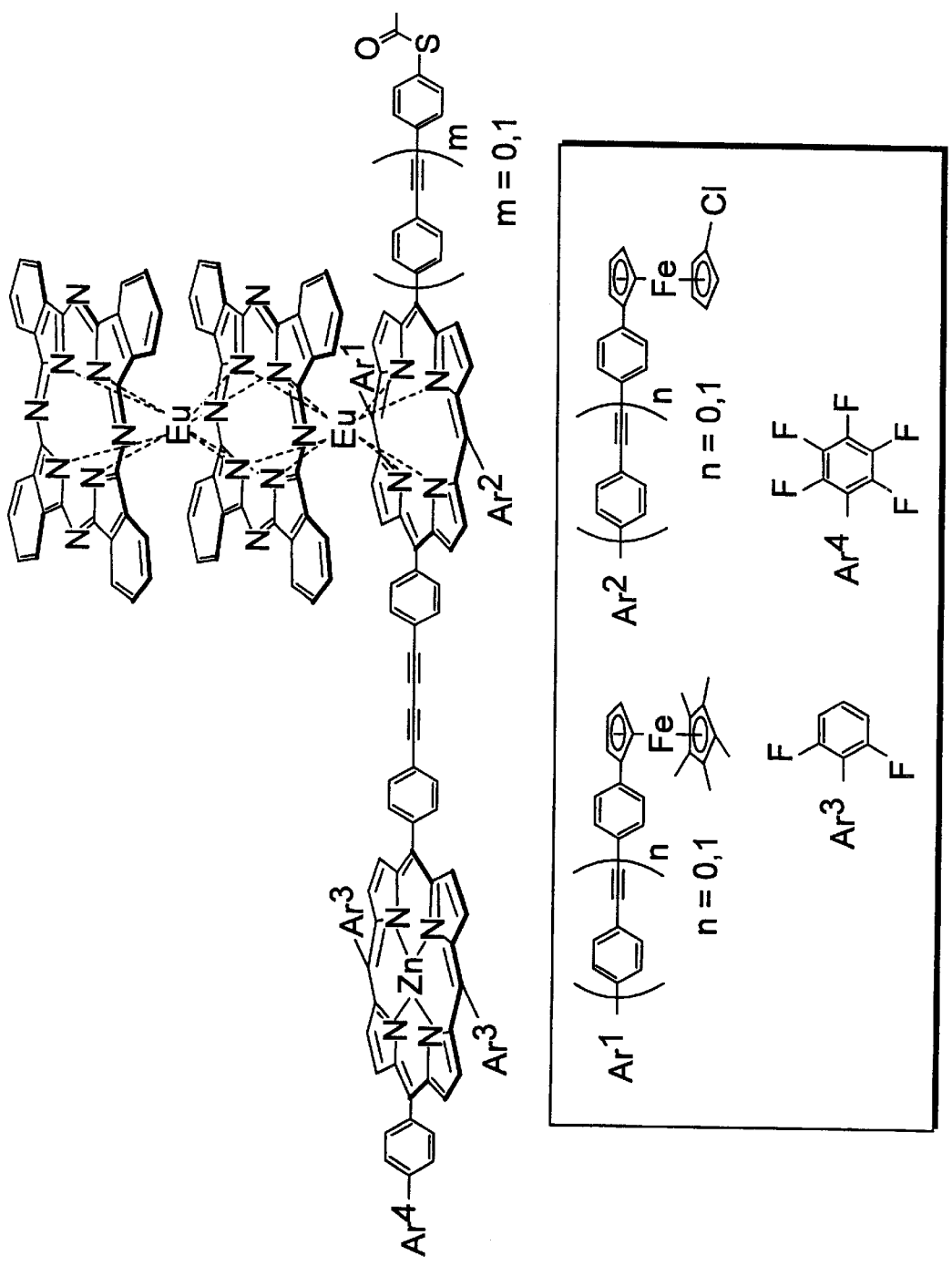
FIG. 12 shows a sandwich molecule in which one porphyrin bears four different meso-substituents.

Other architectures can be employed where one triple decker is substituted with redox-active groups such as porphyrins or ferrocenes, as illustrated in Formula XIII and Formula XIV above. Examples are displayed in FIGS. 12 and 13. In FIG. 12, one porphyrin bears four different meso-substituents, of which one includes a protected thiol unit for ultimate attachment to an electroactive surface. The remaining three meso-substituents are redox-active units, including two substituted ferrocenc molecules and one porphyrin molecule. These redox-active units are chosen so that their oxidation potentials are interleaved with that of the triple-decker sandwich unit. Various linkers can be used to attach the ferrocene units to the porphyrin. A p-phenylene unit (n=0) and a 4,4'-diphenylethyne unit (n=1) are shown. The selection of the linkers is based on synthetic feasibility and the electronic communication properties of the linkers. The choice of p-phenylene or diarylethyne linker is not expected to alter significantly the intrinsic electrochemical properties of the ferrocene or porphyrin units. The anticipated oxidation states are listed in Table 2 (S. Yang et al., *J. Porphyrins Phthalocyanines* 1999, 3, 117–147). Successive oxidation of the respective units occurs at increasing electrochemical potential.

TABLE 2

Oxidation potentials of the triple-decker architecture displayed in FIG. 12.

| $E_{½}$ (V)[a] | Redox-active unit |
| --- | --- |
| −0.05 | Pentamethylferrocene (Ar[1]) |
| +0.23 | Triple decker, first oxidation |
| +0.39 | Chloroferrocene (Ar[2]) |
| +0.62 | Triple decker, second oxidation |
| +0.78 | Zn-porphyrin, first oxidation |
| +0.95 | Triple decker, third oxidation |
| +1.08 | Zn-porphyrin, second oxidation |
| +1.23 | Triple decker, fourth oxidation |

[a]In Volts vs. Ag/Ag$^+$ (values from the literature are scaled appropriately for this electrode).

Figure 13:
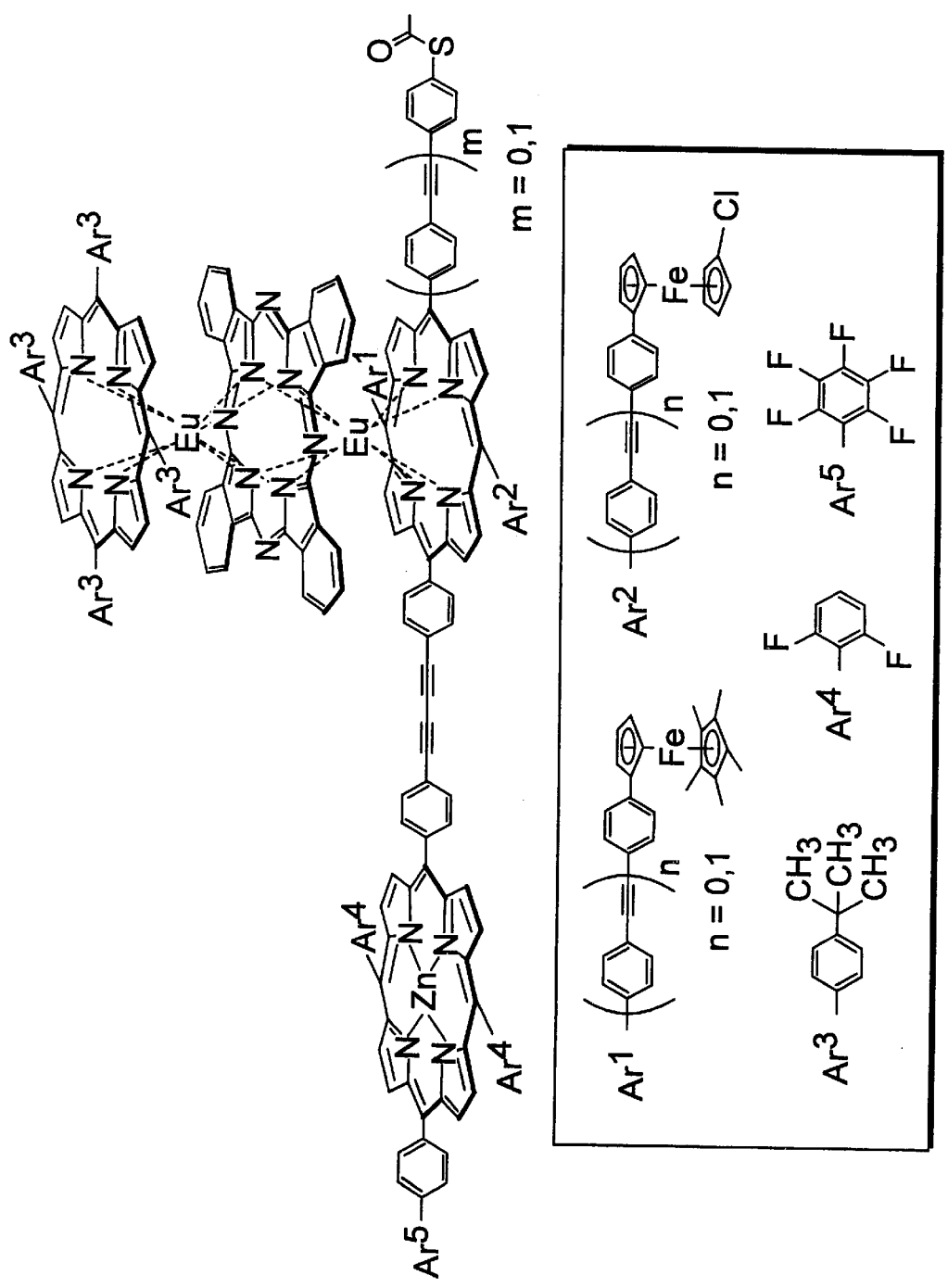
FIG. 13 displays a related sandwich compound architecture that employs a (Por)Eu(Pc)Eu(Por) triple decker rather than a (Por)Eu(Pc)Eu(Pc) architecture used in FIG. 12.

FIG. 13 displays a related architecture that employs a (Por)Eu(Pc)Eu(Por) triple decker rather than a (Por)Eu(Pc)Eu(Pc) architecture used in FIG. 12. A major distinction is that the (Por)Eu(Pc)Eu(Pc) architecture shifts the first and second oxidation potential (but not the third or fourth) to lower potential by about 100–200 mV. This distinction can be exploited in synthetic design where the substituents are selected to have oxidation potentials that interleave appropriately with those of the triple-decker unit.

D. Sandwich Compounds as Building Blocks for Constructing Functional Materials: Synthetic Approaches.

Dyads. The synthesis of dyads of triple deckers can proceed via several different types of reactions. A general issue is that the reaction used to join the triple deckers into a dyad architecture also generally creates the linker that provides electronic communication between the two triple deckers. Accordingly, a more limited set of reactions is generally envisaged than that in the entire corpus of organic chemistry. The reactions of interest include Glaser (or Eglinton) coupling of two identical triple deckers (generating a butadiyne linker), Cadiot-Chodkiewicz coupling of two different triple deckers (generating a butadiyne linker), Sonogashira coupling of two different triple deckers (generating an ethyne linker), Heck or Wittig reactions of two different triple deckers (generating an alkene linker), Suzuki coupling of two different triple deckers (generating a phenylene or biphenyl linker), etc. We have employed the Glaser coupling and the Sonogashira coupling with suitably functionalized triple deckers. Other reactions can also be employed.

| $J^1$—L—TD—L—$J^2$ + $J^3$—L—TD—L—$J^4$ | | |
| --- | --- | --- |
| $J^2$ | $J^3$ | Reaction Type |
| —B(OH)$_2$ | —Cl, —Br, —I | Suzuki |
| ≡—H | —Cl, —Br, —I | Sonogashira |
| ≡—H | ≡—H | Glaser |
| ≡—H | ≡—X | Cadiot-Chodkiewicz |
| —CHO | —Br, —I | Wittig |
| —HC=CH$_2$ | —Br, —I | Heck |

Polymers. The synthesis of polymers of triple deckers is of great interest, affording materials that have the intrinsic electronic properties of monomeric triple deckers yet in a molecular framework where (1) electronic communication among triple deckers (and an electrode) can be achieved effectively and (2) the polymeric triple decker materials can be processed using techniques of the polymer industry.

The methods for synthesis of polymeric arrays of triple deckers include but are not restricted to use of the following types of reactions:

Glaser (or Eglinton) coupling of a monomeric triple decker (generating a butadiyne linker)

Cadiot-Chodkiewicz coupling of two different triple deckers (generating a butadiyne linker joining a block copolymer)

Sonogashira coupling of two different triple deckers (generating an ethyne linker joining a block copolymer)

Heck or Witting reactions of two different triple deckers (generating an alkene linker joining a block copolymer)

Suzuki coupling of two different triple deckers (generating a phenylene or biphenyl linker joining a block copolymer)

We also can polymerize triple deckers bearing substituents such as two or more thiophene groups (generating an oligothiophene linker) or two or more pyrrole groups (generating a polypyrrole linker).

The synthesis of the polymers can be performed using stepwise methods or using polymerization methods. Both methods generally require two reactive groups attached to the triple decker in order to prepare a polymer where the triple deckers are integral components of the polymer backbone. (An alternative design yields pendant polymers where the triple deckers are attached via one linkage to the polymer backbone.) The stepwise synthetic method generally requires the use of protecting groups to mask one reactive site, and one cycle of reactions then involves coupling followed by deprotection. In the polymerization method no protecting groups are employed and the polymer is prepared in a one-flask process.

The polymerizations can take place in solution or can be performed with the polymer growing from a surface. The polymerization can be performed beginning with a solid support as in solid-phase peptide or DNA synthesis, then removed, purified, and elaborated further for specific applications. The polymerization can also be performed with the nascent polymer attached to an electroactive surface, generating the desired electronic material in situ.

Gradient Polymers. Polymers can be created that are composed of identical units, or dissimilar units as in block copolymers or random copolymers. Alternatively, the polymerization can be performed to create a linear array where the composition of different triple deckers is organized in a gradient. This latter approach affords the possibility of creating a molecular capacitor where the potential of stored charge increases (or decreases) in a systematic manner along the length of the array. Such molecular capacitors may find application in the following:

(a) novel information storage materials where the information is stored in the distinct and different oxidation potentials. For example, a linear array can be composed where the lowest potential triple deckers are situated far from the electroactive surface and higher potential triple deckers are located close to an electroactive surface. Then a high potential oxidation sweep is required to oxidize all the triple deckers in the array (proximal and distal), but changing to a low potential then reduces the proximal triple deckers leaving only the distal low potential triple deckers in an oxidized state. In so doing the intervening neutral triple deckers (proximal) constitute a barrier to electron flow, thereby increasing the retention time of stored charge in the oxidized (distal) triple deckers.

(b) electrochromic materials where at fixed potential the color of the array changes with distance.

(c) molecular batteries. Novel features of the polymeric triple deckers as batteries are as follows: (1) Charge migration occurs along the polymeric backbone, mediated by the linker joining the triple decker components. Accordingly, diffusive motion of charge carriers is not required for charge (hole-hopping, electron transfer) to reach the electrode. (2) The potential can be tuned by use of substituents, metals, and type of triple decker components in the polymer. (3) The polymers discharge in a succession of discrete potentials as defined by the electrochemical potentials of the individual oxidation states of the triple decker components. This latter feature accrues from the fact that the oxidation potentials of the triple deckers in a polymer are independent of the oxidation state of neighboring triple deckers. It is understood that the fabrication of a battery derived from polymeric triple deckers includes the use of an electrolyte. Such electrolytes can include small molecules or polymers.

The gradient polymers are created in the following manner. A polymerizable unit (triple decker or linker) is attached to a surface (solid resin as for solid-phase syntheses, or an electroactive surface). The first triple decker ($TD^1$) is added and the coupling reagents are added in order to perform the polymerization (e.g., a Glaser coupling). Then the solid-phase is washed to remove the coupling reagents (copper reagents in the case of the Glaser coupling) and any unreacted $TD^1$. Then the second triple decker ($TD^2$) is added followed by coupling reagents and the polymerization is allowed to continue. The same wash procedure is performed again and then the third triple decker ($TD^3$) is added followed by coupling reagents and the polymerization is allowed to continue. Repetition of this process enables the systematic construction of a linear array of triple deckers with graded oxidation potentials. The final polymer is then cleaved from the solid phase (if the resin is employed for synthesis) or used directly (if the synthesis is performed on an electroactive surface).

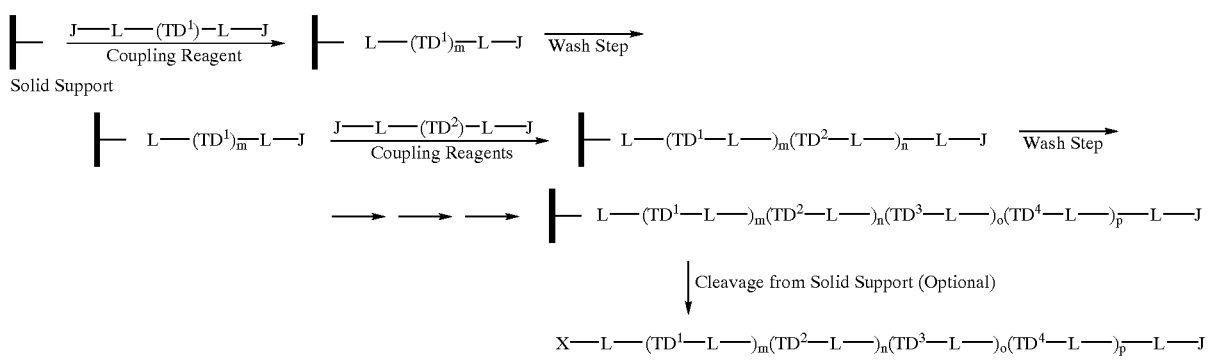

The polymerizable groups can be any of the type described above using the various name reactions (Glaser, Sonogashira, Cadiot-Chodkiewicz, Heck, Wittig, Suzuki, etc.). The final polymeric product is comprised of domains of the various triple deckers [$(TD^1)_n$] joined via linkers in a linear array.

E. Additional Information on Specific Reaction Types.

Preparation of Symmetrical Butadiyne-linked Triple-deckers.

Glaser Coupling. This coupling reaction, discovered by Glaser over a century ago (Glaser, C. Ber. 1869, 2, 422), is still very commonly used to prepare symmetrical butadiynes by the coupling of terminal ethynes. A variety of conditions can be employed.

(1) Copper reagent. Originally the organic cuprous derivative was isolated first and then oxidized. Later, it was found that the cuprous derivative can be formed in situ. The portion of cuprous salt which could be employed successfully may vary from 0.2 to 600% of the theoretical amount. Catalytic quantities (0.2%–0.5%) of cuprous salts are employed mostly with hydrophilic ethynes. Generally, the ratio of ethyne to $Cu^+$ should be kept higher than 1. Ammonium or amine compounds should also be present (Cameron, M. D.; Bennett, G. E. J. Org. Chem. 1957, 22, 557).

(2) Oxidizing agents. Air and oxygen are most frequently employed as oxidizing agents. Other oxidizing agents such as potassium ferricyanide, hydrogen peroxide, and cupric salts have also been employed (Viehe, H. G. Ed: Chemistry of Acetylene, Marcel Dekker, New York, 1969, p. 597). It has been proved, however, in all cases, that the cupric ion is the true oxidizing agent (Eglinton, G.; McCrae, W. Adv. Org. Chem. 1963, 4, 225).

(3) Time and temperature. In general, room temperature is sufficient and also convenient. The reaction time varies between minutes and hours.

(4) Solvents. Pyridine is a good solvent for ethynes and their cuprous derivatives. Tertiary amides are also excellent solvents and increase the coupling speed with a stoichiometric quantity of cuprous salt. However, many kinds of solvents have been successfully employed for the individual ethynes.

(5) Ethynes. The method is applicable to almost all symmetrical couplings, no matter what the functional groups are. Yields are good and appear to be limited mostly by the instability of the butadiyne-linked materials formed in the reaction. However, this coupling method cannot be applied to ethynes with strongly complexing functional groups (such as phosphine), or certain metal derivatives, which are unstable under these reaction conditions (Bohlmann, F. *Ber.* 1951, 84, 545).

This conventional self-coupling of terminal ethynes has been modified by (1) Pd(0)—CuI catalyzed self-coupling in the presence of chloroacetone and benzene (Rossi, R.; Carpita, A.; Bigelli, C. *Tetrahedron Lett.* 1985, 523), (2) Pd(II)—Cu(I) catalyzed self-coupling in the presence of stoichiometric iodine (Liu, Q.; Burton, D. J.: *Tetrahedron Lett.* 1997, 38, 4371), (3) Reaction of lithium dialkyl diarylborates with iodine (Pelter, A.; Smith, K.; Tabata, M. *J. Chem. Soc. Chem. Commun.* 1975, 857).

The following diagram shows an example of the Glaser coupling to yield a dyad of triple deckers and an example yielding a polymer of triple deckers. In each case the intervening linker contains a butadiyne unit.

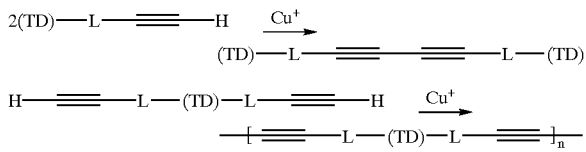

Recently, we have employed the modified Glaser coupling (Pd(II)—Cu(I) catalyzed self-coupling in the presence of stoichiometric iodine) to prepare triple decker dyads with a butadiyne linkage, and the desired product was obtained in good yield (89%) under very mild conditions (room temperature). Under similar conditions, it is expected that the corresponding functional polymers and/or oligomers with triple decker units could also be prepared.

Eglinton Coupling. This method was based on the fact that in Glaser couplings, the true oxidizing agents are cupric salts. In 1956, Eglinton and Galbraith proposed the method which involves a cupric salt oxidation in pyridine (Eglinton, G.; Galbraith, A. R. *Chem. Ind.* 1956, 737.). This condition was modified by Breslow in the middle 1980s (O'Krongly, D.; Denmeade, S. R.; Chiang, M. Y.; Breslow, R. *J. Am. Chem. Soc.* 1985, 107, 5544), which employed cupric/cuprous couples in oxygen free pyridine. This method is very commonly used today. Pyridine has been mostly employed as a good solubilizing and buffering agent. Other amines can also be employed, such as morpholine and tetramethylethylenediamine. In addition, other solvents can also be added. The reaction speed increases with the acidity of the acetylenic proton; alkyl ethynes react slower than aryl ethynes and butadiynes as in Glaser coupling. The cuprous derivative does not form in significant quantities but appears to be the reaction intermnediate.

Straus Coupling. Under conditions of Glaser coupling in acidic media, an enyne can be formed, as first demonstrated by Straus in 1905 (Straus, F. *Liebigs Ann.* 1905, 342, 190). The original experimental process consists of refluxing for a few hours, then an acetic acid solution of a dry cuprous derivative is added under an inert gas. The only enyne formed is head-to-tail coupled, whereas the head-to-head coupled enyne could never be detected.

Preparation of Unsymmetrical Butadiyne-linked Materials: Cadiot-Chodkiewicz Coupling For the preparation of unsymmetrical butadiynes, Glaser coupling of two different terminal ethynes inevitably gives a mixture of butadiynes. The Cadiot-Chodkiewicz coupling method, proposed in 1957 (Chodkiewicz, W. *Ann. Chim.* 1957, 2, 819), provides a directed route to couple two different ethyne units. The Cadiot-Chodkiewicz coupling method consists of the condensation of ethynes with halogenated ethynes in the presence of cuprous salt and a suitable amine. It is noteworthy that under the reaction conditions, 1-halogyenoethynes can undergo a self-coupling to the corresponding symmetrical butadiynes (Chodkiewicz, W. *Ann. Chim.* 1957, 2, 819):

(1) Cuprous Salt. The cuprous ethyne derivative is assumed to be the reactive intermediate. The cuprous species is regenerated in the condensation and can be employed in catalytic amounts (about 1–5%). This low concentration of cuprous ion reduces almost entirely the self-coupling of the halogenoethynes.

(2) Basic Agent. This reaction does not occur in acid media. A base is necessary to neutralize the acid resulting from the condensation. Amines are good solvents which hinder the self-coupling reaction as well as oxidation of the reaction medium. The efficiency of amines decreases as follows: primary>secondary>tertiary.

(3) Solvent. Good solubility of the terminal ethyne in the reaction medium is required. A minimum solubility of the cuprous derivative is also essential. Alcohols are frequently employed for aryl ethynes. Ethers can be used with scarcely soluble compounds. Tertiary amides are very good solvents for terminal ethynes and for cuprous derivatives, and are often employed with scarcely soluble compounds.

(4) Nature of the 1-halogenoacetylene. Among chloro-, bromo- and iodo-derivatives the 1-bromoethynes are the most suitable. Generally the 1-bromoethynes are sufficiently reactive toward derivatives. At the other extremes, 1-iodoethynes are strongly oxidizing toward the cuprous ion and favor the self-coupling reaction, while 1-chloroethynes exhibit low reactivity.

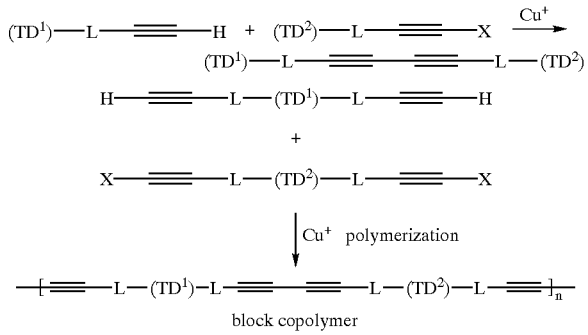

block copolymer

Suzuki Coupling. Suzuki cross coupling of aryl halides with arylboronic acids has emerged as an extremely powerful tool to form biaryl compounds (For reviews, see: (a) Miyaura, N.; Suzuki, A. *Chem. Rev.* 1995, 95, 2457. (b) Suzuki, A. *J. Organomet. Chem.* 1999, 576, 147). This methodology has been extensively studied with respect to palladium sources, ligands, additives, solvents etc. (Littke, A. F.; Fu, G. C. *Angew. Chem., Int. Ed.* 1998, 37, 3387). To date, the compounds containing a biaryl linkage could be prepared under very mild conditions in very good yield with a wide range of substituents under the respective coupling conditions.

Oligomers and/or polymers containing triple decker units with biaryl linkages under Suzuki coupling conditions may be prepared. These kinds of polymers are expected to display interesting optical and/or electronic properties and thus find applications as functional materials. We have prepared various triple decker building blocks bearing aryl halide groups, while the stable nature of boronic acids (thermally, air and moisture stable) makes it feasible to prepare corresponding triple decker building blocks bearing boronic acid groups. The triple decker monomers containing halides and boronic acid groups are thus treated under Suzuki coupling conditions to afford the desired molecular architecture.

D. Sonogashira coupling. The Sonogashira coupling of an ethyne and an aryl halide affords the corresponding ethyne-linked compound. The Sonogashira reaction can be performed using $Pd(PPh_3)_2Cl_2$ and CuI in dilute solution in toluene and triethylamine under mild temperatures (35° C.), or using $Pd_2(dba)_3$ with tri-o-tolylphosphine in toluene and triethylamine under mild temperatures (35° C.). Other amine-containing solvents can be employed as well.

E. Wittig reaction. The Wittig reaction involves the coupling of an alkyl halide and an aldehyde or ketone, generating an alkene. This is one of the most powerful methods of carbon-carbon bond formation and involves treatment of the alkyl halide with a phosphine (e.g., triphenylphosphine) followed by treatment with a strong base(e.g., n-butyl lithium) and reaction with the carbonyl compound.

F. Molecular Architectures for Counting to 8.

One of our objectives is to construct molecular devices capable of storing multiple bits of information. Our general approach involves storing information in the distinct oxidation states of redox-active molecules located in a self-assembled monolayer on an electroactive surface. The ability to store multiple bits requires molecules or molecular arrays having a large number of accessible oxidation states. Toward that goal, we have investigated a wide variety of redox-active molecules such as ferrocenes and porphyrins as well as arrays comprised of multiple redox-active units. Triple-decker phthalocyaninato and porphyrinato sandwich complexes of lanthanides and related metals, comprised of highly delocalised macrocycles held in close proximity, are attractive for molecular-based information storage given their multiple, accessible oxidation states. Such triple-decker complexes generally exhibit four oxidation potentials in the range 0.1–1.4 V (vs $Ag/Ag^+$) corresponding to formation of the monocation, dication, trication and tetracation, as well as a corresponding set of anionic states (J. Jiang, et al, *Inorg. Chim. Acta* 1998, 268, 49–53). The cationic states are more attractive than the anionic states given the greater stability of the former under real-world conditions.

With a triple decker sandwich complex attached to an electroactive surface, the ability to access four cationic oxidation states provides for counting from one to four (where the neutral state is zero). With two triple deckers each having four non-overlapping oxidation potentials, it becomes possible to count to eight. Such a combination of triple deckers enables the storage of three bits of information and can be used as an octal counter. In one design, the two triple deckers are joined in a covalent architecture bearing one or more linkers such as a thiol linker. In another design, the two triple deckers are separately functionalized with a linker and both derivatized triple deckers co-deposited in a single memory location. The proper functioning of such an octal counter hinges in large part on the design of the respective triple deckers such that the oxidation potentials are different and distinguishable. The most attractive approach is for the oxidation potentials of the two triple deckers to be interleaved in a comb-like fashion.

As described in Example 1 herein, we have developed the synthetic methodology for preparing triple-decker sandwich molecules of general structure (Pc)Eu(Pc)Eu(Por) with a thiol-derivatized linker appended to the porphyrin unit. The thiol-derivatized linker provides a site for attachment of the triple decker to an electroactive surface such as gold. The general synthetic approach is compatible with substituents attached to the porphyrin and/or phthalocyanine units. While much is known about the electrochemical properties of metalloporphyrins, the literature on triple deckers is far less extensive and systematic (D. Ng and J. Jiang, *Chem. Soc. Rev.* 1997 26, 433–442). In order to understand how to employ substituents for the control of oxidation potentials in the triple decker complexes, we elected to prepare a small systematic library of triple deckers of general formula (Pc)Eu(Pc)Eu(Por) and (Por)Eu(Pc)Eu(Por). We felt that the characterization of the electrochemical properties of this library would facilitate the rational design of an octal counter as well as related molecular devices built around triple decker sandwich molecules for multi-bit information storage.

In Example 2 we describe results at developing an octal counter. We first describe the synthesis of a library of triple-decker complexes with electron donating groups attached to the porphyrin and/or phthalocyanine moieties. Next we report the solution electrochemical studies of this family of triple-decker complexes. From these results has emerged suitable combinations of substituents that provide effective interleaving of oxidation potentials of the triple decker complexes. These insights prompted the synthesis of several thiol-derivatized triple deckers that appeared to have suitable electrochemical properties for use in co-deposition experiments leading to multi bit information storage. We anticipate that these two triple deckers will enable seven distinct charged oxidation states to be accessed due to the interleaving of oxidation potentials.

G. Molecular Architectures for Counting to 10.

Figure 14:
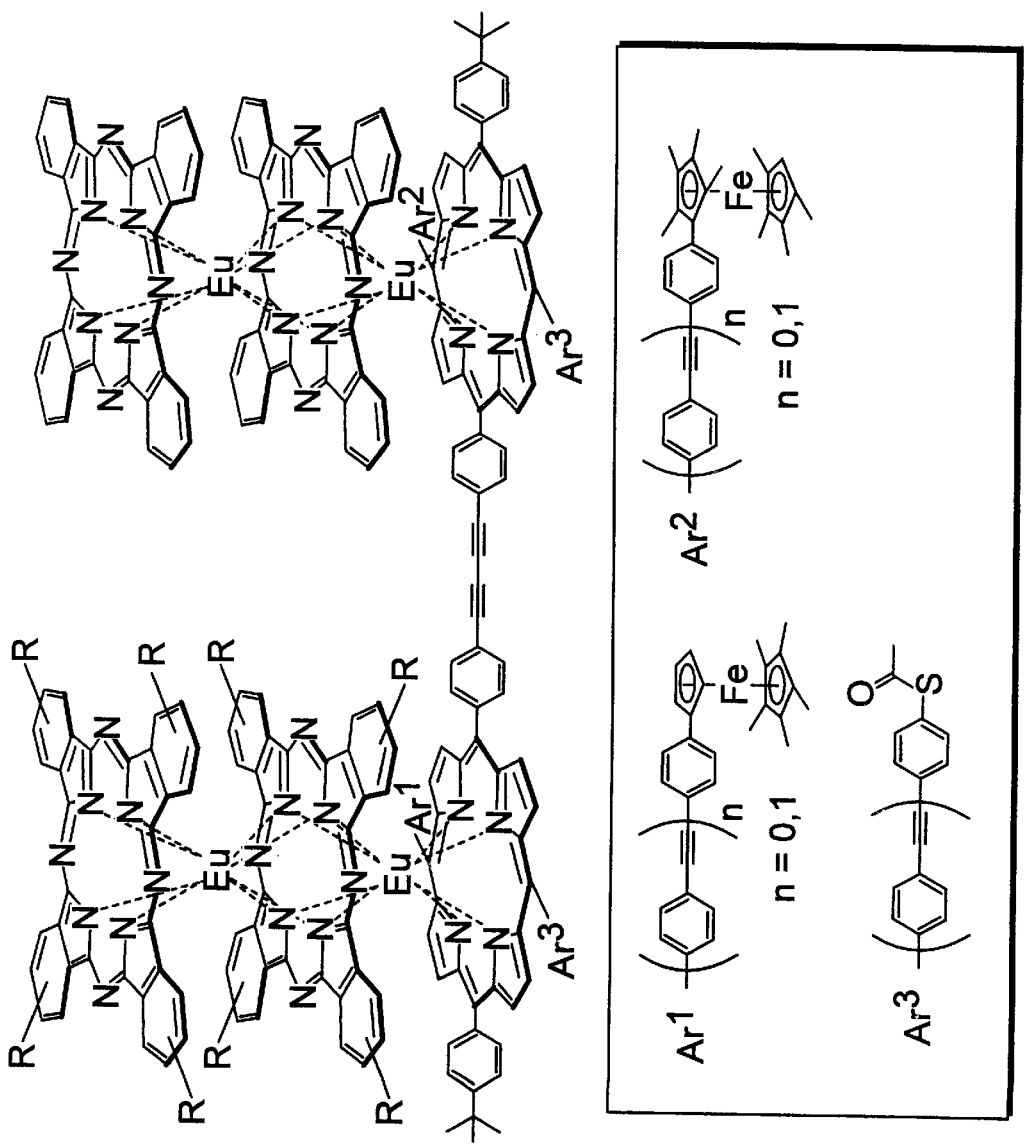
FIG. 14 shows a sandwich compound that incorporates two triple-decker sandwich molecules and two ferrocenes.
Figure 15:
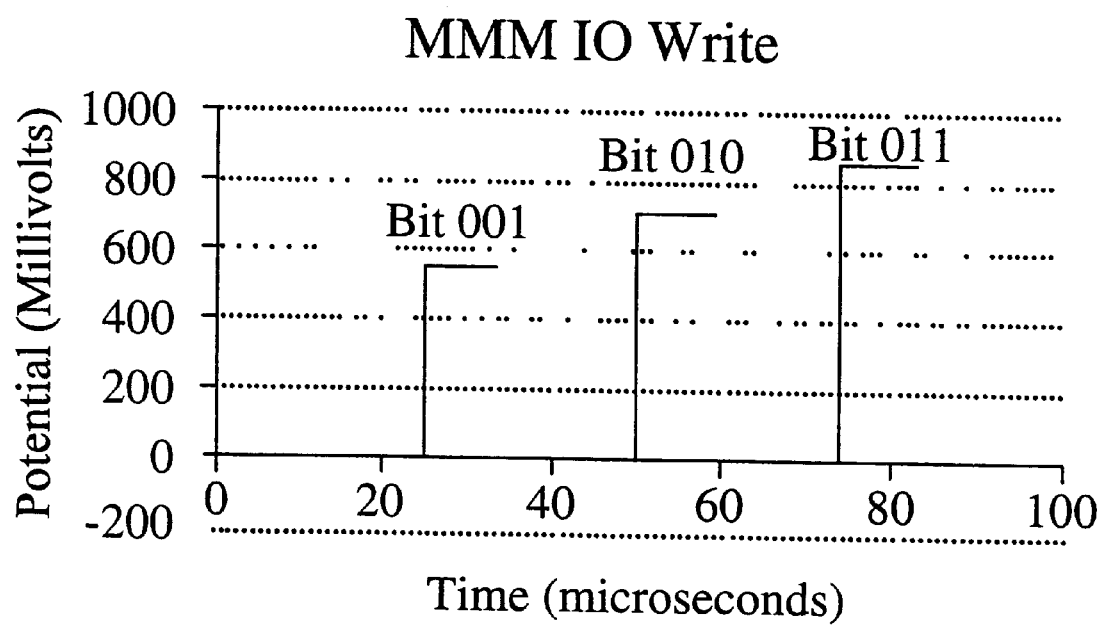
FIG. 15 illustrates writing to a molecular memory molecule of this invention. In preferred embodiments, this is accomplished through the application of very short (e.g., microsecond) pulses applied at a voltage sufficient to oxidize a storage medium (e.g., a sandwich coordination compound) to the appropriate redox state as summarized in this figure. Thus, each redox state of the composite multiunit nanostructure (e.g., a sandwich coordination compound array) can be accessed. This can be accomplished via the electrochemical oxidation of the molecule in stepwise increments.

Yet another architecture for molecular information storage builds on the concepts of using triple-decker molecules with interleaved oxidation potentials in conjunction with the use of other redox-active molecules. Such compounds are generally illustrated in Formula XVII and Formula XVIII above. The example architecture shown in FIG. 14 incorporates two triple-decker sandwich molecules and two ferrocenes. Altogether this architecture (or other suitable architectures within Formula XVII or Formula XVIII) has available 10 positively charged oxidation states. Note that with the neutral state defined as zero, the charged states of monocation to decacation correspond naturally to the numbers from 0 to 10. Thus a molecule having this architecture can be used to store a number from 0 to 10 by setting the electrochemical potential (of the molecules attached to an electroactive surface in a memory location) at the appropriate potential.

Preferably, the different and distinguishable oxidation states of the molecule, and a storage medium comprising the molecule, can be set by a voltage difference no greater than about 2 volts.

As indicated above, the storage medium is juxtaposed in the proximity of the electrode of an apparatus of the invention such that electrons can pass from said storage medium to said electrode. The storage medium may be juxtaposed to a dielectric material embedded with counterions. Typically, the storage medium and the electrode are fully encapsulated in an integrated circuit. In one embodiment, the storage medium is electronically coupled to a second electrode that is a reference electrode. The storage medium may be present on a single plane of a device, and may be present at a multiplicity of storage locations in the device. In another embodiment, the storage locations are present on multiple planes of the apparatus. Each storage location may be addressed by a single electrode, two electrodes, or more. In an assembled device the electrodes may be connected to a voltage source such as the output of an integrated circuit, and/or the electrode may be connected to a device to read the oxidation state of said storage medium (e.g., a voltammetric device, an amperometric device, a potentiometric device). Such a device may be a sinusoidal voltammeter. The device may provide a Fourier transform of the output signal from said electrode. The apparatus may be assembled or programmed to refresh the oxidation state of said storage medium after reading said oxidation state.

V. Synthesis and Characterization of Storage Medium Molecule(s)

A. Designing Oxidation States into the Storage Medium Molecule(s).

Control over the hole-storage and hole-hopping properties of the redox-active units of the storage molecules used in the memory devices of this invention allows fine control over the architecture of the memory device.

Such control is exercised through synthetic design. The hole-storage properties depend on the oxidation potential of the redox-active units or subunits that are themselves or that are used to assemble the storage media used in the devices of this invention. The hole-storage properties and redox potential can be tuned with precision by choice of base molecule(s), associated metals and peripheral substituents (Yang et al. (1999) *J. Porphyrins Phthalocyanines*, 3: 17–147).

For example, in the case of porphyrins, Mg porphyrins are more easily oxidized than Zn porphyrins, and electron withdrawing or electron releasing aryl groups can modulate the oxidation properties in predictable ways.

The electrochemical properties of a library of monomeric Mg or Zn porphyrins bearing diverse aryl groups have been characterized (Yang et al. (1999) *J. Porphyrins Phthalocyanines*, 3: 117–147). The effects of metals on metalloporphyrin oxidation potentials are well known (Fuhrhop and Mauzerall (1969) *J. Am. Chem. Soc.*, 91: 4174–4181). Together, these provide a strong foundation for designing devices with predictable hole-storage properties.

Ferrocene oxidation potentials can be tuned over a range of nearly 1 V through use of substituents attached to the cyclopentadienyl rings (*Encyclopedia of Electrochemistry of the Elements*, Bard, A. J., Lund, H., Eds., Marcel Dekker: New York, 1979, Vol. 13, pp 3–27).

The design of compounds with predicted redox potentials is well known to those of ordinary skill in the art. In general, the oxidation potentials of redox-active units or subunits are well known to those of skill in the art and can be looked up (see, e.g., *Encyclopedia of Electrochemistry of the Elements*, supra). Moreover, in general, the effects of various substituents on the redox potentials of a molecule are generally additive. Thus, a theoretical oxidation potential can be readily predicted for any potential data storage molecule. The actual oxidation potential, particularly the oxidation potential of the information storage molecule(s) or the information storage medium can be measured according to standard methods. Typically the oxidation potential is predicted by comparison of the experimentally determined oxidation potential of a base molecule and that of a base molecule bearing one substituent in order to determine the shift in potential due to that particular substituent. The sum of such substituent-dependent potential shifts for the respective substituents then gives the predicted oxidation potential.

B. Synthesis of Storage Medium Molecules.

The basic synthetic methodologies used to construct multiporphyrin nanostructures related to this invention are described in Prathapan et al. (1993) *J. Am. Chem. Soc.*, 115: 7519–7520, Wagner et al. (1995) *J. Org. Chem.*, 60: 5266–5273. Nishino et al. (1996) *J. Org. Chem.*, 61: 7534–7544, Wagner et al. (1996) *J. Am. Chem. Soc.*, 118: 11166–11180, Strachan et al. (1997) *J. Am. Chem. Soc.*, 119: 11191–11201, and Li et al. (1997) *J. Mater. Chem.*, 7: 1245–1262. These papers describe various strategies for the synthesis of a number of multiporphyrin (porphyrinic macrocycle) compounds. More particularly, these papers which focus on light capture, energy funneling, and optical gating, have led to the preparation of nanostructures containing up to 21 covalently linked porphyrins (Fenyo et al. (1997) *J. Porphyrins Phthalocyanines*, 1: 93–99, Mongin et al. (1998) *J. Org. Chem.*, 63: 5568–5580, Burrell and Officer (1998) *Synlett* 1297–1307, Mak et al. (1998) *Angew. Chem. Int. Ed.* 37: 3020–3023, Nakano et al. (1998) *Angew. Chem. Int.* Ed 37: 3023–3027, Mak et al. (1999) *Chem. Commun.*, 1085–1086). Two-dimensional architectures, such as molecular squares (Wagner et al. (1998) *J. Org. Chem.*, 63: 5042–5049), T-shapes (Johnson, T. E. (1995), Ph.D. Thesis, Carnegie Mellon University), and starbursts (Li et al. (1997) *J. Mater. Chem.*, 7: 1245–1262) all comprised of different covalently linked porphyrin constituents, have also been prepared.

In addition, the hole storage and dynamic hole mobility characteristics of the multiporphyrin nanostructures have been investigated in detail during the course of our other studies of these materials (Seth et al. (1994) *J. Am. Chem. Soc.*, 116: 10578–10592, Seth et al. (1996) *J. Am. Chem. Soc.*, 118: 11194–11207, Strachan et al. (1997) *J. Am. Chem. Soc.*, 119: 11191–11201; Li et al. (1997) *J. Mater. Chem.*, 7: 1245–1262, Strachan et al. (1998) *Inorg. Chem.*, 37: 1191–1201, Yang et al. (1999) *J. Am. Chem. Soc.*, 121: 4008–4018).

A handful of methods are available for forming phthalocyanines ((Lindsey, J. S. In *The Porphyrin Handbook*; Kadish, K. M.; Smith, K.; Guilard, R., Eds.; Academic Press, San Diego, Calif. 1999, Vol. 1, pp 45–118)). The lithium pentoxide method (involving the reaction of a phthalonitrile in n-pentanol containing lithium pentoxide) is one of the oldest methods for preparing phthalocyanines (Barrett, P. A.; Frye, D. A.; Linstead, R. P. *J. Chem. Soc.* 1938, 1157–1163.). This method somewhat fell into disuse upon the advent of the Shiraishi method, which has been used for the preparation of phthalocyanines bearing large substituents (Snow, A. W.; Jarvis, N. L. *J. Am. Chem. Soc.* 1984, 106, 4706–4711; Okur, A. I. et al., *Synth. React. Inorg. Met.-Org. Chem.* 1990, 20, 1399–1412; Rihter, B. D. et al., *Photochem. Photobiol.* 1992, 55, 677–680; Kobayashi, N. et al., *Chem. Lett.* 1992, 2031–2034; van Nostrum, C. F. et al., *Angew. Chem. Int. Ed. Eng.* 1994, 33, 2173–2175; Linssen, T. G.et al., *J. Chem. Soc., Chem. Commun.* 1995, 103–104; Duro, J. A. et al., *Tetrahedron Lett.* 1995, 36, 8079–8082; van Nostrum, C. F. et al., *J. Am. Chem. Soc.* 1995, 117, 9957–9965; Yilmaz, I.; Bekaroglu, Ö. *Chem. Ber.* 1996, 129, 967–971; Kimura, M. et al., *Chem. Commun.* 1997, 1215–1216: Brewis, M. et al., *Chem. Eur. J.* 1998, 4,1633–1640; Kimura, M. et al, *Tetrahedron Lett.* 1998, 39, 8471–8474; González, A. et al., *Tetrahedron Lett.* 1999, 40, 3263–3266). However, phthalonitriles bearing short alkyl-ethynyl or tetrathiafulvalene-linked substituents were recently converted to the corresponding phthalocyanines using the lithium pentoxide method (Terekhov, D. S. et al., *J. Org. Chem.* 1996. 61, 3034–3040; Wang, C. et al., *J. Chem. Soc., Perkin Trans.* 2, 1997, 1671–1678). The Shiraishi method and the lithium pentoxide method have both been used to prepared (porphyrin)$_4$phthalocyanine and (porphyrin)$_8$phthalocyanine star-shaped arrays (Li, J.; et al., *J. Org. Chem.* 1999, 64, 9090–9100; Li, J. *J. Org. Chem.* 1999, 64, 9101–9108). For these porphyrin-phthalocyanine arrays, the lithium pentoxide method gave higher yields than the Shiraishi method. Pd-coupling methods and other coupling methods have been used to prepare porphyrin-phthalocyanine dyads (Yang, S. I. et al., *J Mater. Chem.* 2000, 10, 283–296; S. Gaspard et al., *J. Chem. Soc., Chem. Commun.*, 1986, 1239; T.-H. Tran-Thi, et al, *J. Phys. Chem.*, 1989, 93, 1226; T.-H. Tran-Thi et al, *J. Chim. Phys.*, 1991, 88, 1151; L. Li, et al., *J. Chem. Soc., Chem. Commun.*, 1991, 619; H. Tian et al., *J. Photochem. Photobiol. A: Chem.*, 1993, 72, 163; K. Dou et al, *J. Lumin.*, 1994, 465; H. Tian et al., *Chin. J. Chem.*, 1996, 14, 412; X. Li et al., *Chin. J. Chem.*, 1998, 16,97; T.-H. Tran-Thi, *Coord. Chem. Rev.*, 1997,160,53).

The general synthetic strategy involves the following approaches: (1) synthesis of porphyrin and phthalocyanine monomers; (2) conversion of the porphyrin and phthalocyanine monomers with appropriate metals into triple deckers; (3) attachment of a suitable linker to be used for linking the triple decker to an electroactive surface; and (4) the directed self-assembly of the resulting nanostructures on the electroactive surface (e.g., gold electrode).

The following synthetic methods form the foundation for the synthesis of porphyrin building block structures:

(1) A room temperature one-flask synthesis of meso-substituted porphyrins (Lindsey et al. (1987) *J. Org. Chem.* 52: 827–836, Lindsey et al. (1994) *J. Org. Chem.* 59: 579–587, Li et al. (1997) *Tetrahedron*, 53: 12339–12360).

(2) Incorporation of bulky groups around the porphyrin to achieve enhanced solubility in organic solvents (Lindsey and Wagner (1989) *J. Org. Chem.* 54: 828–836).

(3) A one-flask synthesis of dipyrromethanes, key building blocks in the synthesis of porphyrins bearing 2–4 different meso-substituents (Lee and Lindsey (1994) *Tetrahedron* 50: 11427–11440, Littler et al. (1999) *J. Org. Chem.* 64:1391–1396).

(4) A synthesis of trans-substituted porphyrins without acidolytic scrambling (Littler et al. (1999) *J. Org. Chem.*, 64: 2864–2872).

(5) A rational synthesis of porphyrins bearing up to 4 different meso-substituents (Lee et al. (1995) *Tetrahedron* 51: 11645–11672; Cho, W.-S. et al., *J. Org. Chem.* 1999, 64, 7890–7901).

(6) Efficient Pd-mediated coupling reactions (60–80% yields in 1–2 h at 35° C.) for constructing diphenylethyne linkers joining the porphyrins (Wagner et al. (1995) *J. Org. Chem.*, 60: 5266–5273; Wagner et al. (1999) *Chem. Mater.* 11: 2974–2983).

In one embodiment, porphyrin building blocks are synthesized using methods described by Wagner et al. (1996) *J. Am. Chem. Soc.*, 118: 11166–11180, Strachan et al. (1997) *J. Am. Chem. Soc.*, 119: 11191–11201, Wagner et al. (1996) *J. Am. Chem. Soc.*, 118: 3996–3997, Li et al. (1997) *J. Mater. Chem.*, 7: 1245–1262; Lindsey et al. (1994) *Tetrahedron*, 50: 8941–8968; Wagner et al. (1994) *J. Am. Chem. Soc.*, 116: 9759–9760; Lindsey and Wagner (1989) *J. Org. Chem.*, 54: 828–836; Lee and Lindsey (1994) *Tetrahedron*, 50: 11427–11440; Wagner et al., (1995) *J. Org. Chem.*, 60: 5266–5273; Lee et al. (1995) *Tetrahedron*, 51: 11645–11672; Cho, W.-S. et al., *J. Org. Chem.* 1999,64, 7890–7901.

In a preferred embodiment, ethynyl-substituted phthalocyanines are prepared as described in Yang, S. I.; Li, J.; Cho, H. S.; Kim, D.; Bocian, D. F.; Holten, D.; Lindsey, J. S. *J. Mater. Chem.* (2000) 10, 283–296, Maya et al. (1999) *Chem. Eur. J.* 5: 2004–2013, or Terekhov et al. (1996) *J. Org. Chem.* 61:3034–3040.

Methodology for selection and manipulation of thiol linkers has been described in Gryko et al. (1999) *J. Org. Chem.* 64: 8635–8647.

The synthesis of the molecules that form the basis for the storage molecules is performed using a modular building block approach. This approach employs a stepwise synthesis (rather than polymerization) and yields highly purified and well-characterized products. One approach utilizes a series of redox-active "building blocks" (e.g., a series of monomeric porphyrinic macrocycles or ferrocene constituents) that can be linked to the gold substrate that will serve as one of the electrodes in the chip. Preferred monomeric redox-active units that are prepared have different oxidation potentials that fall in the range from −0.2 to 1.3 volts.

Heteroleptic double deckers comprised of different phthalocyanine ligands can be synthesized in several different ways. One method involves the reaction of two different dilithium phthalocyanines (Li$_2$Pc$^1$) and (Li$_2$Pc$^2$) with a metal acetate such as Lu(OAc)$_3$ at reflux in chloronaphthalene for 1 h, affording a statistical mixture of (Pc$^1$)Lu(Pc$^1$), (Pc$^1$)Lu(Pc$^2$), and (Pc$^2$)Lu(Pc$^2$) which then is separated chromatographically (Pondaven et al. (1991) *New J. Chem.*, 15: 515–516).

A stepwise method toward heteroleptic double deckers comprised of different phthalocyanine ligands affords greater control over the product distribution. In this stepwise method, the reaction of a mixture of Li$_2$Pc$^1$ and M(acac)$_3$.nH$_2$O in 1,2,4-trichlorobenzene at reflux for several hours affords the half-sandwich complex. The latter is then treated with a phthalonitrile and 1,8-diazabicyclo[5.4.0]undec-7-ene (DBU) and n-pentyl alcohol under reflux, giving the heteroleptic double decker (Pc$^1$)M(Pc$^2$) quite selectively (Jiang et al. (1998) *Inorg. Chim. Acta*, 268: 141–144, Jiang et al. (1999) *J. Porphyrins Phthalocyanines* 3: 322–328). The same approach beginning with a porphyrin half-sandwich complex affords the heteroleptic (Por)M(Pc) double decker (Jiang et al. (1998) *Polyhedron* 17: 3903–3908).

A distinct approach toward the synthesis of (Por)M(Pc) double deckers achieves some selectivity by employing reaction of (Pc)M(acac) with a porphyrin when the metal cation is quite large (e.g., La—Gd). On the other hand, the reaction of (Por)M(acac) with a phthalocyanine is employed when the metal cation is smaller (e.g., Er, Lu, and Y) (Chabach et al. (1995) *J. Am. Chem. Soc.* 117: 8548–8556).

Heteroleptic triple deckers comprised of porphyrins and phthalocyanines can be synthesized in the following manner. A mixture of free base porphyrin is treated with M(acac)$_3$.nH$_2$O in 1,2,4-trichlorobenzene at reflux for several hours. Then the dilithium salt of phthalocyanine (Li$_2$Pc) is added and the mixture is refluxed for an additional period. Subsequent chromatography affords the desired (Por)M(Pc) M(Por) and (Pc)M(Pc)M(Por) triple deckers (Jiang et al. (1998) *Inorg. Chim. Acta*, 268: 49–53). This is a very general method with regards to the nature of the metal and the substituents on the phthalocyanine, in spite of the distribution of products formed, and has been used to prepare a wide variety of such triple deckers.

Triple decker complexes with different metals also can be prepared in the following manner. Reaction of a (Por)M$^1$(Pc) with a (Por)M$^2$(acac) complex in 1,2,4-trichlorobenzene at reflux for eight hours resulted in the (Por)M$^1$(Pc)M$^2$(Por) triple decker, with metal combinations of Ce and Gd, Ce and Lu, Ce and Y, and La and Y (Chabach et al. (1996) *Angew. Chem. Int. Ed. Engl.* 35: 898–899.

A new route to triple decker phthalocyanines involves reaction of a metal or an alloy with a phthalonitrile. A notable example is provided by the reaction of $Bi_2Se_3$ with phthalonitrile, affording the triple decker (Pc)Bi(Pc)Bi(Pc) (Janczak et al. (1999) *Polyhedron*, 18: 2775–2780).

In one embodiment, the methods for joining the triple deckers into larger arrays employ Pd-mediated reactions. One example involves the coupling of iodo-substituted and ethynyl-substituted porphyrinic compounds (Wagner et al. (1995) *J. Org. Chem.* 60: 5266–5273, Wagner et al. (1999) *Chem. Mater.* 11: 2974–2983). Alternatively, the Cadiot-Chodkiewicz reaction enables unsymmetrical coupling of ethynyl-substituted compounds, affording the unsymmetrically substituted butadiyne product (Eastmond and Walton (1972) *Tetrahedron Lett.* 28: 4591–4599, Elbaum et al. (1994) *Tetrahedron* 50: 1503–1518, Montierth et al. (1998) *Tetrahedron* 54: 11741–11748, Godt (1997) *J. Org. Chem.* 62: 7471–7474). In yet another example, Suzuki coupling can be employed affording a phenylene or oligophenylene linker (Hensel and Schluter (1999) *Chem. Eur. J.* 5: 421–429).

A few double deckers or triple deckers with appended functional groups have been prepared. The appended groups include the following: quinone attached to a zirconium bis(porphyrin) (Girolami et al. (1996) *Angew. Chem. Int. Ed. Engl.* 35: 1223–1225), crown ethers attached to a lutetium bis(phthalocyanine) (Ishikawa and Kaizu (1998) *Chem. Lett.* 183–184), porphyrin attached to the porphyrin component of a (Pc)Eu(Por)Eu(Pc) triple decker (Arnold and Jiang (1999) *Chem. Lett.* 483–484).

Using the synthesis strategies exemplified here and in the examples, one of ordinary skill in the art can routinely produce relatively complex data storage molecules for use in the devices of this invention.

C. Characterization of the Storage Media.

The storage media molecule(s), once prepared, can be characterized according to standard methods well known to those of skill in the art. The characterization of multiporphyrin nanostructures has been described (see, e.g., Strachan et al. (1997) *J. Am. Chem. Soc.*, 119: 11191–11201; Wagner et al. (1996) *J. Am. Chem. Soc.*, 118: 3996–3997; Li et al. (1997) *J. Mater. Chem.*, 7: 1245–1262; Seth et al. (1996) *J. Am. Chem. Soc.*, 118:11194–11207; Seth et al. (1994) *J. Am. Chem. Soc.*, 116: 10578–10592). In a preferred embodiment, the electrochemical studies include cyclic and square-wave voltammetry to establish the redox potentials of the monomeric and multi-unit constituents of the storage media. Bulk electrochemical oxidations are performed on each of the storage materials to assess the hole-storage capabilities and the stability. Absorption and vibrational spectroscopic methods are used to assess the structural and electronic properties of both the neutral and oxidized materials. Electron paramagnetic resonance techniques are used to probe the hole-storage and hole-mobility characteristics of the oxidized storage molecules. Using the above-identified techniques, benchmarks for the expected performance characteristics of a storage molecule (e.g., oxidation potentials, redox reversibility, dynamic hole-mobility characteristics, etc.) can be ascertained.

D. Self-assembly of the Storage Medium Molecules on Target Substrates.

In preferred embodiments, the storage molecules comprising the storage medium are designed to self-assemble on a substrate (e.g. a metal such as gold). The disklike structure of the porphyrin macrocycles engenders self-assembly. Self-assembled monolayers of porphyrins on solid substrates are well known and have been extensively studied (see, e.g., Schick et al. (1989) *J. Am. Chem. Soc.*, 111:1344–1350, Mohwald et al. (1986) *Thin Solid Films*, 141: 261–275).

To exert control over the pattern of self-assembly, reactive sites (e.g. thiols) or linkers bearing active sites are incorporated into the storage molecules (nanostructures). The reactive sites bind to the target (e.g. gold electrode) surface giving an organized self-assembled structure. In the case of porphyrins with thiol-derivatized linkers attached to the meso positions, the porphyrins arrange in horizontal orientations. Non-covalent interactions between storage molecules are typically weak, particularly when bulky aryl groups are attached to each of the porphyrins.

VI. Writing to the Storage Device

In preferred embodiments of the data storage devices of this invention, information is written to a particular memory location via application of a potential of the requisite value and temporal duration at the appropriate working and reference electrode(s) to achieve the desired digital value. The information can be erased via application of a potential of the opposite sign.

There is a great advantage to the small size of each memory element, hich is essentially a modified electrode surface. When each memory element is educed to sub-micron dimensions, the area of the surface allows the presence of only a few hundred data storage (e.g., porphyrin) molecules. Using Faraday's law, Q=nFN (where Q equals the total charge, n equals the number of electrons per molecule, F is 96,485 Coulombs/mole and N is the number of moles of electroactive species present), it can be determined that only a small charge ($1.6\times10^{-16}$ C; if passed in 1 $\mu$s, would result in a current of roughly 160 pA) must pass in order to change the electrochemical charge corresponding to each bit.

Additionally, the intrinsic limitation to the speed of most electrochemical experiments lies in the time required to charge the electrode to the appropriate potential (the charging current, which has a time dependence of exp(-t/RC)). Since the capacitance of the electrode is directly proportional to its area, miniaturization of each element of the system to submicron dimensions will greatly increase its speed. For example, a square gold electrode with 0.1 $\mu$m dimensions would have a capacitance of approximately $2\times10^{-19}$F, leading to an RC time constant of only 2 picoseconds. For this reason, electrode charging currents should be insignificant in determining the ultimate performance of these devices.

The voltage used to write the data can be derived from any of a wide variety of sources. In a simple embodiment, the voltage can simply be the output from a power supply. However, in preferred embodiments, the voltage will be the output from some element of an electronic circuit. The voltage can be a signal, the representation of a logic state, the output from a gate, from an optical transducer, from a central processing unit, and the like. In short, virtually any voltage source that can be electrically coupled to the devices of this invention can be used to write data to the storage media therein.

VII. Reading from the Storage Device

The storage device(s) of this invention can be read according to any of a wide variety of methods well known to those of ordinary skill in the art. Essentially any method of detecting the oxidation state of a compound can be utilized in the methods of this invention. However, where the readout is destructive of the state of the memory cell(s) (e.g. in certain memories), the read will preferably be followed by a refresh to reset the oxidation state of the storage cell.

In particularly preferred embodiments as shown in FIG. 1 and FIG. 2, the storage medium 102 of a storage cell 100 is set to neutral (e.g., 0 potential for the system, but which might not be at true zero voltage with respect to ground) using the working electrode. The oxidation state of the memory cell is then set by changing the potential at the reference electrode 103 (e.g. by setting the reference electrode negative to the desired voltage). The oxidation state of the storage cell is then measured (e.g. using sinusoidal voltammetry) via the working electrode 101. In this preferred format, the oxidation state is assayed by measuring current. By measuring current at the working electrode 101 and setting the state with the reference electrode 103, the measurement is not made at the place the potential is applied. This makes it far simpler to discriminate the oxidation state. If the potential were applied to the electrode through which the current was measured unnecessary noise would be introduced into the system.

A. Reading from the Storage Media.

In the case of the storage media as described herein, the reading of information from a particular memory location is achieved extremely rapidly by sweeping a potential over the full range used to establish the dynamic range of the storage element. The fidelity of the measurement is dependent on how well the oxidation state of the individual storage element can be determined. Traditionally, electrochemical methods could only improve the signal to noise ratio by discriminating the faradaic signal from the background components in the time domain through application of pulse waveforms (i.e., differential pulse polarography, square wave voltammetry). These methods discriminate the faradaic current from the charging current in the time domain, since charging currents decay much more rapidly than the faradaic current ($\exp(-t/RC)$ vs $t^{-\frac{1}{2}}$, respectively). However, the analytical faradaic current is not totally discriminated from the charging current, and most of the signal is discarded because sampling is done late in the pulse cycle.

More recently, sinusoidal voltammetry (SV) has been shown to have significant advantages over traditional waveforms in an electrochemical experiment (Singhal and Kuhr (1997) *Anal. Chem.*, 69: 1662–1668. For example, the background current resulting from cyclic voltammetry (consisting primarily of charging current) resembles a square wave, which contains significant intensity at both fundamental and odd harmonic frequencies. In contrast, the charging current resulting from sine wave excitation has only one frequency component centered at the fundamental, while the faradaic current is distributed over many frequencies. This characteristic of sine wave excitation simplifies the electroanalytical measurement, since the signal from each oxidation state can be fine-tuned by "locking-in" on one of the higher frequency harmonics. Ultimately, the speed at which this can be performed is only limited by the kinetics of the redox reaction, which may ultimately lead to megahertz frequency operation.

Since most electrochemical methods rely on differences between the $E_{1/2}$'s ($E_{1/2}$ is the potential at which half of the subject molecules are oxidized or reduced to a particular oxidation state) to differentiate compounds present in a sample and thereby to generate the selectivity for the measurement, this has severely limited the utility of electrochemical methods for the analysis of many complex matrices. In contrast, sinusoidal voltammetry can exploit the vast diversity in electron transfer rates observable at solid electrodes ($k^0$, the rate of electron transfer) can vary over ten orders of magnitude at the same electrode surface) to obtain additional selectivity in the electrochemical measurement.

The composition of the frequency spectrum is extremely dependent on the rate of electron transfer. By adjusting the frequency of the sinusoidal (or other time-varying) excitation waveform, it becomes possible to use this kinetic information as well as the phase information to discriminate between two molecules which have very similar electrochemical properties. For example, this technique has been used for the detection of the direct oxidation of double-stranded DNA at copper electrodes (Singhal and Kuhr (1997) *Anal Chem.*, 69: 1662–1668). Where this is usually undetectable at conventional electrodes with standard voltammetric techniques, the use of sinusoidal voltammetry allowed the measurement of 1.0 nM double-stranded DNA. The concentration detection limit (S/N=3) for this size of dsDNA at the 6th harmonic is 3.2 pM. When coupled with a low-volume system, such as a monolayer of the adsorbed material, this allows detection of sub-zeptomole ($10^{-21}$ mole) quantities of the storage medium molecule(s) on the surface.

This procedure may ultimately degrade the memory in the absence of a refresh mechanism. The level of degradation will depend on the total number of molecules ultimately used to ensure acceptable fault tolerance. To avoid degradation problems, however, a refresh cycle (a write cycle resetting the memory to the read value) can be inserted immediately after each read cycle is complete.

B. Instrumentation for Reading/Writing Molecular Memories.

As indicated above, the molecular memory devices can be read by any of a wide variety of electrochemical technologies including amperometric methods (e.g. chronoamperometry), coulometric methods (e.g chronocoulometry), voltammetric methods (e.g., linear sweep voltammetry, cyclic voltammetry, pulse voltammetries, sinusoidal voltammetry, etc.), any of a variety of capacitance measurements, and the like. Such readouts can be performed in the time and/or frequency domain.

In one preferred embodiment, readout is accomplished using a fast potentiostat/voltammetry system. Such a system is capable of reading and writing the memory elements on a microsecond time scale. Such a system can be modified from a prototypical system described in U.S. Pat. No. 5,650,061.

Figure 16:
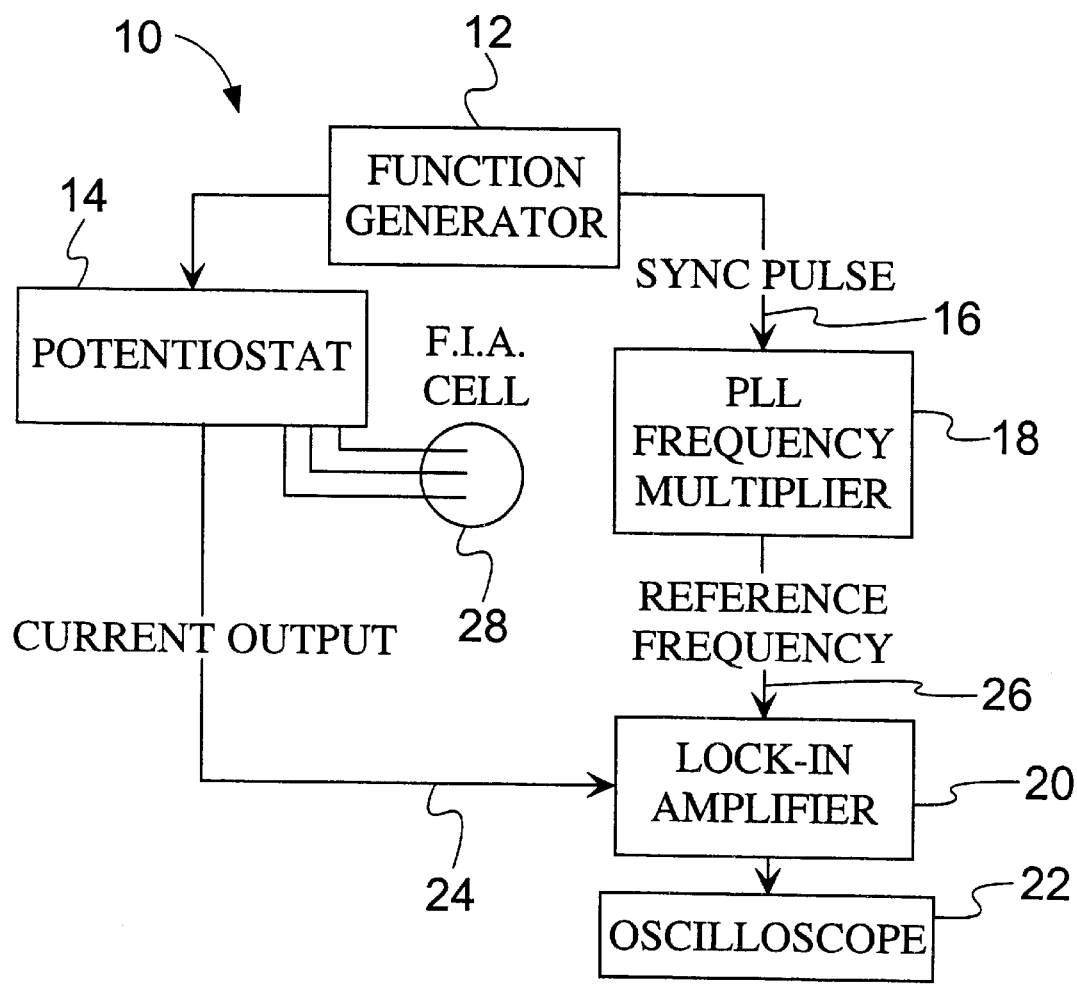
FIG. 16 illustrates a sinusoidal voltammetry system suitable for readout of the memory devices of this invention.

As illustrated in FIG. 16, a potentiostat with an RC time constant less than one microsecond is provided by using a fast voltage driver (e.g., video buffer amplifier). A preferred video buffer amplifier retains a usable bandwidth beyond 20 MHz and is used to rephase the voltage and current in the excitation signal to zero phase shift between voltage and current. This rephasing of the excitation signal immediately before the working electrode cancels out any phase shift which might be introduced by capacitance in the cable leading from the Arbitrary Waveform Synthesizer (AWS) function generator. An important part of the current monitor is a wide band op-amp. By using an op-amp with a very wide gain-bandwidth product, the amplifier gain can be set to 10,000 and still retain a bandwidth usable from DC to above 1 MHz. This allows the collection of impedance data from electrodes as small as a 1 μm disk over a frequency range from 15 kHz to 5 MHz.

VIII. Use of the Storage Device in Computer Systems

Figure 17:
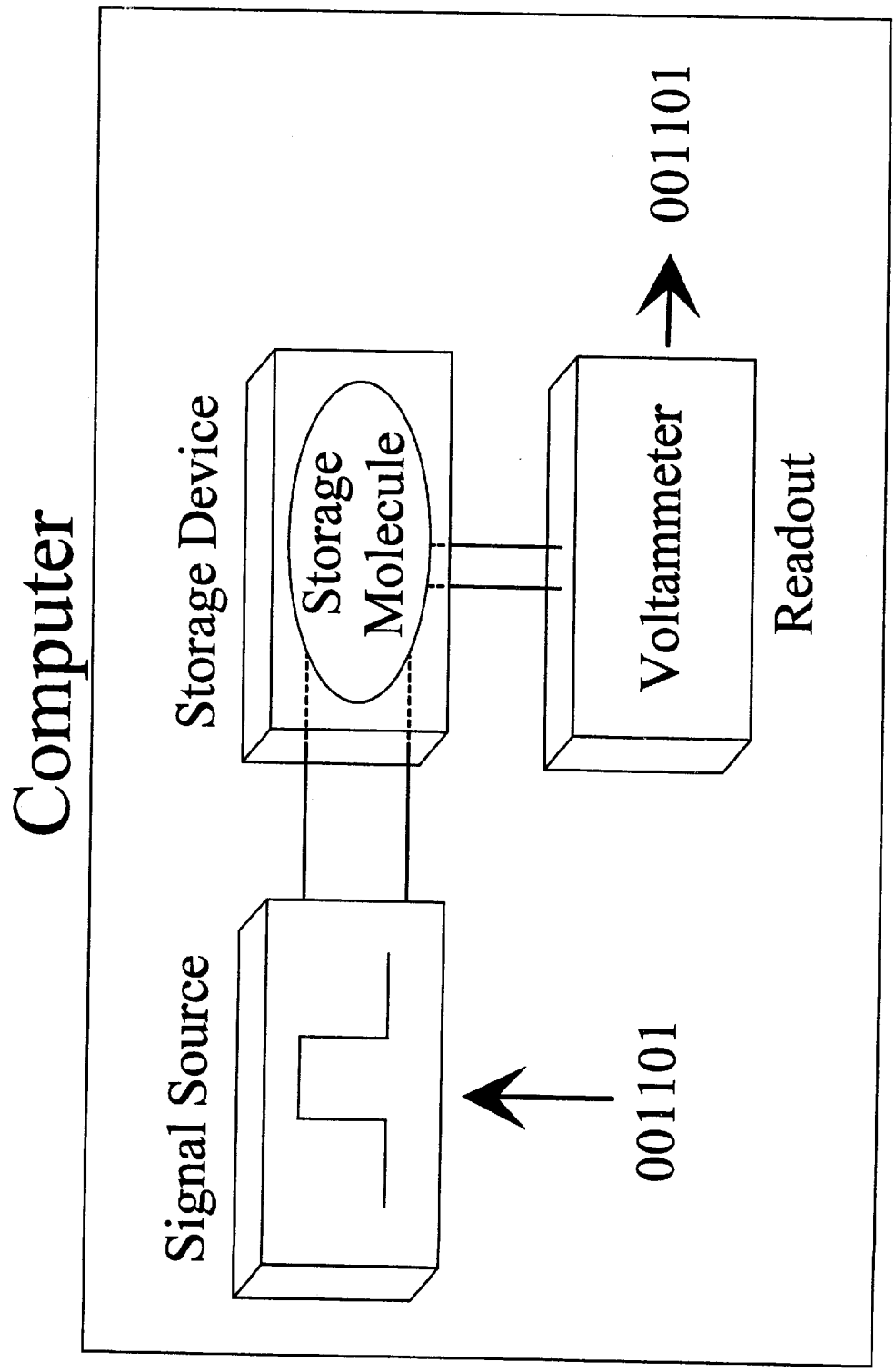
FIG. 17 illustrates a computer system embodying the memory devices described herein. Typically the memory device will be fabricated as a sealed "chip". Ancillary circuitry on the chip and/or in the computer permits writing bits into the memory and retrieving the written information as desired.

The use of the storage devices of this invention in computer systems is contemplated. One such computer system is illustrated in FIG. 17. The computer comprises a signal source (e.g. 110 device or CPU), a storage device of this invention, and appropriate circuitry (e.g. voltammnetry circuitry) to read the state(s) of the storage device. In operation, voltages representing the bits to be stored are applied to the working electrodes of the storage device thereby setting the memory. When retrieval is necessary (e.g. for output, or further processing) the state(s) of the storage device is read by the 110 circuitry and the information is passed off to other elements (e.(. CPU) in the computer.

Figure 18:
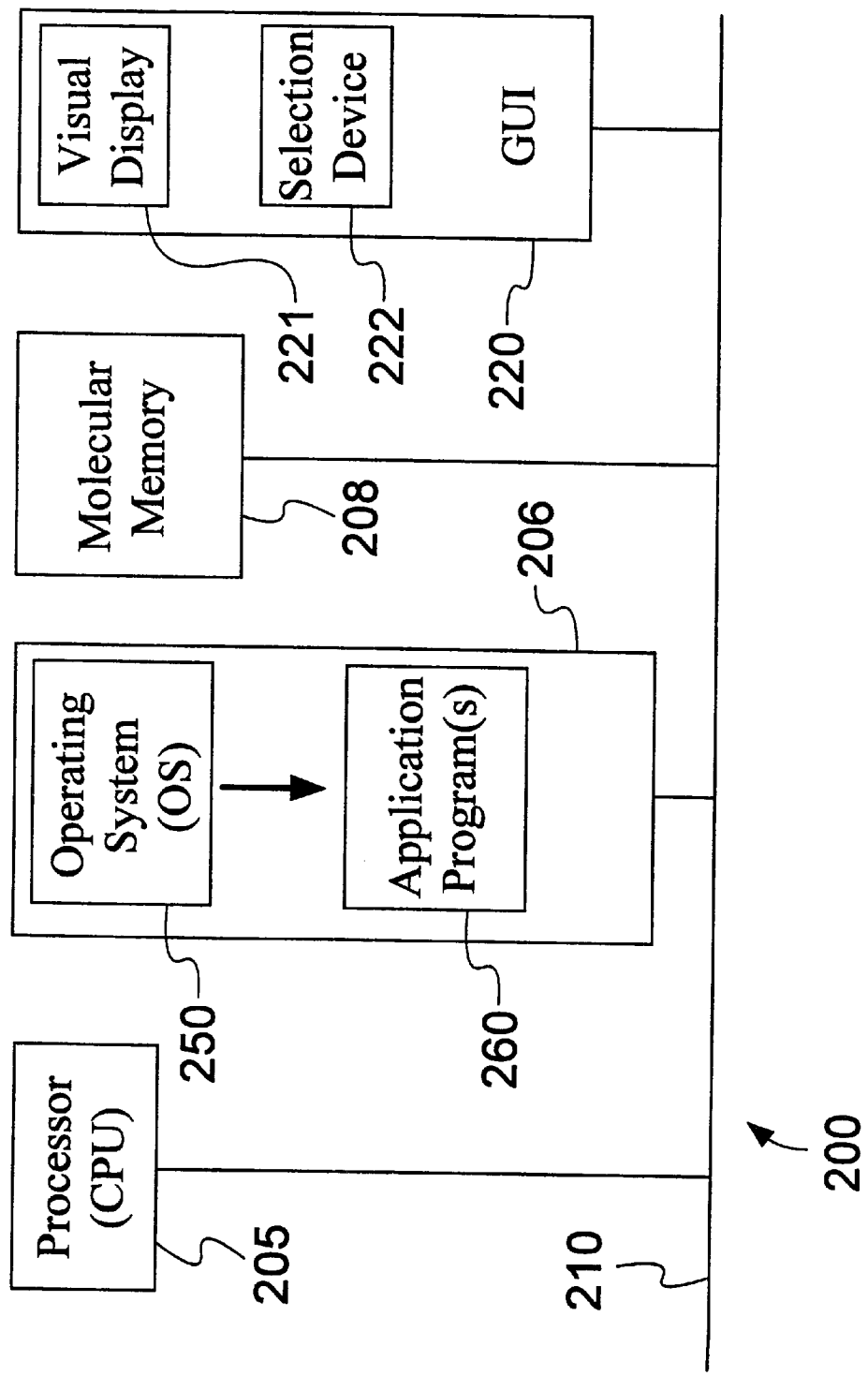
FIG. 18 illustrates the memory devices of this system integrated into a standard computer architecture or computer system 200.

FIG. 17 and FIG. 18 illustrate the memory devices of this invention integrated into a standard computer architecture or computer system 200. The hardware of system 200 includes a processor (CPU) 205, a memory 206 (which can comprise molecular memory devices), a persistent storage 208 which does comprise molecular memory devices of this invention, and hardware for a graphical user interface (GUI) 220, coupled by a local bus or interface 210. The persistent memory 208 can include the molecules shown in FIG. 6. System 200 can further include additional hardware components (not shown).

System 200 can be, for example, a personal computer or workstation. Processor 205 can be, for example, a microprocessor, such as the 80386, 80486 or Pentium™ microprocessor, made by Intel Corp. (Santa Clara, Calif.). Memory 206 can include, for example, random-access memory (RAM), read-only memory (ROM), virtual memory, molecular memory or any other working storage medium or media accessible by processor 205. Persistent storage 208 can include a hard disk, a floppy disk, an optical or magneto-optical disk, a molecular memory or any other persistent storage medium. GUI 220 facilitates communications between a user and system 200. Its hardware includes a visual display 221 and a selector device (mouse, keyboard, etc.) 222. Through visual display 221, system 200 can deliver graphical and textual output to the user. From selector device 222, system 200 can receive inputs indicating the user's selection of particular windows, menus, and menu items. Visual display 221 can include, for example, a cathode-ray tube (CRT) or flat-panel display screen, or a head-mounted display such as a virtual reality display. Selector device 222 can be, for example, a two-dimensional pointing device such as a mouse, a trackball, a track pad, a stylus, a joystick, or the like. Alternatively or additionally, selector device 222 can include a keyboard, such as an alphanumeric keyboard with function and cursor-control keys.

The software of system 200 includes an operating system 250 and an application program 260. The software of system 200 can further include additional application programs (not shown). Operating system 250 can be, for example, the Microsoft® Windows™ 95 operating system for IBM PC and compatible computers having or emulating Intel 80386, 80486, or Pentium™ processors. Alternatively, the operating system can be specialized for operation utilizing molecular memory elements. Application program 260 is any application compatible with the operating system and system 200 architecture. Persons of skill in the art will appreciate that a wide range of hardware and software configurations can support the system and method of the present invention in various specific embodiments.

The present invention is explained in greater detail in the following non-limiting examples.

EXAMPLE 1

Synthesis of Thiol-Derivatized Europium Porphyrinic

Triple-Decker Sandwich Complexes for Multi-Bit Molecular Information Storage

In these examples, the synthesis of S-acetylthio derivatized porphyrin-phthalocyanine triple-decker molecules is described. A set of triple-decker building blocks bearing trimethylsilyl and/or iodo groups was also prepared. Two of the triple-decker building blocks were joined to afford an S-acetylthio derivatized dyad of triple-deckers. All of the sandwich complexes prepared employ europium as the coordination metals.

Results and Discussion

Porphyrin-phthalocyanine Triple-decker Building Blocks. In order to prepare triple-decker complexes for attachment to an electroactive surface, provisions must be made for incorporation of a thiol-derivatized linker. In order to prepare molecular architectures wherein multiple triple deckers are joined together in a controlled manner, provisions must be made for incorporating synthetic handles on the triple deckers. In principle the thiol linker and the synthetic handles could be fastened to the porphyrin or the phthalocyanine unit in the triple deckers. Because the synthetic chemistry of porphyrins is much better developed than that of phthalocyanines, triple decker building blocks that are constructed around suitably functionalized porphyrins have been developed. To avoid any rotational isomers that might accrue from two functionalized porphyrins in one triple decker, molecules comprised of one porphyrin and two phthalocyanines have been prepared. Two isomers of such a triple decker are possible depending whether the porphyrin is located in the middle or at the end of the sandwich. Given the greater yield of the triple decker with the porphyrin on the end of the sandwich (i.e., (Pc)M(Pc)M(Por)), the synthesis of triple decker building blocks of this general type has been pursued.

Figure 19:
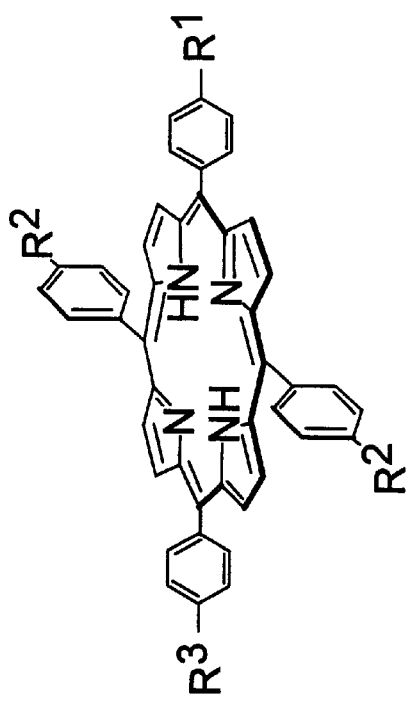
FIG. 19 illustrates the porphyrin building blocks used to prepare corresponding triple decker building blocks.

The harsh nature of the reaction conditions for forming triple deckers precludes incorporation of a protected thiol unit or other sensitive groups in the porphyrin monomer prior to forming the triple decker. Thus, the preparation of triple deckers bearing an iodo group or an ethynyl group, or both an iodo and an ethynyl group, has been a focus. These synthetic handles provide the opportunity for elaboration of the triple-decker complexes into large molecular arrays or for attachment of thiol linkers. The porphyrin building blocks to be used in preparing the corresponding triple-decker building blocks are shown in FIG. 19.

The general procedure for preparing mixed porphyrin-phthalocyanine sandwich complexes involves refluxing the porphyrin with excess $M(acac)_3 \cdot nH_2O$ in 1,2,4-trichlorobenzene affording the (porphyrin)M(acac) complex, followed by the addition of dilithium phthalocyanine ($Li_2Pc$) with continued reflux. However, quite different product distributions have been obtained upon reaction under rather similar conditions. These include (Por)M(Pc) as the sole product (Chabach, D. et al., *J. Am. Chem. Soc.* 1995, 117, 8548–8556), (Por)M(Pc)M(Pc) as the sole product (Moussavi. M. et al., *Inorg. Chem.* 1986, 25, 2107–2108), Li[(Pc)M(Por)] as the main product (Jiang, J. et al., *Chem. Ber.* 1996, 129, 933–936), products including (Por)M(Pc)M(Por) and (Pc)M(Por)M(Pc) (Chabach, D. et al., *New J. Chem.* 1992, 16, 431–433), and products including (Por)M(Pc), (Por)M(Pc)M(Por) and (Por)M(Pc)M(Pc) with the latter two kinds of compounds as the main products (Jiang, J. et al., *Inorg. Chim. Acta* 1997, 255, 59–64; Jiang, J. et al., *Inorg. Chim. Acta* 1998, 268, 49–53). The distribution of the products appears to depend rather strongly on the nature of the metal as well as the substituents on the macrocycles.

Figure 20B:
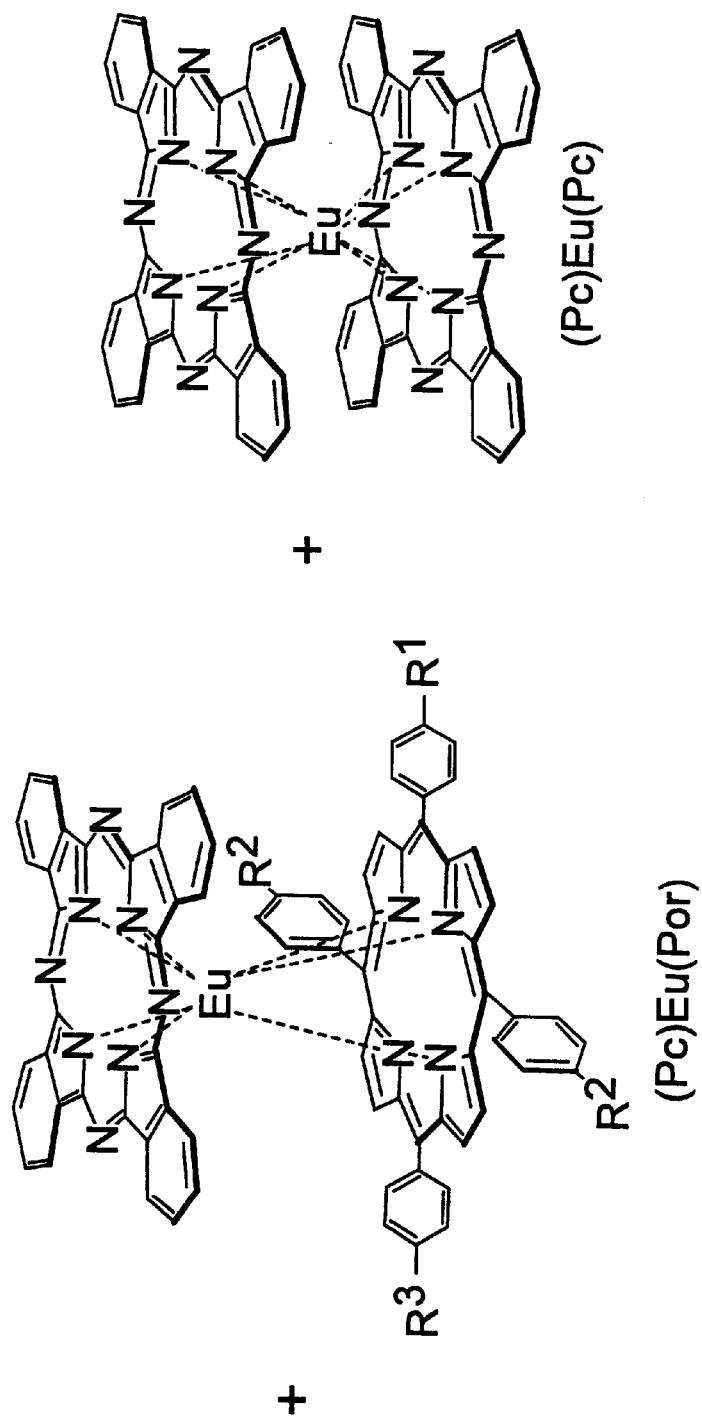
FIG. 20 illustrates the product mixture containing these triple deckers as well as traces of two double deckers, produced by the treatment of (Por)Eu(acac) with $Li_2Pc$.

Treatment of 5-(4-iodophenyl)-15-phenyl-10,20-di(p-tolyl)porphyrin (IPT-Por) with excess Eu(acac)$_3$ nH$_2$O in 1,2,4-trichlorobenzene afforded the corresponding (Por)Eu(acac). Treatment of the latter with Li$_2$Pc gave a mixture containing (IPT-Por)Eu(Pc)Eu(IPT-Por), (Pc)Eu(IPT-Por)Eu(Pc), (Pc)Eu(Pc)Eu(IPT-Por) as well as traces of (Pc)Eu(IPT-Por) and (Pc)Eu(Pc) (FIG. 20). The mixture could be partially separated by one silica gel column, affording bands comprised predominantly of (IPT-Por)Eu(Pc)Eu(IPT-Por) contaminated with (Pc)Eu(IPT-Por) and starting porphyrin (IPT-Por) [band 1], (Pc)Eu(IPT-Por) and starting porphyrin (IPT-Por) [band 2], (Pc)Eu(IPT-Por)Eu(Pc) [band 3], (Pc)Eu(Pc)Eu(IPT-Por) [band 4], and (Pc)Eu(Pc) [top of column]. Further purification of band 1 by passage over one SEC column afforded pure (IPT-Por)Eu(Pc)Eu(IPT-Por). A second silica column of band 4 afforded pure (Pc)Eu(Pc)Eu(IPT-Por). The isolated yields were as follows: (IPT-Por)Eu(Pc)Eu(IPT-Por) (17%), (Pc)Eu(IPT-Por)Eu(Pc) (1%), and (Pc)Eu(Pc)Eu(IPT-Por) (14%). These results are somewhat similar to those of Jiang et al., supra though the isolated yield of (IPT-Por)Eu(Pc)Eu(IPT-Por) was substantially lower than the 60% reported by Jiang et al. for the same kind of triple-decker complex. Furthermore, in addition to triple-decker complex (Pc)Eu(Pc)Eu(IPT-Por), we also isolated the isomeric triple-decker complex (Pc)Eu(IPT-Por)Eu(Pc), though in relatively low yield.

Figure 21:
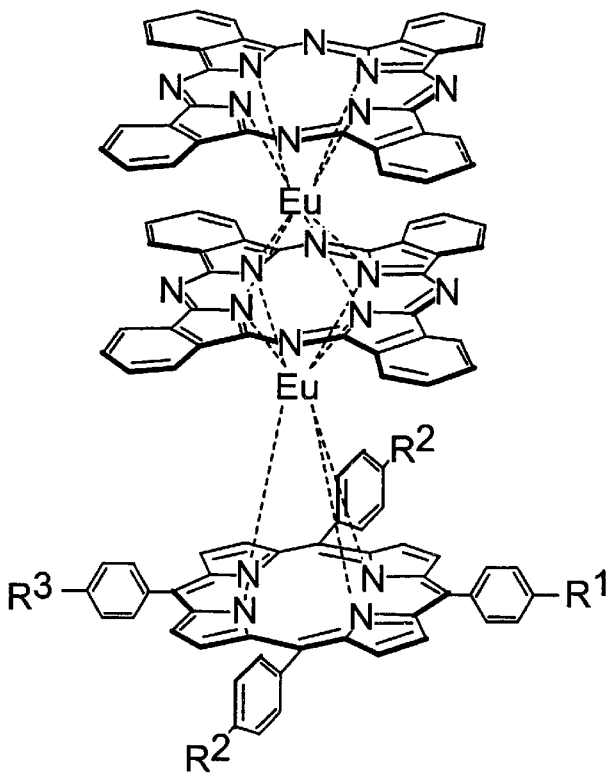
FIG. 21 illustrates building block triple-decker complexes of general structure (Pc)Eu(Pc)Eu(Por).

The same reaction conditions were employed with three other porphyrins and analogous product distributions were obtained. The results concerning the isolated yields of triple deckers from each reaction are summarized in Table 3. In each case no decomposition of the synthetic handles (iodo, TMS-ethyne) was noticed. The stability of the trimethylsilylethynyl group to these reaction conditions was surprising, given the lability of the TMS group toward base even under very mild conditions (Wagner, R. W. et al., *J. Am. Chem. Soc.* 1996, 118, 11166–11180). This approach afforded a number of building block triple-decker complexes of general structure (Pc)Eu(Pc)Eu(Por) as shown in FIG. 21. Deprotection of the TMS-ethynyl group of the triple deckers (Pc)Eu(Pc)Eu(ET-Por) and (Pc)Eu(Pc)Eu(EB-Por) afforded the corresponding ethynyl triple deckers (Pc)Eu(Pc)Eu(E'T-Por) and (Pc)Eu(Pc)Eu(E'B-Por), respectively.

TABLE 3

Yields of triple-decker building blocks with various porphyrins.[1]

| Por-phyrin | Isolated Yields (%) | | |
|---|---|---|---|
| | (Por)Eu(Pc)Eu(Por) | (Pc)Eu(Por)Eu(Pc) | (Pc)Eu(Pc)Eu(Por) |
| IPT-Por | 17% | 1% | 14% |
| ET-Por | 9.5% | 0.5% | 9.1% |
| EB-Por | 26% | 1.6% | 9.1% |
| IET-Por | 19% | 1.5% | 9.9% |

[1]Reactions were performed using a ratio of 1.5 moles of Pc component per 1 mol of porphyrin.
Yields were calculated based on the amount of porphyrin.

Synthesis of Thiol-derivatized Porphyrin-phthalocyanine Triple-decker Complexes. For applications in molecular information storage devices, the triple-decker complexes must be attached to an electroactive material such as a gold surface. Among various thiol protecting groups that are cleaved in situ on gold, the S-acetyl group was found to be ideal, especially for attachment of porphyrinic compounds (Gryko, D. T. et al, *J. Org. Chem.* 1999, 64, 8635–8647). Two different approaches for introducing the S-acetylthio group into the triple-decker nucleus have been explored.

Figure 22:
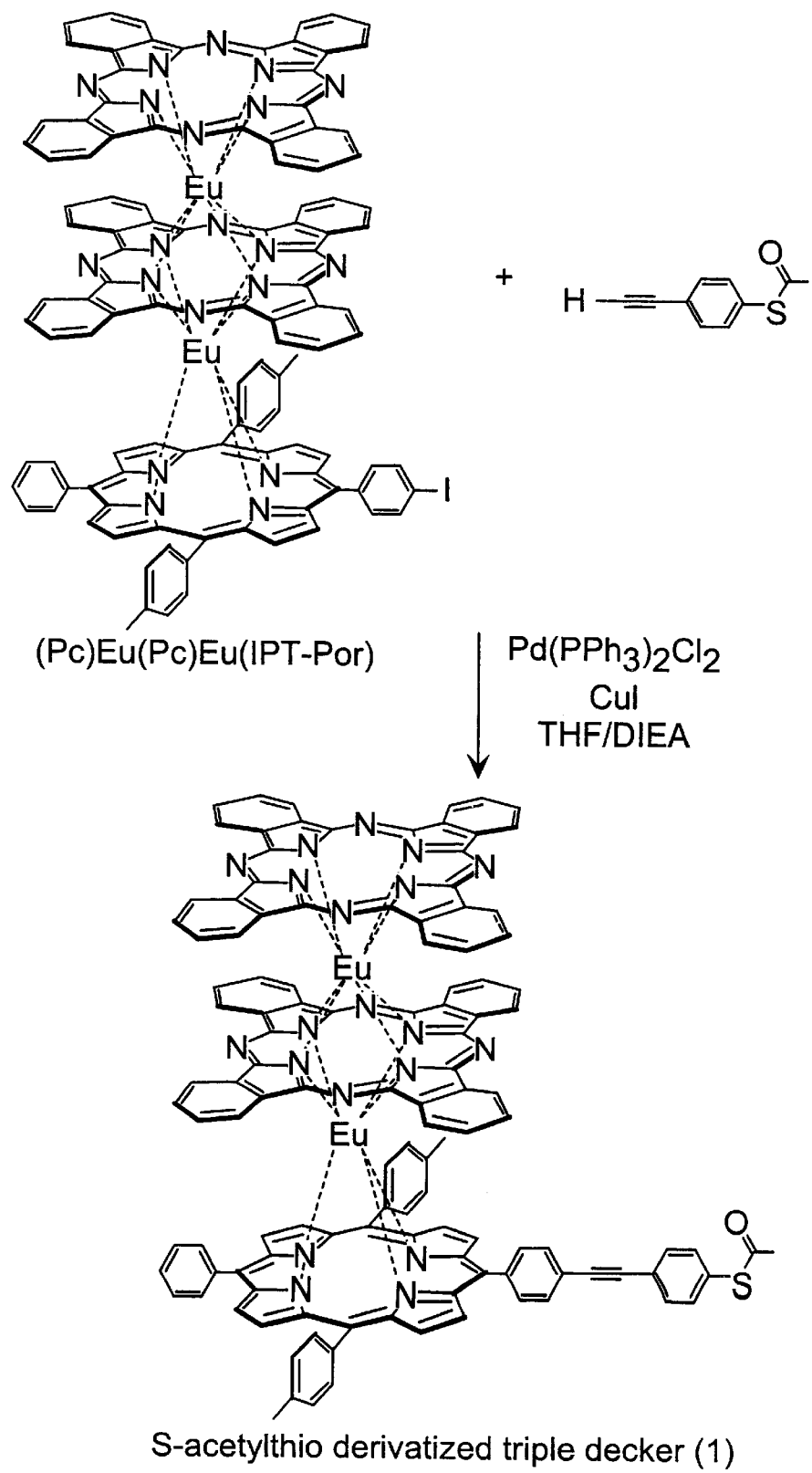
FIG. 22 illustrates the coupling of the iodo-substituted triple decker (Pc)Eu(Pc)Eu(EB-Por) and 4-ethynyl-1-(S-acetylthio)benzene under Pd-mediated coupling conditions $(Pd(PPh_3)_2Cl_2$, CuI) in the presence of the base N,N-diisopropylethylamine.

In one case, the iodo-substituted triple decker (Pc)Eu(Pc)Eu(JPT-Por) and 4-ethynyl-1-(S-acetylthio)benzene were coupled under Pd-mediated coupling conditions (Pd(PPh$_3$)$_2$Cl$_2$, CuI) in the presence of the base N,N-diisopropylethylamine (FIG. 22). Because the S-acetylthio group undergoes cleavage in the presence of some of the bases (diethylamine, triethylamine) commonly used in Pd-coupling reactions, N,N-diisopropylethylamine was used (Pearson, D. L.; Tour, J. M. *J. Org. Chem.* 1997, 62, 103076–1387), and no cleavage product was found in the reaction mixture. Purification via two silica columns gave the desired S-(acetylthio)-derivatized triple-decker 1 in 50% yield.

Previously, mild conditions for joining iodo and ethynyl-substituted porphyrin building blocks under Pd-coupling reactions (Pd$_2$(dba)$_3$, AsPh$_3$ or tri-o-tolylphosphine) have been developed that avoid use of copper co-catalysts. Copper accelerates Pd-mediated coupling reactions but must be omitted in the synthesis of multiporphyrin arrays comprised of free base porphyrins in order to avoid adventitious metalation (Wagner, R. W. et al, *J. Org. Chem.* 1995, 60, 5266–5273; Wagner, R. W. et al. *Chem. Mater.* 1999, 10, 2974–2983). Due to the strong coordination of the lanthanide triple-decker complexes, the usual side-products resulting from copper metalation or transmetalation are not expected. Indeed, clean copper-free products were obtained in the presence of copper salts during the Pd-coupling reaction.

Figure 23:
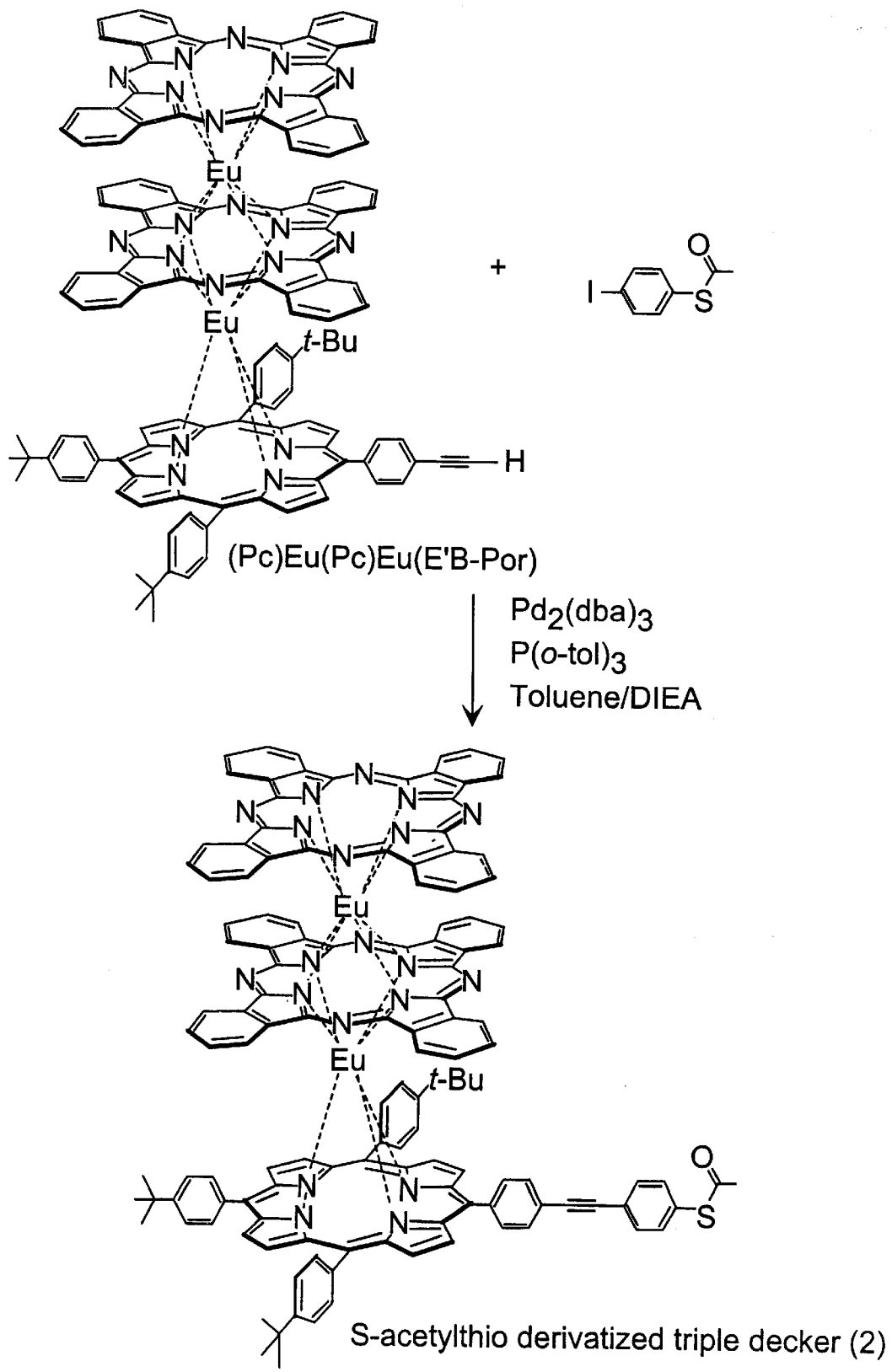
FIG. 23 illustrates the coupling of the ethynyl-substituted triple decker (Pc)Eu(Pc)Eu(EB-Por) and 4-iodo-1-(S-acetylthio)benzene under the Pd-coupling conditions $(Pd_2(dba)_3$, tri-o-tolylphosphine) used for joining porphyrin building blocks.

In a second case, the ethynyl-substituted triple decker (Pc)Eu(Pc)Eu(EB-Por) and 4-iodo-1-(S-acetylthio)benzene were coupled under the Pd-coupling conditions (Pd$_2$(dba)$_3$, tri-o-tolylphosphine) used for joining porphyrin building blocks (FIG. 23). It is known that copper can facilitate homo-coupling leading to the butadiyne-linked product, and such products are minimized under these conditions. Examination of the laser desorption mass spectrum of the crude reaction mixture revealed two dominant peaks (m/z 2179, 2287) corresponding to an unknown species and the desired product, respectively. Column chromatography afforded the two separate species. $^1$H NMR analysis of the former species revealed a sharp singlet (2.86 ppm, 3H) consistent with an acetyl moiety. This species was assigned to an acetylated derivative of the ethynyl-substituted triple decker starting material. This side reaction is ascribed to the acetylation by 4-iodo-1-(S-acetylthio)benzene (or product derived therefrom) of the ethynyl group attached to the triple-decker complex. The desired S-acetylthio derivatized triple-decker 2 was obtained in 19% yield, which is quite low compared with the typical yield (50–60%) in the reaction between two porphyrin monomers under the same conditions. The simplest way to avoid forming the acetylated triple decker by-product is to employ an iodo- rather than ethynyl-substituted triple-decker complex.

Sonogashira Coupling to Yield a Thiol-derivatized Dyad of Triple-deckers. The use of thiol-derivatized triple deckers for information storage provides the opportunity to access four cationic states, thereby storing two bits of information. In order to store additional information in one memory storage location, two different triple deckers can be employed where the four oxidation potentials of each are interleaved in a comb-like manner, accessing eight cationic states and thereby storing three bits of information. Alternatively, two triple deckers can be incorporated in one molecular architecture. There are at least two advantages of incorporating multiple redox-active groups in a molecular architecture. (1) The deposition of a homogeneous population of information storage molecules in a memory storage cell is not subject to fractionation effects as might occur with co-deposition of a mixture of molecules of different types. (2) The positioning of redox-active units in a vertical stack enables a higher concentration of redox-active molecules of a given type than would be possible upon co-deposition of a mixture of thiol-derivatized molecules each bearing one redox-active unit in a monolayer. To explore these advantages the synthesis of a dyad of triple deckers has been pursued.

Two routes to the desired dyad are readily envisaged. In one route, an S-(acetylthio)-substituted ethynyl benzene is coupled with an iodo/TMS-ethynyl triple decker, then after TMS cleavage the S-(acetylthio)-derivatized ethynyl triple decker is reacted with an iodo triple decker. This route introduces the protected thio moiety at the earliest stage of the synthetic plan. A complementary route begins with coupling of an ethynyl triple decker and iodo/TMS-ethynyl triple decker to make a dyad followed by TMS cleavage and reaction with an S-(acetylthio)-substituted iodo benzene. The latter route introduces the thiol linker in the last step of the synthetic plan, and is attractive in minimizing handling of the S-(acetyl)-protected thiophenol moiety. This latter route was used in the following synthesis.

Figure 24A:
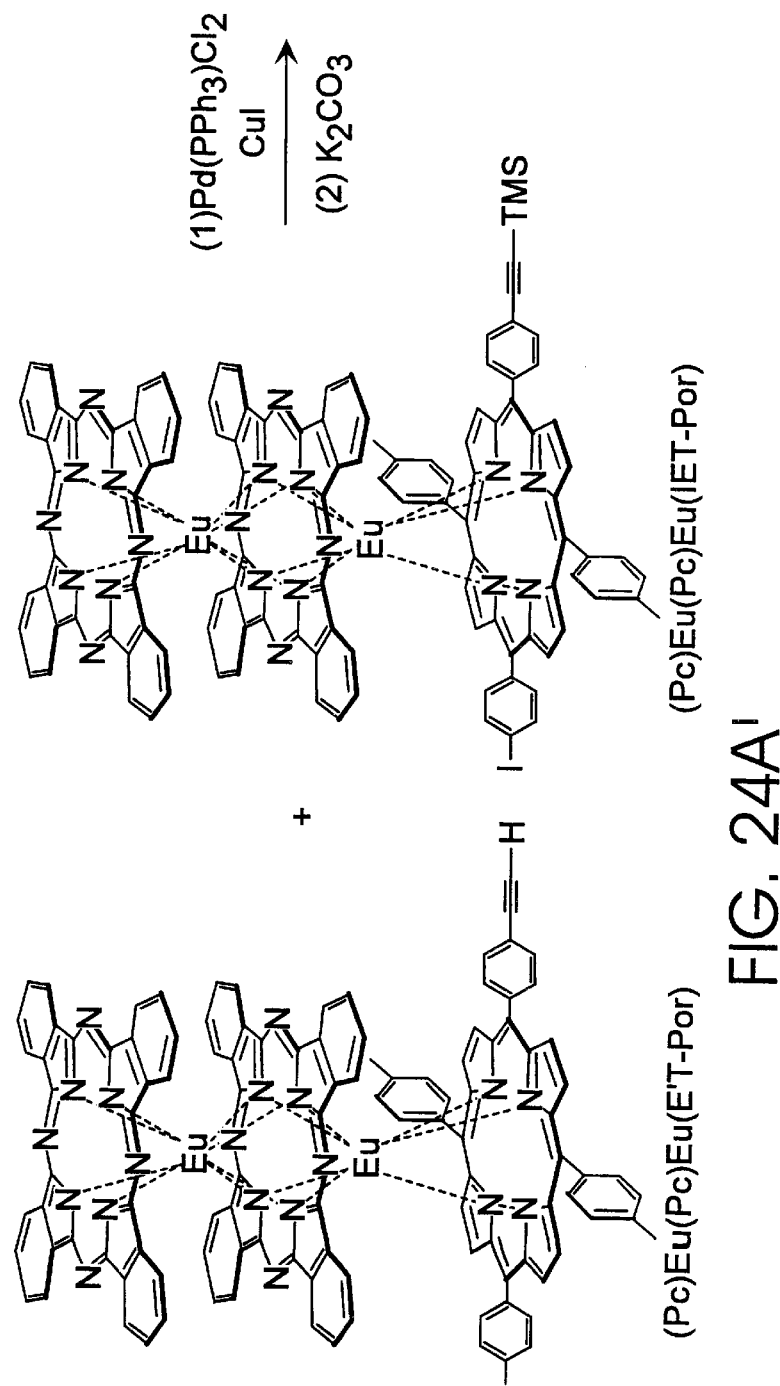
FIG. 24A illustrates the production of the desired ethyne-linked dyad (Dyad 1) along with a butadiyne-linked dyad by treatment of triple-decker (Pc)Eu(Pc)Eu(IET-Por) with (Pc)Eu(Pc)Eu(E'T-Por) under Pd-mediated coupling conditions $(Pd(PPh_3)_2Cl_2$, CuI).
Figure 24A:
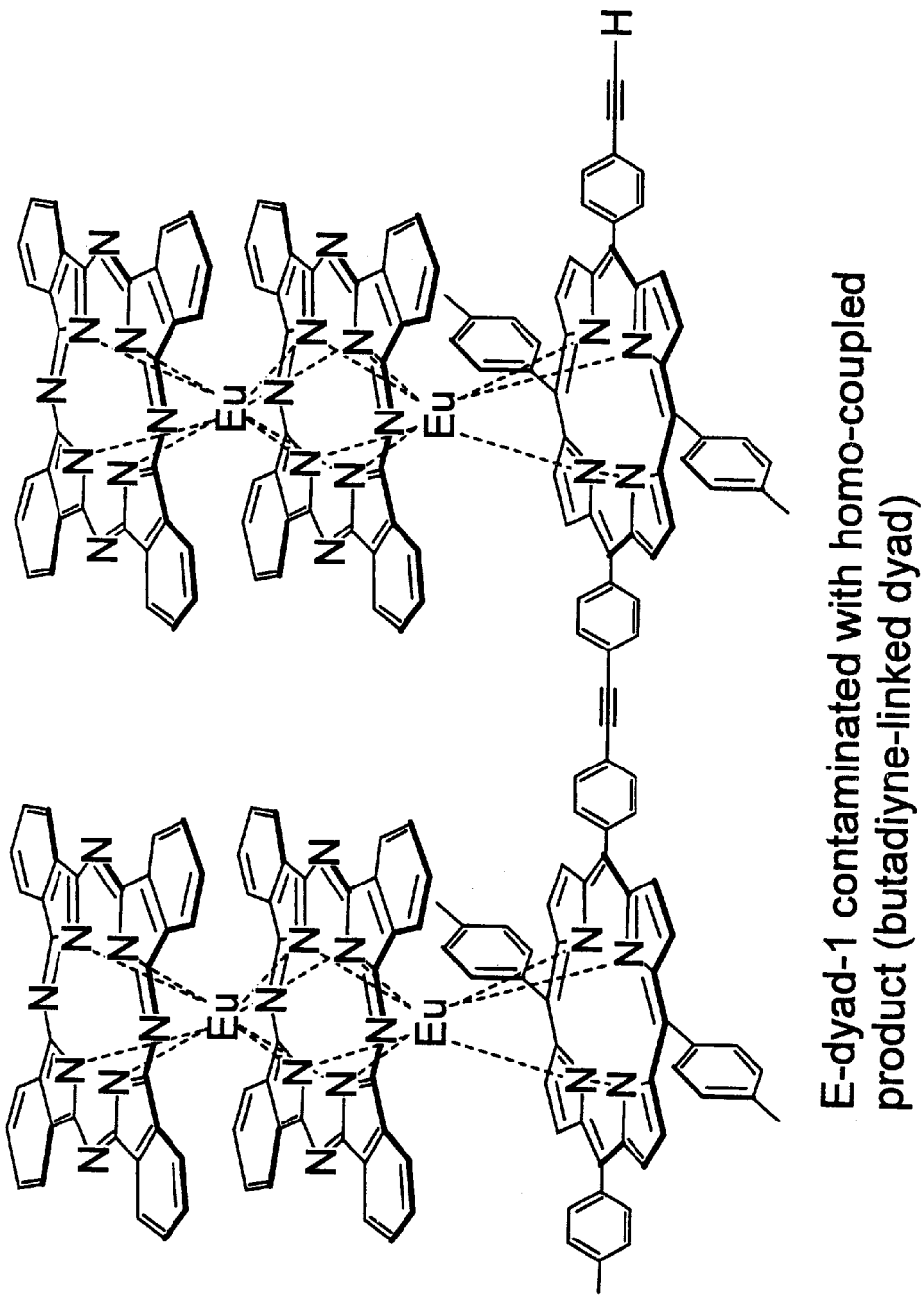
Figure 24A:
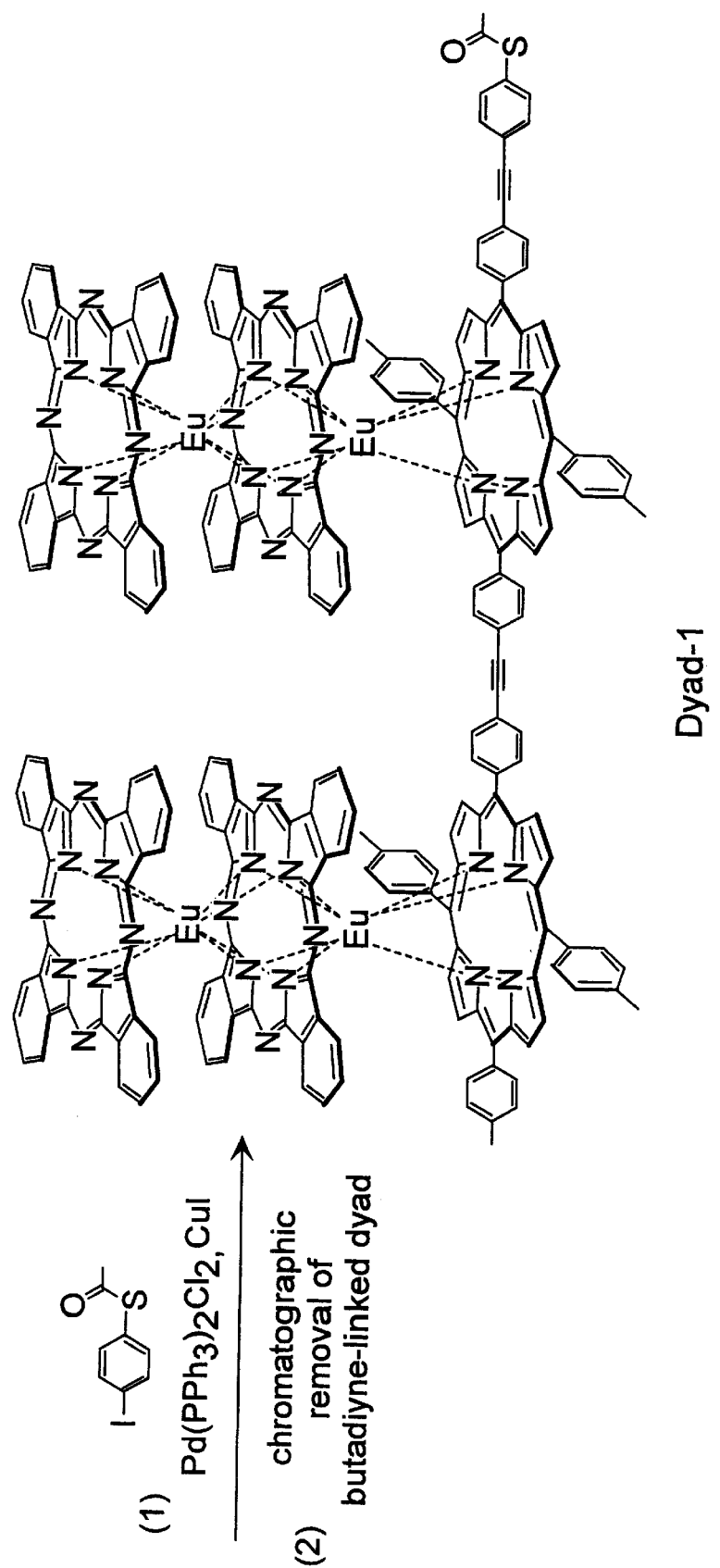

Treatment of triple-decker (Pc)Eu(Pc)Eu(IET-Por) with (Pc)Eu(Pc)Eu(E'T-Por) under Pd-mediated coupling conditions (Pd(PPh$_3$)$_2$Cl$_2$, CuI) afforded the desired ethyne-linked dyad along with a butadiyne-linked dyad (FIG. 24A). The two dyads were easily separated from the other components of the reaction mixture by SEC, however, all attempts to separate the ethyne-linked dyad from the butadiyne-linked dyad were unsuccessful. The mixture of dyads was then treated with K$_2$CO$_3$ to cleave the trimethylsilyl group. The subsequent coupling with 4-iodo-1-(S-acetylthio)benzene afforded the corresponding mixture of the S-acetylthio derivatized dyads. At this stage, the butadiyne-linked dyad resulting from the first coupling reaction was successfully removed. The ethyne-linked dyad was obtained in 3.8% yield. It is interesting that no homo-coupled dyad was obtained in the reaction with 4-iodo-1-(S-acetylthio) benzene; this may be due to the faster reaction of the ethynyl dyad with 4-iodo-1-(S-acetylthio)benzene compared with the dimerization of ethynyl dyads.

Figure 24B:
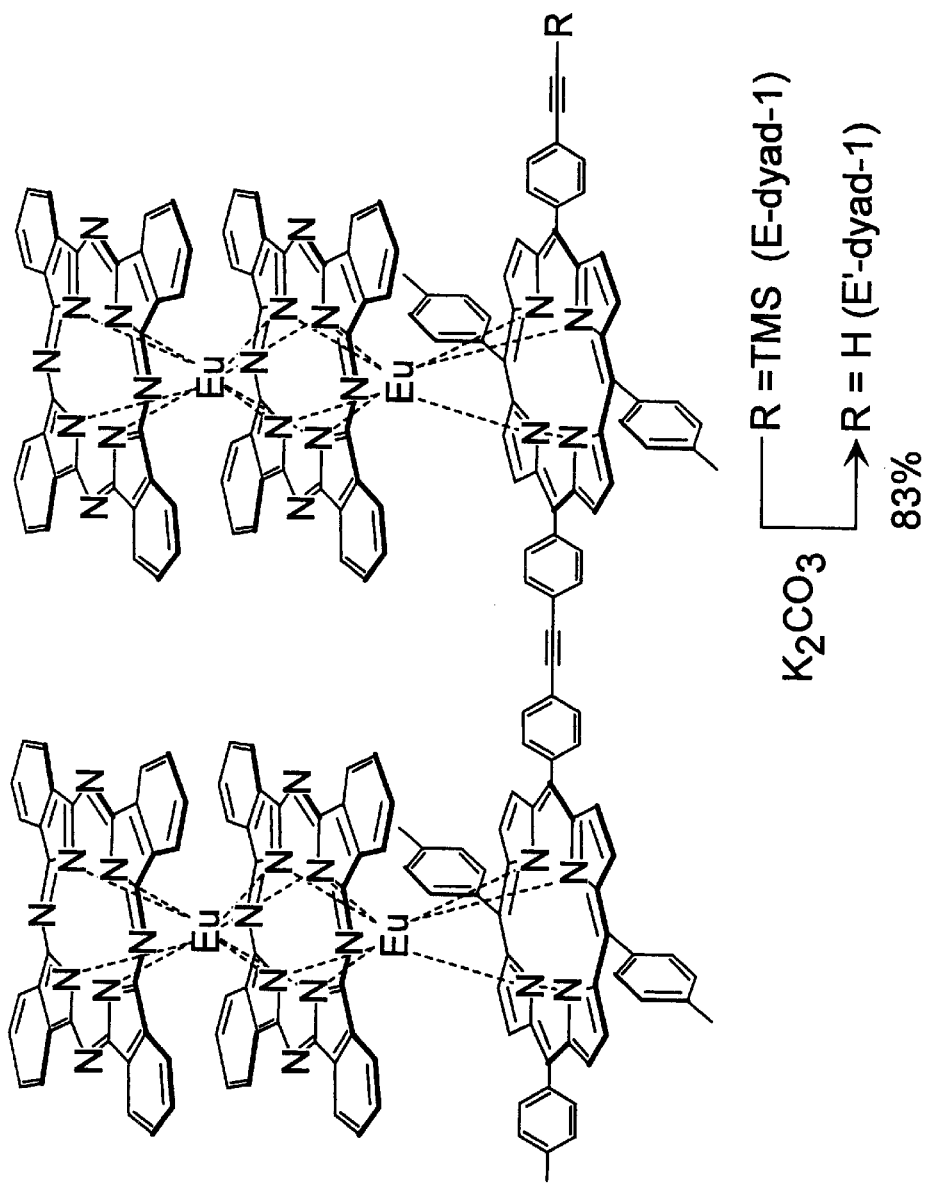
FIG. 24B illustrates the selective production of the desired ethyne-linked dyad (Dyad 1) by treatment of triple-decker (Pc)Eu(Pc)Eu(IET-Por) with (Pc)Eu(Pc)Eu(E'T-Por) under Pd-mediated coupling conditions $(Pd_2(dba)_3$ and P(o-tolyl)$_3$ in the absence of copper reagents).

However, in order to avoid the self-coupling of (Pc)Eu (Pc)Eu(E'T-Por), the alternative copper-free coupling conditions (Pd$_2$(dba)$_3$, P(o-tol)$_3$, no copper) were employed to prepare the ethyne-linked dyad (E-dyad-1) (FIG. 24B). We previously prepared a series of multiporphyrin arrays under these copper-free Pd-mediated coupling conditions and no self-coupling products were observed (R. Wagner et al, Chem. Mater. 1999, 10, 2974–2983; R. Wagner et al, J. Am. Chem. Soc. 1996, 118, 11166–11180). Thus, treatment of (Pc)Eu(Pc)Eu(IET-Por) with (Pc)Eu(Pc)Eu(E'T-Por) under the copper-free Pd-mediated conditions afforded the desired ethyne-linked dyad (E-dyad-1) in 44% yield, and no butadiyne-linked dyad was detected. Treatment of E-dyad-1 with K$_2$CO$_3$ afforded E'-dyad-1 in 83% yield. The subsequent coupling (Pd(PPh$_3$)$_2$Cl$_2$, CuI) with 1-(S-acetylthio)-4-iodobenzene afforded a mixture containing the S-acetylthio-derivatized dyad (Dyad-1), the acetylation product of E'-dyad-1 as well as a trace of self-coupling products derived from E'-dyad-1. One adsorption column (removal of the acetylation product) followed by one SEC column (removal of the butadiyne-linked self-coupling byproduct) afforded pure Dyad-1 in 22% yield.

Figure 25:
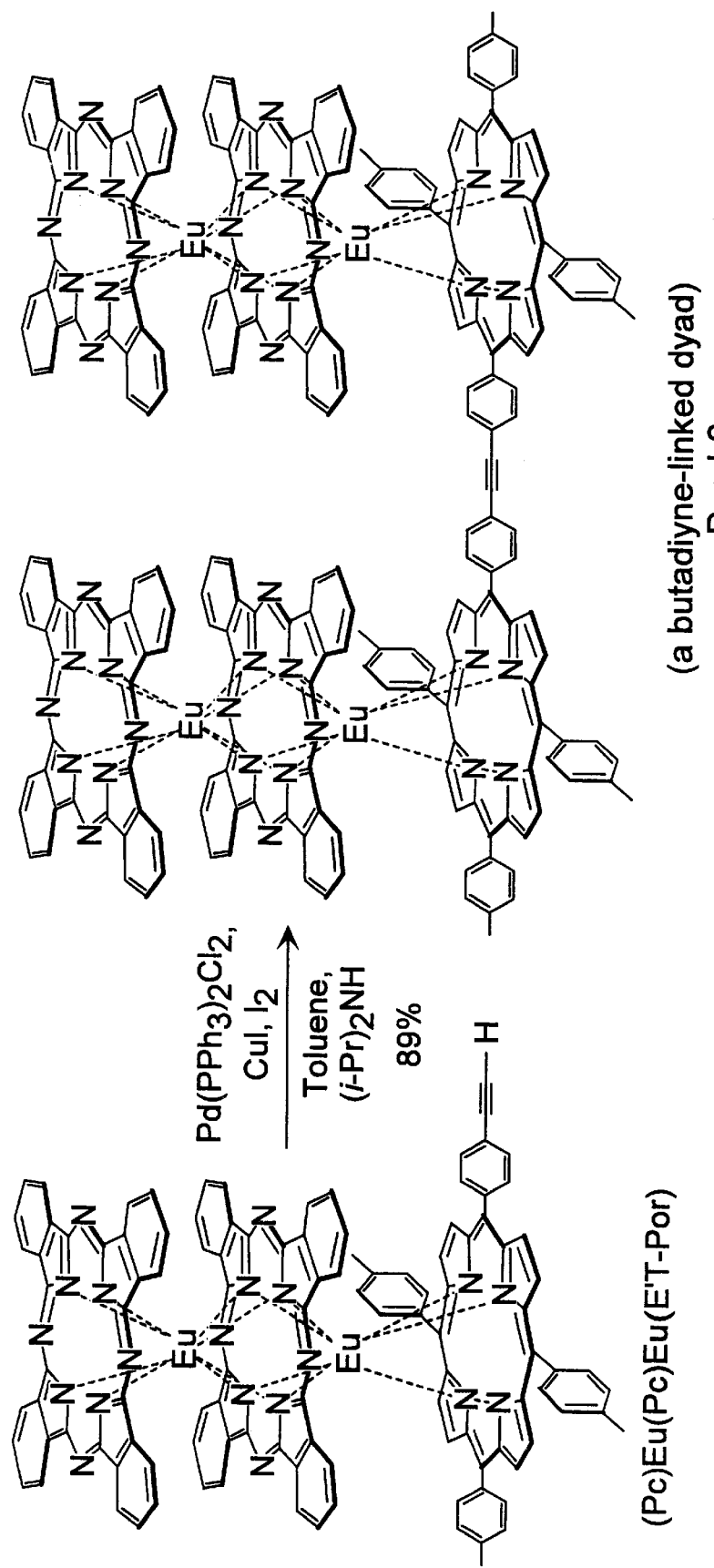
FIG. 25 illustrates the selective production of the desired butadiyne-linked dyad (Dyad 2) by treatment of triple-decker (Pc)Eu(Pc)Eu(E'T-Por) under Pd-mediated Glaser coupling conditions $(Pd(PPh_3)_2Cl_2$, $CuI_2)$.

Glaser Coupling to Yield a Butadiyne-linked Dyad. We sought to prepare a butadiyne-linked dimer (Dyad-2) in order to (1) investigate the feasibility of performing a Glaser coupling using ethynyl triple deckers, and (2) investigate the solution electrochemistry of a dimer of triple deckers. For the preparation of symmetrical diynes, a modified Eglinton-Glaser coupling (in the presence of CuCl/CuCl$_2$) has found increasing application (D. O'Krongly et al., J. Am. Chem. Soc. 1985, 107, 5544–5545). However, treatment of E'-dyad-1 with CuCl/CuCl$_2$ in DMF in the absence or presence of an amine at room temperature only gave a trace of the product even after 24 h. The Pd(II)—Cu(I) catalyzed self-coupling of terminal alkynes in the presence of iodine was introduced which gives good to excellent yields with a broad range of terminal alkynes (Q. Liu and D. Burton, Tetrahedron Lett. 1997, 38, 4371–4374). Thus, treatment of E'-dyad-1 with Pd(PPh$_3$)$_2$Cl$_2$ and CuI in the presence of 0.5 mole equiv (per mol of E-d y ad-1) of iodine in toluene/N, N-diisopropylamine (5:1) gave the desired Dyad-2 in 89% yield (FIG. 25). The reaction was clean and the product was easily separated by a single adsorption column followed by one SEC column.

Characterization of Porphyrin-phthalocyanine Mixed Triple-decker Complexes. Each triple-decker complex was characterized by LD-MS, UV-Vis and $^1$H NMR spectroscopy. The UV-Vis spectra of the triple-decker complexes of general structure (Pc)Eu(Por)Eu(Por) resemble those of analogous triple-deckers (Jiang, J. et al., Inorg. Chim. Acta 1997, 255, 59–64; Jiang, J. et al., Inorg. Chim. Acta 1998, 268, 49–53). The absorption at 341–354 nm and 415–420 nm can be attributed to the phthalocyanine and porphyrin Soret bands, respectively. The remaining absorption bands in the visible region were mainly attributed to the Q bands of the phthalocyanines. In moving from (Por)Eu(Pc)Eu(Por) to (Pc)Eu(Pc)Eu(Por), the ratio of Por to Pc decreases from 2 to ½, and the absorption intensity contributed by the porphyrins also decreased correspondingly. However, the spectra of the complexes are not simply the sum of the resulting components. For example, in each of the two kinds of above complexes, the absorption at 341–354 nm remains the strongest owing to the interactions between the macrocycles. On the other hand, the triple-deckers (Pc)Eu(Por)Eu (Pc) have the same composition as (Pc)Eu(Pc)Eu(Por) but display different absorption spectra, indicating different interaction between the macrocycles with respect to the different structure. The absorption spectra of (Pc)Eu(Por)Eu (Pc) are in agreement with those reported for the same kind of cerium(III) triple-decker complexes (Chabach, D. et al, New J. Chem. 1992, 16, 431–433).

LD-MS has been found to be very effective for identifying the composition of mixed porpyrin-phthalocyanine sandwich complexes. Spectra were collected without the traditional aid of matrices. In most cases, the triple-deckers (Por)Eu(Pc)Eu(Por) and (Pc)Eu(Por)Eu(Pc) display only the molecular ion peak. In contrast, the triple-decker complexes such as (Pc)Eu(Pc)Eu(Por) exhibit a parent molecular ion peak and two additional fragment peaks corresponding to [(Pc)Eu(Pc)]$^-$ and [Eu(Por)]$^+$.

The $^1$H NMR spectra of all the triple-decker complexes recorded in CDCl$_3$ gave moderately resolved spectra leading to valuable structural information. The resonance patterns of the triple-deckers (Por)Eu(Pc)Eu(Por) are in accord with those of the same type of compounds reported by Jiang et al., supra. The α and β protons of the phthalocyanine sandwiched between the two porphyrins showed highly deshielded broad signals in the regions δ 12.73–12.75 and 10.65–10.67 ppm. The number of signals stemming from the phenyl groups of the porphyrins indicates that there is restricted rotation about the C(meso)-C(phenyl) bond. These results along with the integration are consistent with the triple-decker structure (Por)Eu(Pc)Eu(Por) in which two paramagnetic metal centers are sandwiched between two outer porphyrin and one inner phthalocyanine macrocycles.

The $^1$H NMR data of (Pc)Eu(Pc)Eu(Por) are consistent with the unsymmetrical layered structure of this kind of triple-decker complex. Four broad resonances at δ 12.95–12.98, 11.06–11.11, 10.10–10.13 and 8.72–8.75 ppm of comparable intensity result from the α and β protons of the two unequivalent phthalocyanines (one inner, one outer). The unsymmetrical structure was further supported by the LD-MS spectra, in which two strong peaks assigned to [(Pc)Eu(Pc)]$^+$ and [Eu(Por)]$^+$ were also observed in addition to the molecular ion peaks. This arrangement of macrocycles is in accord with the structure reported for most of the porphyrin-phthalocyanine triple-deckers containing two phthalocyanines and one porphyrin (Moussavi, M. et al., *Inorg. Chem.* 1986, 25, 2107–2108; Jiang et al., supra).

In contrast, the $^1$H NMR spectra of triple-deckers of general structure (Pc)Eu(Por)Eu(Pc) revealed only two peaks at 9.59–9.71 and 8.05–8.22 ppm with the same intensity assigned to the α and β protons of the phthalocyanines, suggesting the symmetrical structure of the complexes.

All the porphyrin-phthalocyanine sandwich compounds prepared are stable under the conditions described for synthesis and routine handling. Furthermore, in contrast to the poor solubility of phthalocyanines, the porphyrin-phthalocyanine sandwich complexes display satisfactory solubility in common organic solvents such as toluene, chloroform and THF. The improved solubility is ascribed to the layered structure and non-planar geometry of the end ligands in the triple deckers, which suppresses aggregation.

Experimental Section

General. $^1$H NMR spectra (300 MHz) and absorption spectra (HP 8451 A, Cary 3) were collected routinely. Porphyrin-phthalocyanine sandwich complexes were analyzed by laser desorption (LD-MS) mass spectrometry (Bruker Proflex II) and high resolution fast atom bombardment (FAB) on a JEOL (Tokyo, Japan) HX 110HF mass spectrometer. Commercial sources provided dilithium phthalocyanine (Aldrich), Eu(acac)$_3$nH$_2$O (Alfa Aesar) and Pd(PPh$_3$)$_2$Cl$_2$ (Aldrich). Unless otherwise indicated, all other reagents were obtained from Aldrich Chemical Company, and all solvents were obtained from Fisher Scientific. 5-(4-iodophenyl)-15-phenyl-10,20-di(p-tolyl) porphyrin (IPT-Por), 5,10,15-tris[(4-tert-butyl)phenyl]-20-[4-(2-(trimethylsilyl)ethynyl)phenyl]porphyrin (EB-Por), 5-(4-iodophenyl)-15-[4-(2-(trimethylsilyl)ethynyl)phenyl]-10,20-di(p-tolyl)porphyrin (IET-Por), and 5,10,15-tri(p-tolyl)-20-[4-(2-(trimethylsilyl)ethynyl)phenyl]porphyrin (ET-Por) were prepared by a rational synthetic method (Cho et al., 1999, *J. Org. Chem.* 64, 7890–7901).

Chromatography. Adsorption column chromatography was performed using flash silica gel (Baker, 60–200 mesh). Preparative-scale size exclusion chromatography (SEC) was performed using BioRad Bio-beads SX-1. A preparative-scale glass column (4.8×60 cm) was packed using Bio-beads SX-1 in THF and eluted with gravity flow. Following purification, the SEC column was washed with two volume equivalents of THF.

Solvents. All solvents were dried by standard methods prior to use. CH$_2$Cl$_2$ (Fisher, reagent grade) and CHCl$_3$ (Fisher, certified ACS grade, stabilized with 0.75% ethanol) were distilled from K$_2$CO$_3$. THF (Fisher, certified ACS) was distilled from sodium, and triethylamine (Fluka, puriss) was distilled from CaH$_2$. Pyrrole (Acros) was distilled at atmospheric pressure from CaH$_2$. All other solvents were used as received.

Preparation of Triple Deckers Upon Reaction of IPT-Por. A mixture of 5-(4-iodophenyl)-15-phenyl-10,20-di(p-tolyl) porphyrin (154 mg, 0.2 mmol) and Eu(acac)$_3$nH$_2$O (301 mg, 0.6 mmol) in 1,2,4-trichlorobenzene (40 mL) was heated to reflux and stirred under argon for 4 h. The resulting cherry-red solution was cooled to rt, then Li$_2$Pc (160 mg, 0.3 mmol) was added. The mixture was refluxed for an additional 5 h. then the volatile components were removed under vacuum. The residue was dissolved in CHCl$_3$ and loaded onto a silica gel column packed with the same solvent. Elution with CHCl$_3$ afforded four bands. The first band (olive-brown) contained mainly the triple-decker complex (IPT-Por)Eu(Pc)Eu(IPT-Por) and unreacted porphyrin starting material. The second band (red) contained mainly porphyrin starting material and traces of the double-decker complex (Pc)Eu(IPT-Por). The third band (black) contained the triple-decker complex (Pc)Eu(IPT-Por)Eu(Pc). The last band (green) contained the triple-decker complex (Pc)Eu(Pc)Eu(IPT-Por) and double-decker complex (Pc)Eu(Pc).

The first band collected was redissolved in THF and loaded onto a SEC column. Elution with the same solvent afforded (IPT-Por)Eu(Pc)Eu(IPT-Por) as the first band (greenish-brown), which after removal of the solvent and washing with CH$_3$OH afforded a greenish-black solid (40 mg, 17%). $^1$H NMR (CDCl$_3$) δ 2.96 (s, 12H), 3.91–3.95 (m, 16H), 4.63–4.86 (m, 8H), 6.56 (m, 4H), 6.76 (m, 2H), 7.09, 7.11 (m, 2H), 8.10 (m, 2H), 8.88 (m, 4H), 9.13 (m, 2H), 9.49 (m, 2H), 10.65 (bs, 8H), 11.67 (bs, 4H), 11.91 (bs, 2H), 12.73 (bs, 8H); LD-MS calcd av mass for C$_{124}$H$_{78}$I$_2$N$_{16}$Eu$_2$ 2349.8, obsd 2355.1; $\lambda_{abs}$ 355, 420, 491, 606, 657 nm.

The third band collected was also redissolved in THF and loaded onto a SEC column. Elution with THF afforded (Pc)Eu(IPT-Por)Eu(Pc) as the second band (black), which after removal of the solvent and washing with CH$_3$OH afforded a black solid (4 mg, 1%). $^1$H NMR (CDCl$_3$) δ 4.13 (s, 6H), 8.08 (bs, 16H), 8.35 (s, 1H), 9.58 (bs, 16H), 9.91 (bs, 5H), 10.11 (m, 2H), 10.47 (m, 2H), 11.96 (bs, 8H), 13.90–14.09 (m, 7H); LD-MS calcd av mass for C$_{110}$H$_{63}$IN$_{20}$Eu$_2$ 2095.7, obsd 2098.1; $\lambda_{abs}$ 343, 444, 517, 626, 652 nm.

The last band (green) collected was redissolved in toluene and loaded onto a short silica gel column packed with the same solvent. Elution with toluene afforded the first band (greenish-blue) containing (Pc)Eu(Pc)Eu(IPT-Por), which after removal of the solvent and washing with CH$_3$OH afforded a green solid (59 mg, 14%). $^1$H NMR (CDCl$_3$) δ 2.98 (s, 6H), 3.18, 3.22 (m, 8H), 4.72–4.92 (m, 4H), 6.55 (d, J=7.2 Hz, 2H), 6.75 (t, J=7.2 Hz, 1H), 7.12 (d, J=7.5 Hz, 1H), 8.14 (m, 1H), 8.73 (bs, 8H), 9.08 (m, 2H), 9.29 (m, 1H), 9.68 (m, 1H), 10.11 (bs, 8H), 11.08 (bs, 8H), 12.19 (bs, 1H), 12.40 (m, 1H), 12.96 (bs, 8H); LD-MS calcd av mass for C$_{110}$H$_{63}$IN$_{20}$Eu$_2$ 2095.7, obsd 2098.8 (M$^+$), 1177.8 [M$^+$-(IPT-Por)Eu], 919.3 (M$^+$)-(Pc)Eu(Pc)); $\lambda_{abs}$ 342, 414, 522, 617, 721 nm.

Preparation of triple deckers upon reaction of EB-Por. A mixture of 5,10,15-tris[4-(tert-butyl)phenyl]-20-[4-(2-(trimpethylsilyl)ethynyl)phenyl]porphyrin (88 mg, 0.10 mmol) and Eu(acac)$_3$nH$_2$O (150 mg, 0.3 mmol) in 1,2,4-trichlorobenzene (20 mL) was heated to reflux and stirred under argon for 4 h. The resulting cherry-red solution was cooled to rt, then Li$_2$Pc (80 mg, 0.15 mmol) was added. The mixture was refluxed for an additional 5 h, then the solvents were removed under vacuum. The residue was dissolved in CHCl$_3$, and loaded onto a silica gel column packed with the same solvent. Elution with CHCl$_3$ afforded four bands. The first band (olive-brown) contained mainly the triple-decker complex (EB-Por)Eu(Pc)Eu(EB-Por) and unreacted porphyrin starting material. The second band (red) contained mainly porphyrin starting material and a trace of double-decker complex (Pc)Eu(EB-Por). The third band (black) contained triple-decker complex (Pc)Eu(EB-Por)Eu(Pc). The last band (green) contained triple-decker complex (Pc)Eu(Pc)Eu(EB-Por) and double-decker complex (Pc)Eu(Pc).

The first band collected was redissolved in THF and loaded onto a SEC column. Elution with the same solvent afforded (EB-Por)Eu(Pc)Eu(EB-Por) as the first band (greenish-brown), which after removal of the solvent and washing with CH$_3$OH afforded a greenish-black solid (34 mg, 26%). $^1$H NMR (CDCl$_3$) δ 0.62 (s, 18H), 1.89 (s, 54H), 3.83–4.03 (m, 16H), 4.76 (m, 9H), 6.71 (m, 6H), 6.84 (m, 2H), 9.00 (bs, 6H), 9.19 (m, 2H), 10.65 (bs, 8H), 11.46–11.60 (m, 8H), 12.73 (bs, 8H); 1LD-MS calcd av mass for C$_{154}$H$_{136}$N$_{16}$Si$_2$Eu$_2$ 2571.0, obsd 2574.1; λ$_{abs}$ 355, 421, 493, 559, 606 mm.

The third band collected was also redissolved in THF and loaded onto a SEC column. Elution with THF afforded (Pc)Eu(EB-Por)Eu(Pc) as the second band (black), which after removal of the solvent and washing with CH$_3$OH afforded a black solid (3.5 mg, 1.6%). $^1$H NMR (CDCl$_3$) δ 0.85 (s, 18H), 2.89, 2.94 (m, 26H), 8.05 (bs, 16H), 9.59 (bs, 16H), 9.99 (m, 2H), 10.10 (m, 4H), 11.98–12.20 (m, 4H), 13.52 (m, 2H), 13.68 (m, 4H); LD-MS calcd av mass for C$_{125}$H$_{94}$N$_{20}$SiEu$_2$ 2206.2, obsd 2209.1; λ$_{abs}$ 343, 416, 519, 625, 653 nm.

The last band (green) collected was redissolved in toluene and loaded onto a short silica gel column packed with the same solvent. Elution with toluene afforded the first band (greenish-blue) (Pc)Eu(Pc)Eu(EB-Por), which after removal of the solvent and washing with CH$_3$OH afforded a green solid (20 mg, 9.1%). $^1$H NMR (CDCl$_3$) δ 0.68 (s, 9H), 1.86 (m, 27H), 3.20–3.29 (m, 8H), 4.71–4.91 (m, 4H), 6.67 (m, 3H), 6.91 (m, 1H), 8.72 (bs, 8H), 9.08–9.16 (m, 3H), 9.41 (m, 1H), 10.10 (bs, 8H), 11.10 (bs, 8H), 11.69 (m, 2H), 11.88 (m, 1H), 12.16 (m, 1H), 12.97 (bs, 8H); LD-MS calcd av mass for C$_{125}$H$_{92}$N$_{20}$SiEu$_2$ 2206.2, obsd 2117.1 (M$^+$), 1181.4 [M$^+$-(EB-Por)Eu], 919.3 (M$^+$)-(Pc)Eu(Pc)); λ$_{abs}$ 342, 417, 522, 552, 618, 721 nm.

Preparation of Triple Deckers Upon Reaction of IET-Por. A mixture of 5-(4-iodophenyl)-15-[4-(2-(trimethylsilyl)ethynyl)phenyl]-10,20-di(p-tolyl)porphyrin(261 mg, 0.30 mmol) and Eu(acac)$_3$ nH$_2$O (450 mg, 0.9 mmol) in 1,2,4-trichlorobenzene (60 mL) was heated to reflux and stirred under argon for 4 h. The resulting cherry-red solution was cooled to rt, then Li$_2$Pc (240 mg, 0.45 mmol) was added. The mixture was refluxed for an additional 5 h, then the solvents were removed under vacuum. The residue was dissolved in CHCl$_3$ and loaded onto a silica gel column packed with the same solvent. Elution with CHCl$_3$ afforded four bands. The first band (olive-brown) contained mainly the triple-decker complex (IET-Por)Eu(Pc)Eu(IET-Por) and unreacted porphyrin starting material. The second band (red) contained mainly porphyrin starting material and trace amount of double-decker complex (Pc)Eu(IET-Por). The third band (black) contained triple-decker complex (Pc)Eu(IET-Por)Eu(Pc). The last band (green) contained triple-decker complex (Pc)Eu(Pc)Eu(IET-Por) and double-decker complex (Pc)Eu(Pc).

The first band collected was redissolved in THF and loaded onto a SEC column. Elution with the same solvent afforded (IET-Por)Eu(Pc)Eu(IET-Por) as the first band (greenish-brown), which after removal of the solvent and washing with CH$_3$OH afforded a greenish-black solid (72 mg, 19%). $^1$H NMR (CDCl$_3$) δ 0.64 (s, 18H), 2.98 (s, 12H), 3.91 (m, 16H), 4.66–4.74 (m, 6H), 4.84,4.86 (m, 2H), 6.58 (d, J=5.7 Hz, 4H), 6.92 (d, J=5.7 Hz, 2H), 7.15 (m, 2H), 8.97 (d, J=5.7 Hz, 4H), 9.36 (d, J=5.1 Hz, 2H), 9.58 (d, J=5.1 Hz, 2H), 10.67 (bs, 8H), 11.85 (m, 6H), 12.08 (m, 2H), 12.76 (bs, 8H); LD-MS calcd av mass for C$_{134}$H$_{94}$N$_{16}$I$_2$Si$_2$Eu$_2$ 2542.2, obsd 2547.5; λ$_{abs}$ 356, 421, 493, 606 nm.

The third band collected was also redissolved in THF and loaded onto a SEC column. Elution with THF afforded (Pc)Fu(IET-Por)Eu(Pc) as the second band (black), which after removal of the solvent and washing with CH$_3$OH afforded a black solid (10 mg, 1.5%). $^1$H NMR (CDCl$_3$) δ 1.16 (s, 9H), 4.15 (s, 6H), 7.21 (s, 4H), 8.22 (bs, 16H), 9.71 (bs, 16H), 9.94 (bs, 4H), 10.26 (m, 2H), 10.46 (m, 2H), 11.97 (m, 6H), 13.94–14.14 (m, 6H); LD-MS calcd av mass for C$_{115}$H$_{71}$N$_{20}$ISiEu$_2$ 2191.8, obsd 2192.5; λ$_{abs}$ 341, 444, 517, 628, 656, 796 nm.

The last band (green) collected was redissolved in toluene and loaded onto a short silica gel column packed with the same solvent. Elution with toluene afforded the first band (greenish-blue) containing (Pc)Eu(Pc)Eu(IET-Por), which after removal of the solvent and washing with CH$_3$OH afforded a green solid (65 mg, 9.9%). $^1$H NMR (CDCl$_3$) δ 0.69 (s, 9H), 1.60 (s, 6H), 3.01–3.20 (m, 8H), 4.78 (m, 4H), 5.01 (m, 1H), 6.56 (m, 2H), 6.95 (m, 2H), 8.75 (bs, 8H), 9.12 (m, 2H), 9.57 (m, 1H), 9.76 (m, 1H), 10.12 (bs, 8H), 11.11 (bs, 8H), 12.29–12.42 (m, 2H), 12.66 (m, 1H), 12.98 (bs, 8H); LD-MS calcd av mass for Cl$_{115}$H$_{71}$N$_{20}$ISiEu$_2$ 2191.8, obsd 2195.1 (M$^+$). 1181.4 [M$^+$-(IET-Por)Eu], 919.3 (M$^+$-(Pc)Eu(Pc)); λ$_{abs}$ 342, 417, 522, 552, 618, 721 nm.

Preparation of Triple Deckers Upon Reaction of ET-Por. A mixture of 5,10,15-tri(p-tolyl)-20-[4-(2-(trimethylsilyl)ethynyl)phenyl]porphyrin (140 mg, 0.19 mmol) and Eu(acac)$_3$ nH$_2$O (280 mg, 0.57 mmol) in 1,2,4-trichlorobenzene (35 mL) was heated to reflux and stirred under argon for 4 h. The resulting cherry-red solution was cooled to rt, then Li$_2$Pc (220 mg, 0.29 mmol) was added. The mixture was refluxed for an additional 5 h, then the solvents were removed under vacuum. The residue was dissolved in CHCl$_3$ and loaded onto a silica gel column packed with the same solvent. Elution with CHCl$_3$ afforded four bands. The first band (olive-brown) contained mainly (ET-Por)Eu(Pc)Eu(ET-Por) and unreacted porphyrin starting material. The second band (red) contained mainly porphyrin starting material and traces of double-decker complex (Pc)Eu(ET-Por). The third band (black) contained triple-decker complex (Pc)Eu(ET-Por)Eu(Pc). The last band (green) contained triple-decker complex (Pc)Eu(Pc)Eu(ET-Por) and double-decker complex (Pc)Eu(Pc).

The first band collected was redissolved in THF and loaded onto a SEC column. Elution with THF afforded (ET-Por)Fu(Pc)Eu(ET-Por) as the first band (greenish-brown), which after removal of the solvent and washing with CH$_3$OH afforded a greenish-black solid (21 mg, 9.5%). $^1$H NMR (CDCl$_3$) δ 0.64 (s, 18H), 2.99 (s, 18H), 3.86–3.96 (m, 16H), 4.77–4.89 (m, 8H), 6.58 (bs, 6H), 6.92 (m, 2H), 8.97 (bs, 6H), 9.35 (bs, 2H), 10.65 (bs, 8H), 11.90–12.08 (m, 8H), 12.75 (bs, 8H); LD-MS calcd av mass for C$_{136}$H$_{100}$N$_{16}$Si$_2$Eu$_2$ 2318.5, obsd 2321.9; λ$_{abs}$ 355, 420, 491, 606, 657 nm.

The third band collected was also redissolved in THF and loaded onto a SEC column. Elution with THF afforded (Pc)Eu(ET-Por)Eu(Pc) as the second band (black), which after removal of the solvent and washing with CH$_3$OH afforded a black solid (2 mg, 0.5%). $^1$H NMR (CDCl$_3$) δ 1.10 (s, 9H), 4.17 (s, 9H), 8.11 (bs, 16H), 9.62 (bs, 16H), 9.92 (m, 7H), 10.26 (m, 2H), 11.92–11.99 (m, 8H), 13.95–14.50 (m, 7H); LD-MS calcd av mass for C$_{116}$H$_{74}$N$_{20}$SiEu$_2$ 2080.0, obsd 2083.7; λ$_{abs}$ 341, 444, 517, 628, 656, 796 nm.

The last band (green) collected was redissolved in toluene and loaded onto a short silica gel column packed with the same solvent. Elution with toluene afforded the first band (greenish-blue) containing (Pc)Eu(Pc)Eu(ET-Por), which after removal of the solvent and washing with CH$_3$OH afforded a green solid (36 mg, 9.1%). $^1$H NMR (CDCl$_3$) δ 0.69 (s, 9H), 3.00 (m, 9H), 3.15 (m, 8H), 4.83 (d, J=7.2 Hz, 2H), 4.89 (d, J=7.2 Hz, 1H), 5.03 (d, J=7.2 Hz, 1H), 6.56 (t, J=7.2 Hz, 3H), 6.96 (d, J=7.2 Hz, 1H), 8.74 (bs, 8H), 9.11 (m, 3H), 9.53, 9.55 (m, 1H), 10.13 (bs, 8H), 11.06 (bs, 8H), 12.30–12.42 (m, 3H), 12.62 (m, 1H), 12.95 (bs, 8H); LD-MS calcd av mass for C$_{116}$H$_{74}$N$_{20}$SiEu$_2$ 2080.0, obsd 2083.2 (M$^+$), 178.3 [M$^+$-(ET-Por)Eu], 903.1 (M$^+$-(Pc)Eu (Pc)); λ$_{abs}$ 342, 417, 522, 552, 618, 721 nm.

Formation of (Pc)Eu(Pc)Eu(E'T-Por). A sample of (Pc)Eu(Pc)Eu(ET-Por) (33 mg, 0.016 mmol) was dissolved in CHCl$_3$/CH$_3$OH (6 mL, 3:1). K$_2$CO$_3$ (20 mg, 0.14 mmol) was added, and the reaction mixture was stirred at rt under argon with occasional monitoring by $^1$H NMR spectroscopy. Upon completion, CHCl$_3$ (30 mL) was added to the reaction mixture, and the resulting mixture was washed with NaHCO$_3$ (10%, 2×30 mL), H$_2$O (30 mL), dried (Na$_2$SO$_4$), filtered, and rotary evaporated to dryness. Column chromatography (silica, CHCl$_3$) afforded a black solid (31 mg, 97%). $^1$H NMR (CDCl$_3$) δ 3.03 (m, 9H), 3.17, 3.24 (m, 8H), 3.72 (s, 1H), 4.83 (m, 3H), 5.00 (d, J=8.1 Hz, 1H), 6.56 (m, 3H), 6.96 (d, J=7.2 Hz, 1H), 8.77 (bs, 8H), 9.13 (m, 3H), 9.53, 9.55 (m, 1H), 10.18 (bs, 8H), 11.14 (bs, 8H), 12.22–12.32 (m, 3H), 12.50 (m, 1H), 13.03 (bs, 8H); LD-MS calcd av mass for C$_{113}$H$_{66}$N$_{20}$Eu$_2$ 2007.8, obsd 2008.6 (M$^+$), 1177.4 [M$^+$-(E'T-Por)Eu], 831.0 (M$^+$-(Pc)Eu (Pc)); λ$_{abs}$ 342, 416, 521, 618, 721 nm.

Formation of (Pc)Eu(Pc)Eu(E'B-Por). A sample of (Pc)Eu(Pc)Eu(EB-Por) (20 mg, 0.0091 mmol) was treated with K$_2$CO$_3$ and worked-up following the same procedure as for (Pc)Eu(Pc)Eu(E'T-Por). Column chromatography (silica, CHCl$_3$) afforded a black solid (18 mg, 94%). $^1$H NMR (CDCl$_3$) δ 1.95, 1.97 (m, 27H), 3.30–3.38 (m, 8H), 3.71 (s, 1H), 4.77 (d, J=7.2 Hz, 3H), 5.00 (d, J=6.6, 1H), 6.70 (m, 3H), 6.95 (d, J=7.2 Hz, 1H), 8.76 (bs, 8H), 9.09–9.16 (m, 3H), 9.39, 9.41 (m, 1H), 10.16(bs, 8H), 11.17(bs, 8H), 11.56(m, 2H), 11.73(m, 1H), 12.00(m, 1H), 13.04 (bs, 8H); LD-MS calcd av mass for C$_{122}$H$_{84}$N$_{20}$Eu$_2$ 2134.1, obsd 2136.5 (M$^+$); λ$_{abs}$ 343, 415, 522, 552, 618, 722 mm.

S-acetylthio-derivatized Triple Decker (1). Samples of (Pc)Eu(Pc)Eu(IPT-Por) (30 mg, 14 μmol), 4-ethynyl-1-(S-acetylthio)benzene (20 mg, 0.11 mmol), Pd(PPh$_3$)$_2$Cl$_2$ (1.5 mg, 2.1 μmol) and CuI (0.19 mg, 1.0 μmol) were added to a 25 mL Schienk flask. The flask was evacuated and purged with argon three times. Then deaerated THF (5 mL) and deaerated N,N-diisopropylethylamine (1 mL) were added by syringe. The flask was immersed in an oil bath at 30 C and stirred under argon. The reaction was monitored by TLC (silica, toluene) and LD-MS. After 20 h, the solvent was removed under vacuum, the residue dissolved in toluene/CHCl$_3$ (1:1), and loaded onto a silica gel column packed with the same solvent. Elution with toluene/CHCl$_3$ (1:1) afforded unreacted starting material and a deep green second band, which contained the desired product and also a minor amount of the starting material. The product thus obtained was further purified by a second column chromatography procedure (silica gel, toluene), affording a black solid (15 mg, 50%) after removal of the solvent and washing with CH$_3$OH, $^1$H NMR (CDCl$_3$) δ 2.62 (s, 3H), 2.99 (s, 6H), 3.20 (bs, 8H), 4.82 (d, J=7.5 Hz, 2H), 4.96 (d, J=6.6 Hz, 1H), 5.05 (d, J=6.0 Hz, 1H), 6.56 (d, J=7.5 Hz, 2H), 6.77 (m, 1H), 6.99 (m, 1H), 7.74 (d, J=7.8 Hz, 2H), 8.05 (d, J=8.1 Hz, 2H), 8.16 (t, J=8.0 Hz, 1H), 8.73 (bs, 8H), 9.07 (m, 2H), 9.31 (m, 1H), 9.56 (m, 1H), 10.10 (bs, 8H), 11.08 (bs, 8H), 12.21 (m, 2H), 12.42 (m, 1H), 12.51 (m, 1H), 12.96 (bs, 8H); LD-MS calcd av mass for C$_{120}$H$_{70}$OSN$_{20}$Eu$_2$ 2144.0, obsd 2146.2 (M$^+$), 2104.2 (M$^+$—CH$_3$CO), 1178.4 (M$^+$-)-(IPT-Por)Eu), 968.2 (M$^+$-(Pc)Eu(Pc)), 925.4 (M$^+$-(Pc)Eu(Pc) —CH$_3$CO); λ$_{abs}$ 342, 416, 521, 618, 720 nm.

S-acetylthio-derivatized Triple Decker (2). Samples of (Pc)Eu(Pc)Eu(E'B-Por) (15 mg, 7.0 μmol), 4-iodo-1-(S-acetylthio)benzene (2.0 mg, 7.0 μmol), Pd$_2$(dba)$_3$ (1.0 mg, 1.1 μmol) and P(o-tolyl)$_3$ (2.5 mg, 8.3 μmol) were added to a Schlenk flask. The flask was evacuated and purged with argon three times. Then deaerated toluene (3 mL) and deaerated N,N-diisopropylethylamine (0.6 mL) were added by syringe. The flask was immersed in an oil bath at 35 C and stirred under argon. The reaction was monitored by TLC (silica, toluene) and LD-MS. After 24 h, the solvent was removed under vacuum, the residue dissolved in toluene/ether (60:1), and loaded onto a silica gel column packed with the same solvent. Elution with toluene/ether (60:1) afforded the desired product together with trace of unreacted starting material as the first band. The product thus obtained was further purified by a second column chromatography procedure (silica gel, toluene), affording a black solid (3.1 mg, 19%) after removal of the solvent and washing with CH$_3$OH. $^1$H NMR (CDCl$_3$) δ 1.90, 1.92 (m, 27H), 2.62 (s, 3H), 3.28 (m, 8H), 4.70–4.80 (m, 3H), 4.98 (d, J=1H), 6.68 (m, 4H), 6.94 (d, J=6.6 Hz, 1H), 7.54 (m, 1H), 7.71 (m, 1H), 8.03 (m, 1H), 8.71 (bs, 8H), 9.05–9.12 (m, 3H), 9.42 (m, 1H), 10.10 (bs, 8H), 11.11 (bs, 8H), 11.56 (m, 2H), 11.72 (m, 1H), 12.02 (m, 1H), 12.98 (bs, 8H); LD-MS calcd av mass for C$_{130}$H$_{90}$OSN$_{20}$Eu$_2$ 2284.3, obsd 2191.4 (M$^+$), 2250.2 (M$^+$—CH$_3$CO), 1181.0 (M$^+$-(Por)Eu), 1111.6 (M$^+$-(Pc)Eu (Pc)), 1067.8 (M$^+$-(Pc)Eu(Pc)—CH$_3$CO); λ$_{abs}$ 341, 419, 523, 618, 721 nm.

E-dyad-1. Samples of (Pc)Eu(Pc)Eu(IET-Por) (35 mg, 16 μmol), (Pc)Eu(Pc)Eu(E'T-Por) (32 mg, 16 μmol), Pd$_2$(dba)$_3$ (2.3 mg, 2.5 μmol) and P(o-tol)$_3$ (5.8 mg, 19 μmol) were reacted in the presence of toluene (5 mL) and triethylamine (1 mL) at 35° C. using a Schlenk line. The reaction was monitored by analytical SEC and LD-MS. After 15 h, the solvent was removed and the residue was dissolved in CHCl$_3$ and loaded onto a silica gel column packed in CHCl$_3$. Elution with CHCl$_3$ afforded a main green band, which was concentrated to dryness, redissolved in toluene, and loaded onto a preparative SEC column packed with the same solvent. Elution with toluene afforded two well separated green bands, of which the second band was collected. Removal of the solvent and washing with CH$_3$OH afforded a black solid (28.5 mg, 44%). $^1$H NMR δ 0.79 (s, 91H), 3.11, 3.16 (m, 15H), 3.36–3.61 (m, 16H), 5.00, 5.02 (m, 5H), 5.20 (m, 1H), 5.48 (m, 2H), 6.71, 6.74 (d, J=7.5 Hz, 5H), 7.10 (m, 1H), 7.57 (m, 2H), 8.91 (brs, 16H), 9.25 (m, 6H), 9.68 (m, 1H), 10.09, 10.14 (m, 2H), 10.29 (brs, 16H), 11.30 (brs, 16H), 12.31–12.42 (m, 4H), 12.75, 12.85 (m, 2H), 13.04 (brs, 1H), 13.18 (brs, 16H); LD-MS obsd 4074.2 (M$^+$); FAB-MS obsd 4072.72, calcd exact mass 4072.85 (C$_{228}$H$_{136}$SiN$_{40}$Eu$_4$); λ$_{abs}$ 343, 425, 521, 617, 666, 720 nm.

E'-dyad-1. A sample of E-dyad-1 (22 mg, 5.4 μmol) in CHCl$_3$/THF/CH$_3$OH (8 mL, 1:5:2) was treated with K$_2$CO$_3$ (20 mg, 0.14 mmol). The reaction mixture was stirred at rt under argon with occasional monitoring by $^1$H NMR spectroscopy and LD-MS. Upon completion, CHCl$_3$ (30 mL) was added and the resulting mixture was washed with 10% aq NaHCO$_3$, H$_2$O, dried (Na$_2$SO$_4$), filtered, and concentrated. Column chromatography (silica, CHCl$_3$) afforded a black solid (18 mg, 83%). $^1$H NMR δ 3.08–3.10 (m, 15H), 3.29–3.59 (m, 16H), 3.74 (s, 1H), 4.97 (m, 5H), 5.13 (m, 1H), 5.44 (m, 2H), 6.69 (d, J=7.2 Hz, 5H), 7.21 (m, 1H), 7.54 (m, 2H), 8.86 (brs, 16H), 9.19 (brs, 6H), 9.58 (m, 1H), 10.18 (m, 2H), 10.25 (brs, 16H), 11.25 (brs, 16H), 12.23–12.36 (m, 4H), 12.52 (m, 1H), 12.82 (m, 2H) 13.14 (brs, 16H); LD-MS obsd 4008.3 (M$^+$); FAB-MS obsd 4001.09, calcd exact mass 4000.81 (C$_{225}$H$_{128}$N$_{40}$Eu4); $\lambda_{abs}$ 343, 421, 523, 618, 667, 721 nm.

Dyad-1. Samples of E'-dyad-1 (15 mg, 3.8 μmol), 1-(S-acetylthio)-4-iodobenzene (1.1 mg, 3.8 μmol), Pd(PPh$_3$)$_2$Cl$_2$ (0.4 mg, 0.6 μmol) and CuI (0.052 mg, 0.27 μmol) were reacted on a Schlenk line in the presence of toluene (3 mL) and deaerated N,N-diisoprophylethylamine (DIEA) (0.6 mL) at 30° C. under argon for 15 h with monitoring by TLC (silica, toluene) and LD-MS. The solvent was removed and the residue was dissolved in toluene/Et$_2$O (50:1). Chromatography (silica, toluene/Et$_2$O 50:1) afforded the title compound as the first main band which contained a trace of the butadiyne linked dyad. Separation by SEC (toluene) afforded the title compound as the second band. Removal of the solvent and washing with CH$_3$OH afforded a black solid (3.5 mg, 22%). $^1$H NMR δ 2.66 (s, 3H), 3.08–3.11 (s, 15H), 3.27–3.60 (m, 16H), 4.95 (d, J=6.6 Hz, 5H), 5.19 (m, 1H), 5.43 (m, 2H), 6.68 (d, J=7.2 Hz, 5H), 7.10 (m, 1H), 7.53 (m, 2H), 7.77 (d, J=7.5 Hz, 2H), 8.09 (d, J=7.5 Hz, 2H), 8.86 (brs, 16H), 9.19 (d, J=5.7 Hz, 6H), 9.66 (m, 1H), 10.05 (m, 2H), 10.25 (brs, 16H), 11.27 (brs, 16H), 12.32 (m, 4H), 12.62 (m, 1H), 12.81–12.87 (m, 2H), 13.15 (brs, 16H); LD-MS obsd 4156.4 (M$^+$), 4112.5 (M$^+$—CH$_3$CO), 2981. (M$^+$-(Pc)Eu(Pc)); FAB-MS obsd 4150.55, calcd exact mass 4150.82 (C$_{233}$H$_{134}$OSN$_{40}$Eu4); $\lambda_{abs}$ 343, 418, 523, 618, 722 nm.

Dyad-2. To a mixture of (Pc)Eu(Pc)Eu(E'T-Por) (18 mg, 9.0 μmol), Pd(PPh$_3$)$_2$Cl$_2$ (0.5 mg, 0.75 μmol), CuI (0.07 mg, 0.36 μmol) and I$_2$ (1.14 mg, 4.5 μmol) were added toluene (3 mL) and N,N-diisopropylamine (0.6 mL) and the resulting mixture was stirred at rt. The reaction progressed slowly (monitored by analytical SEC) and after 4 h the same amount of Pd(PPh$_3$)$_2$Cl$_2$ and CuI were added. After stirring overnight the reaction was finished (product:starting material=96:4 based on analytical SEC). The solvent was removed. Chromatography (silica, CHCl$_3$) removed all the non-triple deckers, and subsequent purification by one SEC column (toluene) gave the desired compound as a black solid after washing with CH$_3$OH (16 mg, 89%). $^1$H NMR δ 3.04–3.07 (m, 30H), 3.27–3.41 (m, 16H), 4.90 (d, J=6.6 Hz, 6H), 5.26 (m, 2H), 6.62 (d, J=7.5 Hz, 6H), 7.30 (d, J=6.6 Hz, 2H), 8.82 (brs, 16H), 9.13, (m, 6H), 9.85 (m, 2H), 10.21 (brs, 16H), 11.20 (brs, 16H), 12,21 (m, 6H), 12.61 (brs, 2H), 13.08 (brs, 16H); LD-MS obsd 4014.5 (M$^+$); FAB-MS obsd 4014.68, calcd exact mass 4014.83 (C$_{226}$H$_{130}$N$_{40}$Eu4); $\lambda_{abs}$ 342, 421, 522, 618, 722 nm.

EXAMPLE 2

Studies Related to the Design and Synthesis of A Molecular Octal Counter

Abbreviations herein are as follows: C$_8$OPc means —OC$_8$H$_{17}$Pc, 2,3,9,10,16,17,23,24 (C$_8$H$_{17}$ implies n-octyl); T BuPc means tetra-tert-butylphthalocyanine; Me$_8$Pc means —CH$_3$, 2,3,9,10,16,17,23,24; T-Por means meso-tetra-p-tolylporphyrin; PnPor means meso-tetrapentylporphyrin; E-PnPor means 5-(4-ethynylphenyl)-10,15,20-tri-n-pentylporphyrin; 1-PnPor means 5-(4-iodophenyl)-10,15,20-tri-n-pentylporphyrin; EB-Por means 20-[4-(2-(trimethylsilyl)ethynyl)phenyl]-5,10,15-tris[4-tert-butylphenyl]porphyrin; and EB-Por means 20-[4-ethynylphenyl]-5,10,15-tris[4-tert-butylphenyl]porphyrin.

Results and Discussion.

Figures 26, 26A:
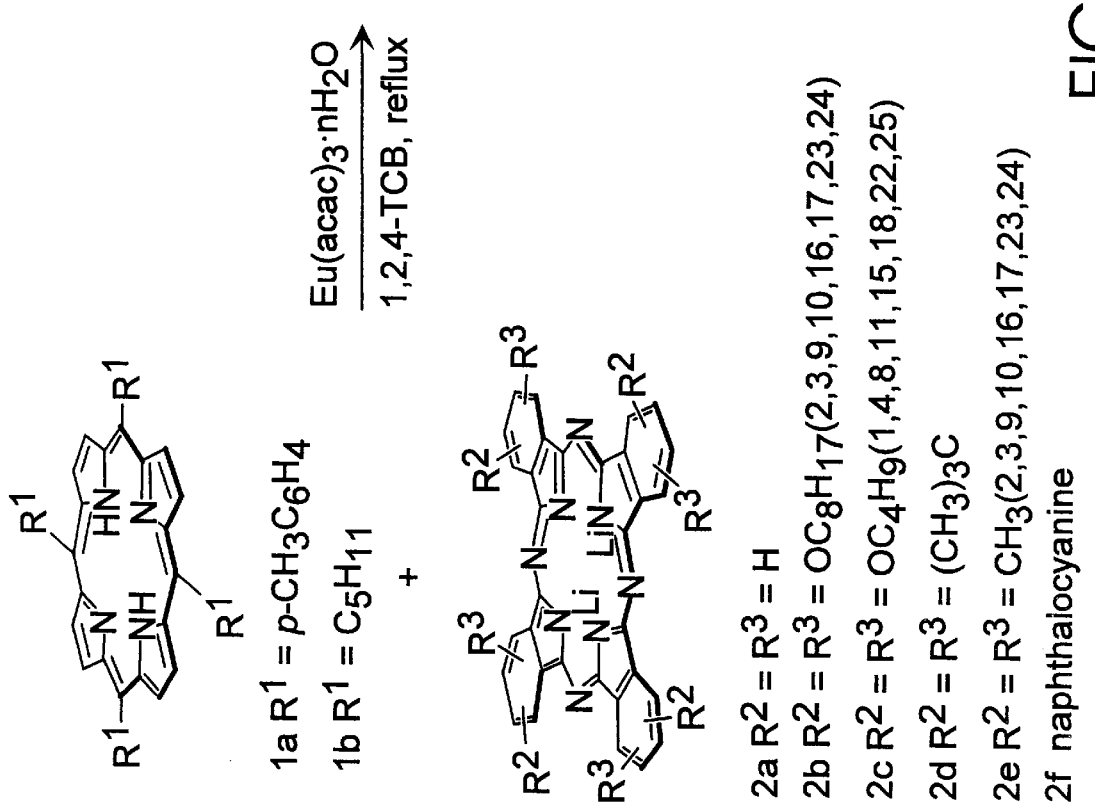
FIG. 26 illustrates the synthesis of triple decker complexes using the various porphyrin and phthalocyanine components.
Figure 26B:
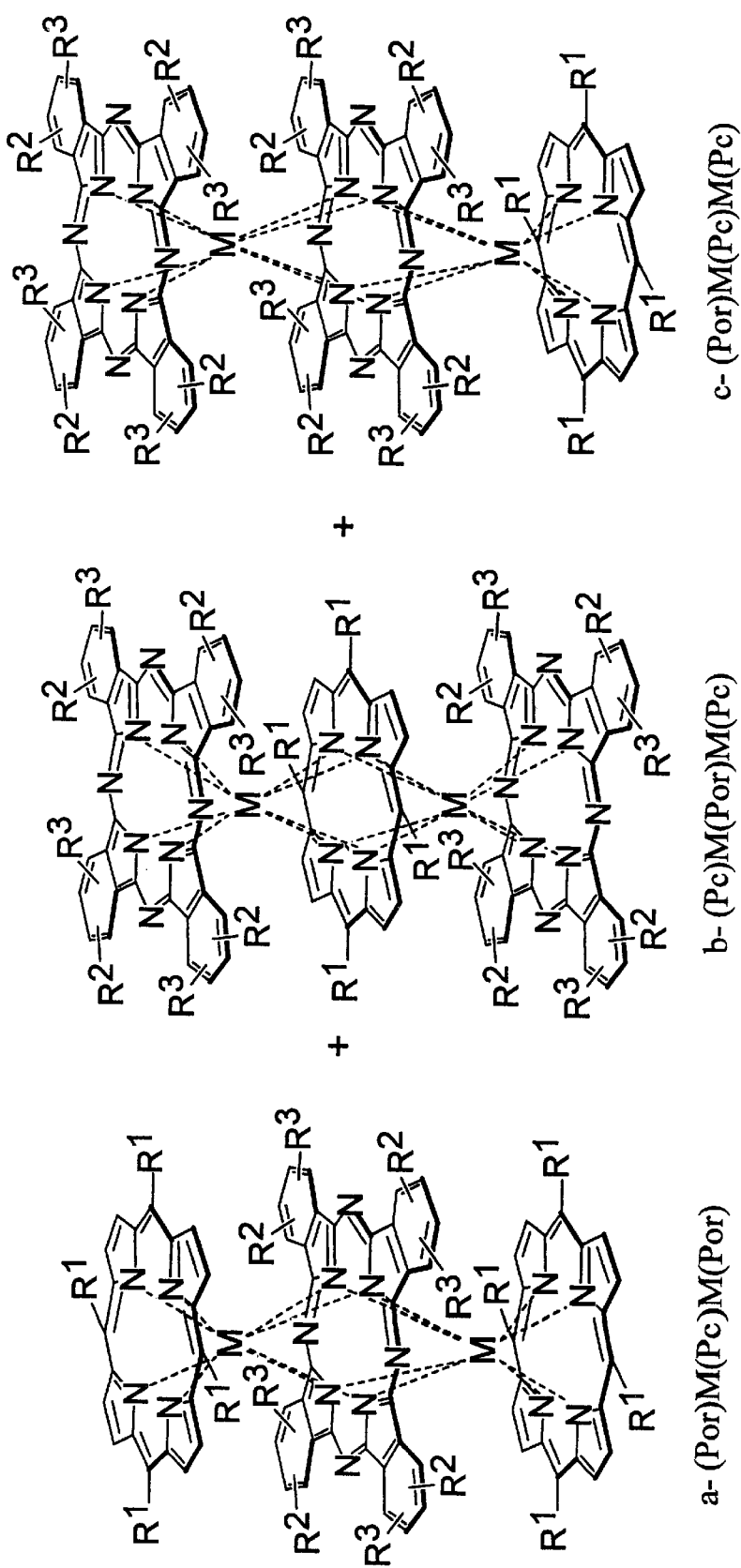

Triple Deckers Sandwich Complexes for the Electrochemical Studies in Solution. The general procedure for the preparation of heteroleptic porphyrin-phthatocyanine sandwich complexes is as follows (M. Moussavi et al., *Inorg. Chem.* 1986, 25, 2107–2108; J. Buchler et al., *Inorg. Chem.* 1988, 27, 339–345.). A porphyrin is refluxed in the presence of excess M(acac)$_3$.nH$_2$O in 1,2,4-trichlorobenzene, affording the porphyrin M(acac) complex. Subsequent treatment with dilithium phthalocyanine with continued reflux results in a distribution of three triple decker complexes including the desired product (Pc)Eu(Pc)Eu(Por). The porphyrins (1a, b), phthalocyanines (2a–e) and 2f naphthalocyanine were used in the preparation of the library of triple deckers. The substituents to be examined include n-pentyl and p-tolyl on a porphyrin unit and methyl, octyloxy, butoxy, and t-butyl on a phthalocyanine unit. Note that tetra-tert-butylphthalocyanine (2d) consisted of a mixture of regioisomers. The porphyrins were employed as the free base ligands, and the phthalocyanines were converted to the dilithium derivatives prior to reaction. We carried out the general reaction protocol with nine combinations of porphyrin and phthalocyanine starting materials, affording triple-decker complexes as shown in FIG. 26.

In each case, when the Eu(acac)$_3$.nH$_2$O was used, the crude reaction mixtures were purified by column chromatography on silica gel (CHCl$_3$). The first fraction contained the a type triple-decker complex (Por)Eu(Pc)Eu(Por) and porphyrin monomer, which were easily separated by SEC chromatography (THF). The second and third triple-decker complexes of type b (Pc)Eu(Por)Eu(Pc) and type c (Pc)Eu (Pc)Eu(Por) required further silica column chromatography with toluene. In some cases (See Experimental Section below) the chromatography had to be repeated several times. Reactions of phthalocyanine 2c with porphyrin 1a or 1b led to the recovery of starting materials and a very complicated mixture of products, but triple-decker complexes were not present—presumably due to steric hindrance caused by substituents in the 1,4,8,11,15,18,22,25-positions. In the case of the reaction of porphyrin 1b and phthalocyanine 2e with Ce(acac)$_3$.nH$_2$O (D. Chabach et al., *New J Chem.* 1992, 16, 431–433), the a type triple decker sandwich complex was isolated as the main product and only traces of b and c type complexes were detected by LD-MS. The reaction of porphyrin 1b and naphthalocyanine 2f in the presence of Eu(acac)$_3$.nH$_2$O, resulted mainly in the recovery of starting material and very small amount of a type triple decker. The yields of the triple deckers isolated from each reaction are listed in Table 4.

Each triple-decker complex was characterized by LD-MS, FAB-MS, UV-Vis spectroscopy and $^1$H NMR spectroscopy. However, $^1$H NMR spectroscopy was not particularly useful for the characterization of complexes containing the tetra-tert-butylphthalocyanine ligand (6a, 6b, 6c, 9a, 9b, 9c) due to the presence of phthalocyanine regioisomers. The purity of the complexes were confirmed by TLC or LD-MS analysis in the absence of a matrix. In the LD-MS spectra of 3a, 3c, 6a, 9a, other peaks in addition to the molecular ion peak M$^+$ were detected and could be assigned to fragmentation:

(Por)Eu(acac), (Por)Eu(Pc) or M$^+$-[C$_4$H$_9$]. Type a compounds were easily distinguished from types b and c by the significant difference in molecular masses. Although compounds b and c have the same molecular mass, the structure was identified from UV-Vis spectra, by comparison to spectra reported for (Pc)Eu(Pc)Eu(Por) (J. Jiang, et al., *Inorg. Chim. Acta* 1998, 268, 49–53; J. Jiang et al., *Inorg. Chim. Acta* 1997, 255, 59–64) and for analogous cerium (III) triple-decker complexes (D. Chabach et al., *New J. Chem.* 1992, 16, 431–433; D. Chabach et al., *J. Am. Chem. Soc.* 1995, 117, 8548–8556) [Finally, the triple-decker complex containing three tetra-tert-butylphthalocyanine ligands (i.e., of general structure (Pc)Eu(Pc)Eu(Pc), 9d) was isolated as the most polar triple-decker sandwich complex from the reaction of 1b and 2d].

Electrochemistry. Each member of the library of triple-decker sandwich complexes that was pure and available in sufficient quantity was examined electrochemically in solution. Selected electrochemical data are summarized in Table 5. For compounds 3c, 4a, 6a, 6b, 9a, 9c, 10a, 10b four oxidation states were observed, whereas compounds 6c, 9d and 4c provided only three oxidation states. For most complexes, two reduction processes were observed, though exceptions occurred with 6b, 9d and 3c where three reduction states were detected. The highest electrochemical potential was exhibited by the triple-decker complex 3c with only the electron donating group (p-tolyl) on the periphery of the porphyrin ring, whereas the lowest potential was measured for compound 10a with an aliphatic chain in the porphyrin meso positions and eight methyl groups on the phthalocyanine unit. These results are consistent with expectation based on knowledge of substituent effects.

Figures 27, 27A:
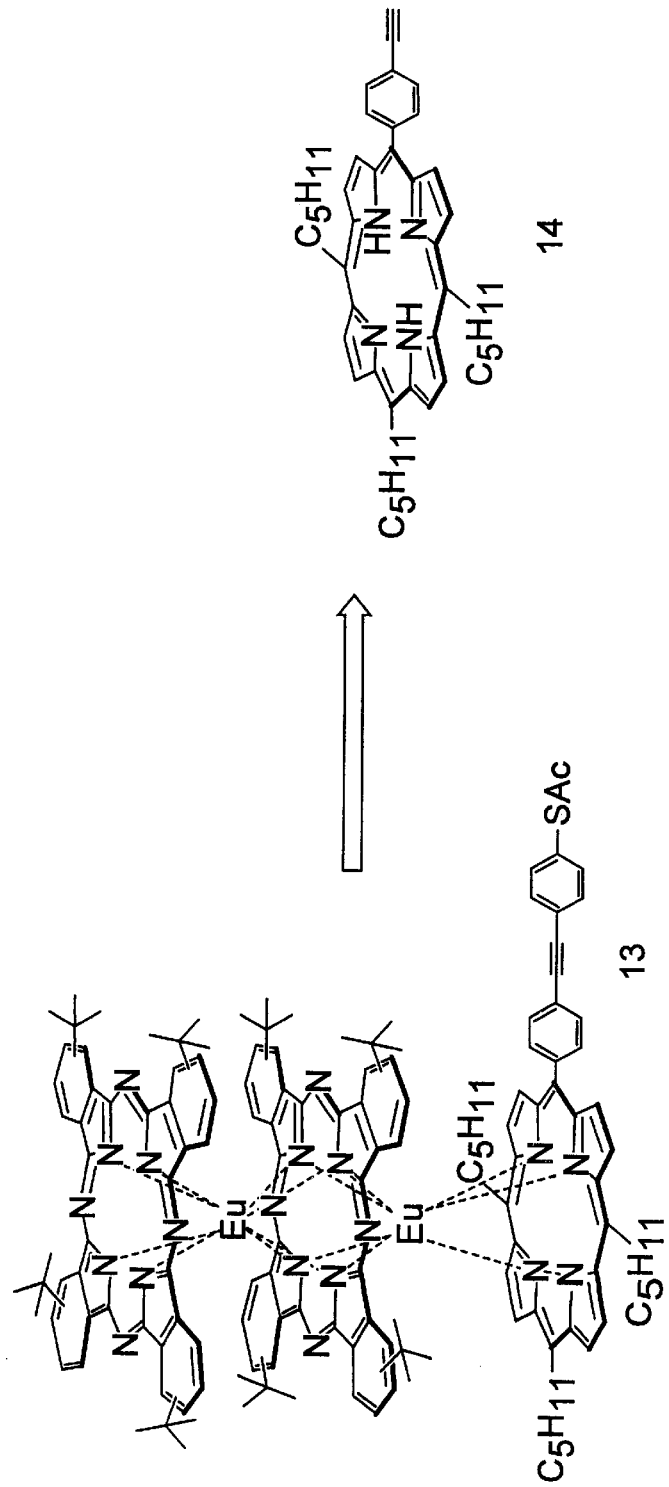
FIG. 27 illustrates the retrosynthetic analysis of two S-(acetylthio)-derivatized triple deckers of general structure (Pc)Eu(Pc)Eu(Por).
Figure 27B:
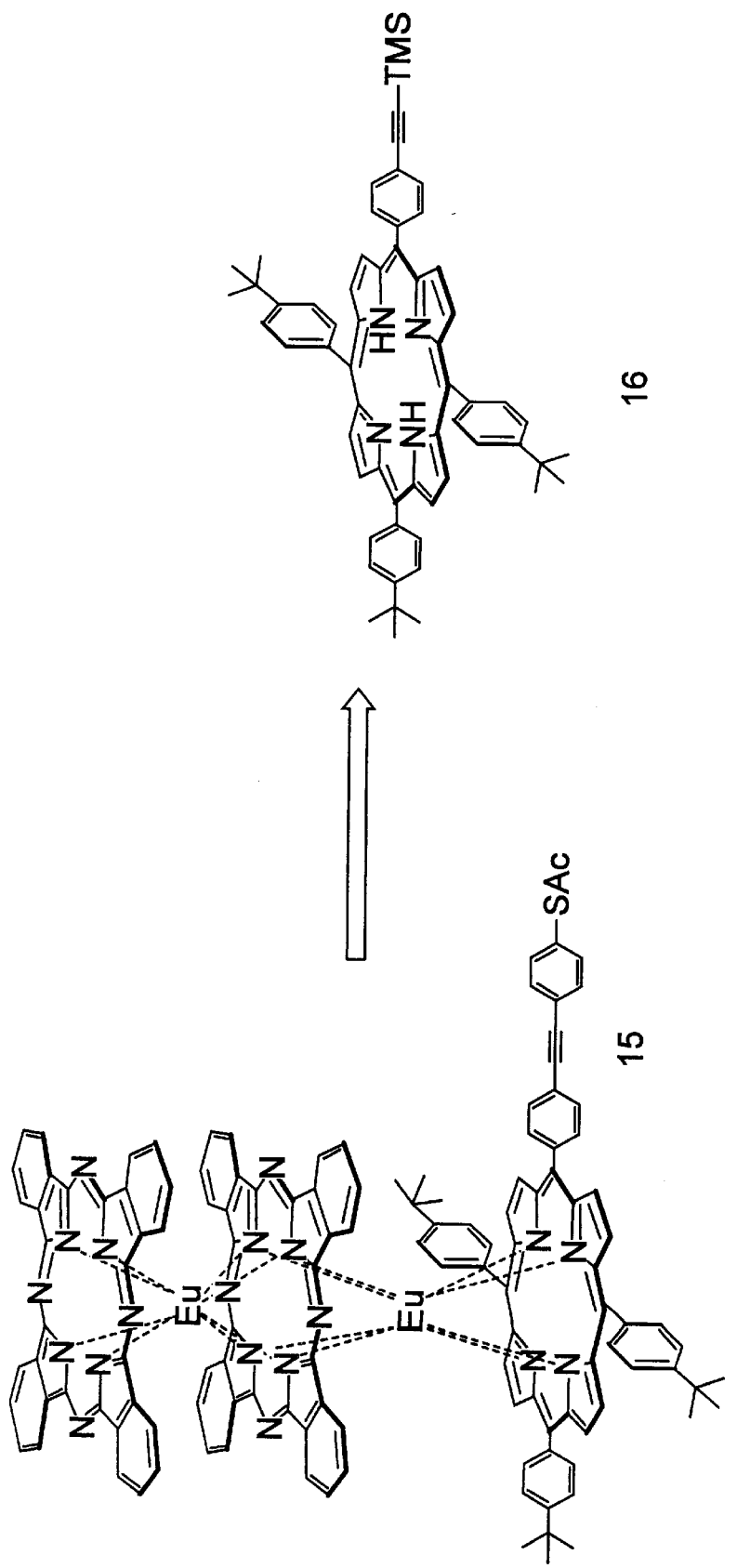

Strategy. In order to identify combinations of triple deckers that could be used in the design of an octal counter, we overlaid square wave voltammograms and inspected them visually for interleaved oxidation potentials. Some of the pairs that exhibited very good separations of potentials included 9c and 6a, 3c and 9a, and 6a and 9a. Of these 9c appeared to be quite attractive for two reasons: (1) this complex exhibited very low oxidation potentials, thereby enabling the low regime of the accessible electrochemical window on gold to be accessed; (2) we have in hand an S-(acetylthio)-derivatized triple decker similar to that of 6a. Therefore we designed molecule 13 (FIG. 27) which has the same substituents but replaces one n-pentyl group on the porphyrin with a thiol-derivatized linker for attachment to a gold electrode. A number of triple decker complexes has been prepared during the course of this study.

Figure 28:
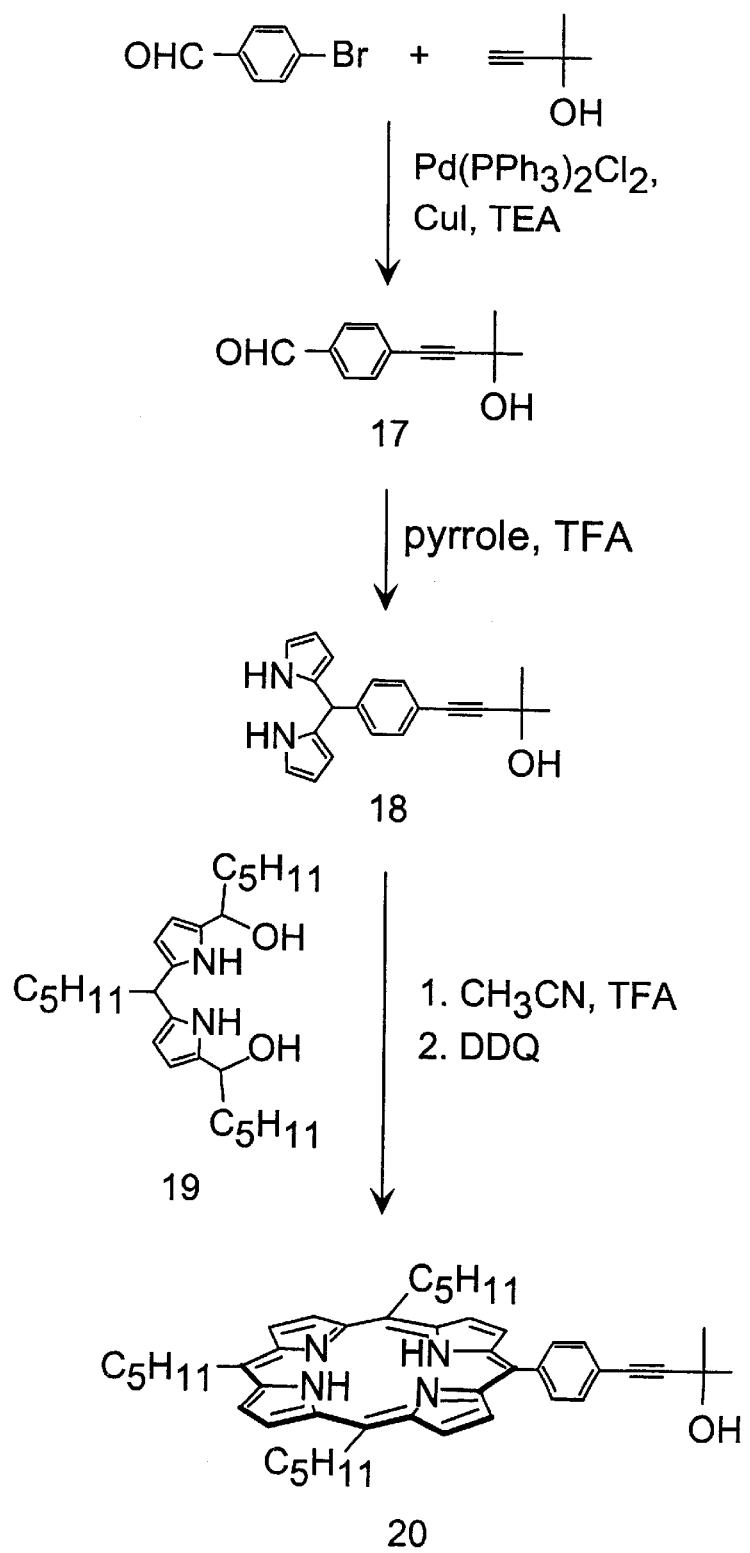
FIG. 28 illustrates the synthesis of a tripentyl mono-ethynyl porphyrin for use in preparing the triple decker building blocks.
Figure 29:
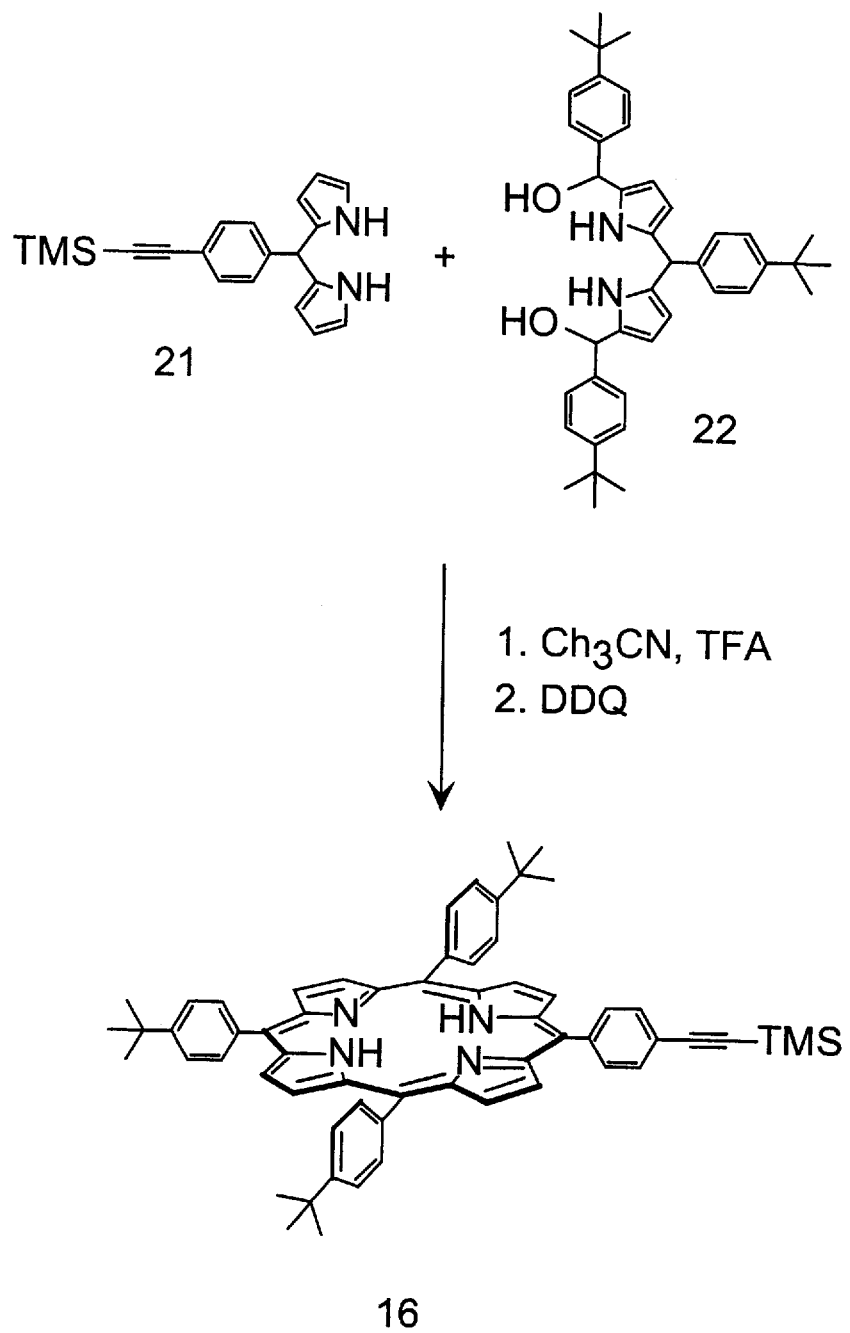
FIG. 29 illustrates the rational synthesis of a triaryl mono-ethynyl porphyrin for use in preparing the triple decker building blocks.

Building blocks. The synthesis of the triple-decker sandwich molecules 13 and 15 required the preparation of porphyrins 14 and 16 (FIG. 27) (B. Littler et al., *J. S. J. Org. Chem.* 1999, 64, 2864–2872; W.-S. Cho et al., *J. Org. Chem.* 1999, 64, 7890–7901). Each porphyrin has been prepared via a rational route. The reaction of 4-bromobenzaldehyde and 2,2-dimethyl-3-butyn-2-ol under Pd-coupling conditions (L. Della Ciana and A. Haim, *J. Heterocyclic Chem.* 1984, 21, 607–608; R. Wagner et al., *J. Org. Chem.* 1995, 60, 5266–5273; R. Wagner et al., *Chem. Mater.* 1999, 10, 2974–2983) afforded aldehyde 17 (FIG. 28) (K. Yamada et al., *Chem. Lett.* 1999, 895–896). This rather polar ethyne protecting group was selected in order to facilitate separation of the porphyrin in the final step of the synthesis. Condensation of the latter with excess pyrrole in the presence of trifluoroacetic acid (TFA) (B. Littler et al., *J. S. J. Org. Chem.* 1999, 64, 2864–2872) gave dipyrromethane 18 in 56% yield after chromatography followed by crystallization. The desired dipyrromethane-dicarbinol 19 was prepared in a two step process. Treatment of 5-(n-pentyl) dipyrromethane with ethylmagnesium bromide followed by n-hexanoyl chloride afforded the corresponding 1,9-diacyldipyrromethane in good yield. Reduction of the diacyldipyrromethane with NaBH$_4$ in tetrahydrofuran (THF)-methanol afforded the corresponding dicarbinol 19, which was not characterized but was used immediately in the subsequent reaction. The reaction of dipyrromethane 18 and dipyrromethane-dicarbinol 19 was performed in the presence of TFA in acetonitrile followed by oxidation with 2,3-dichloro-5,6-dicyano-1,4-benzoquinone (DDQ). Although this route usually provides porphyrin devoid of acidolytic scrambling, dipyrromethane-dicarbinols with aliphatic substituents are known to condense with modest scrambling. The major other porphyrin species identified was meso-tetrapentylporphyrin. The polarity imparted by the 2-(2-hydroxypropyl)ethyne protecting group enabled facile separation of the mixture and porphyrin 20 was obtained in 28% yield. Porphyrin 16 was prepared in the same manner. Reaction of dipyrromethane 21 with dipyrromethane-dicarbinol 22 in the presence of TFA afforded porphyrin 16 in 32% yield (FIG. 29).

The reaction of Eu(acac)$_3$.nH$_2$O and free base porphyrin 20 afforded the corresponding Eu(Por)acac complex. Treatment of the latter with dilithium phthalocyanine 2d in refluxing 1,2,4-trichlorobenzene gave a mixture of six triple deckers (with protected or deprotected ethyne moieties) together with residual starting materials. Since the 2-(2-hydroxypropyl) ethyne protecting group is unstable under the reaction conditions forming the triple decker, ethyne deprotection was performed at the porphyrin stage. Furthermore, this approach minimizes synthetic manipulation of the triple deckers.

Figure 30:
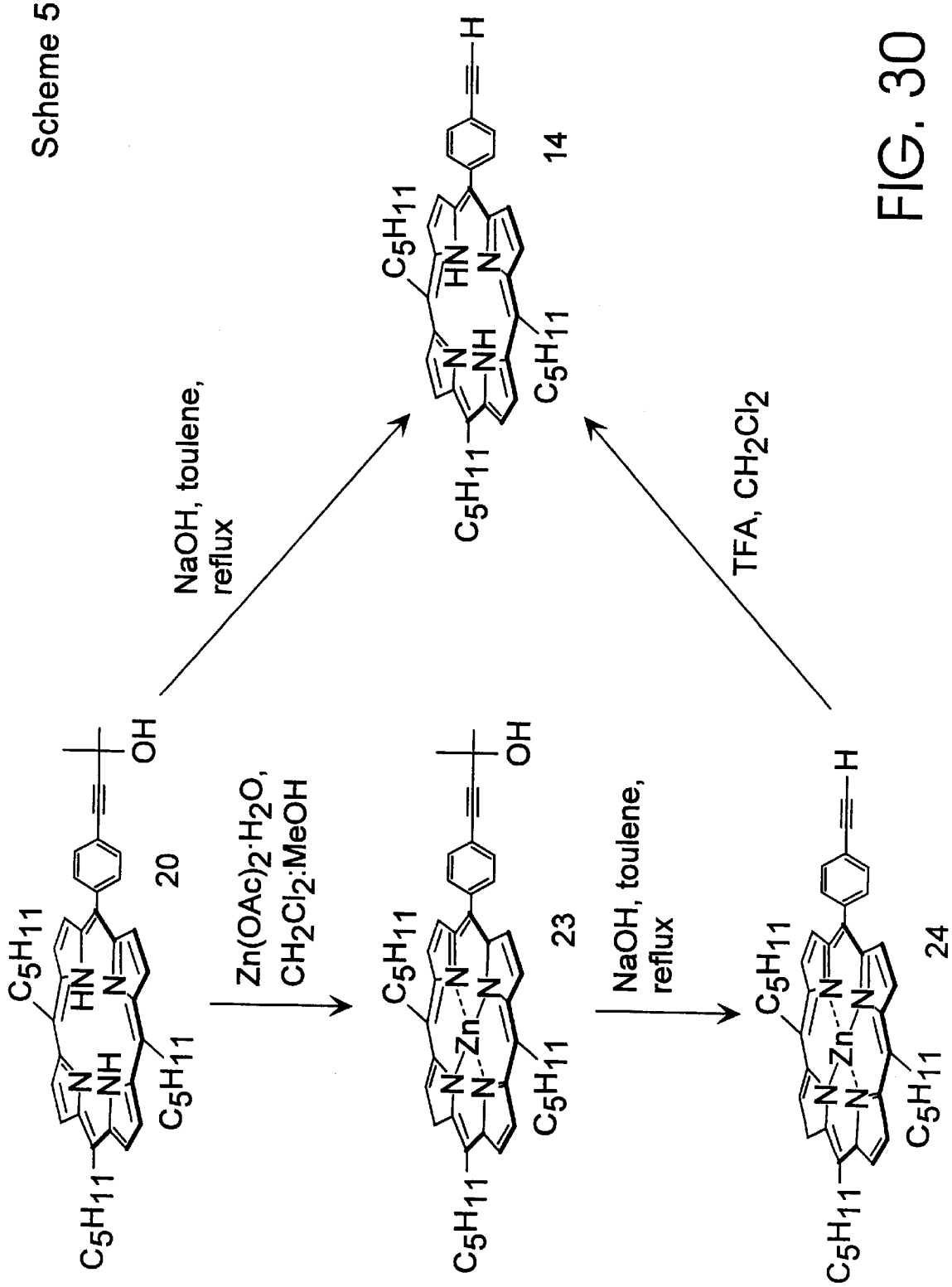
FIG. 30 illustrates deprotection routes for obtaining the porphyrin bearing the free ethyne unit.

In order to obtain the deprotected ethyne, porphyrin 20 was first metalated with zinc (J. Rodriquez et al., *J. Chem. Soc. Perkin Trans* 11997, 709–714) under standard conditions giving porphyrin 23 (FIG. 30). Deprotection of the ethyne by refluxing with sodium hydroxide in toluene (L. Della Ciana and A. Haim, *J. Heterocyclic Chem.* 1984, 21, 607–608) (98% yield) gave building block 24. Demetalation of 24 with TFA (J. Lindsey et al., *Tetrahedron* 1994, 50, 8941–8968) afforded free base mono-ethynyl porphyrin 14 in 83% yield (FIG. 30). The metalation step was performed in order to suppress possible decomposition of the free base porphyrin upon exposure to sodium hydroxide. Subsequently, and to our surprise, we found that reaction of porphyrin 20 with sodium hydroxide in refluxing toluene proceeded smoothly to give porphyrin 14 in 90% yield.

Figure 31:
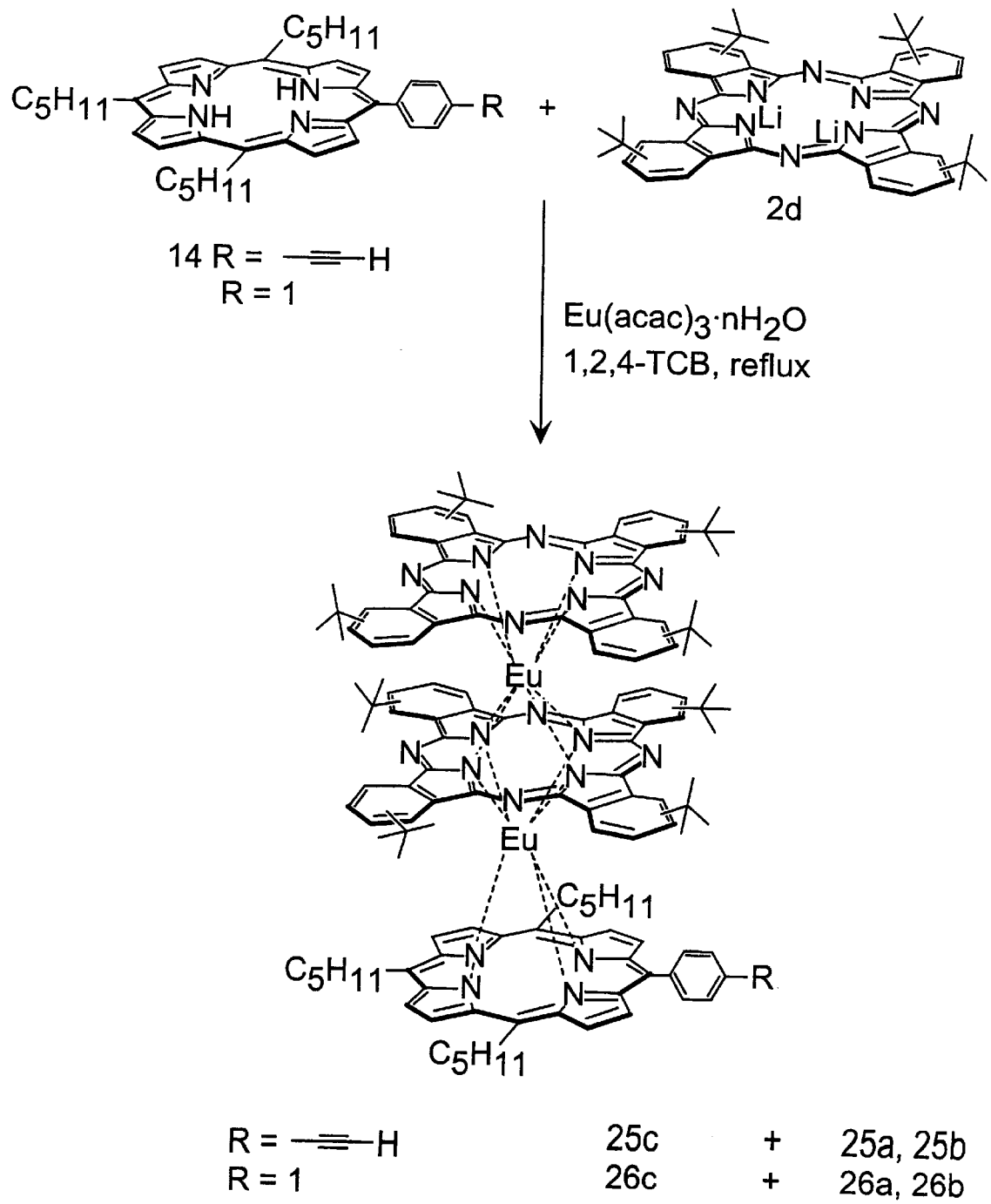
FIG. 31 illustrates the synthesis of a mono-ethynyl triple decker building block. Each triple decker exists as a mixture of regioisomers due to the positions of substitution of the t-butyl groups on the phthalocyanine macrocycles.

The reaction of Eu(acac)$_3$.nH$_2$O and free base porphyrin 14 afforded the corresponding Eu(Por)acac complex. Treatment of the latter with dilithium phthalocyanine 2d in refluxing 1,2,4-trichlorobenzene gave a mixture of products together with residual starting materials (FIG. 31). Column chromatography on silica gel with chloroform gave four bands. Further purification of the first fraction by SEC in THF afforded triple-decker complex 25a in 22% yield and unreacted porphyrin 14 (38%). UV-Vis spectroscopy and LD-MS analysis allowed the structure of 25a to be assigned as (E-PnPor)Eu(tBu$_4$Pc)Eu(E-PnPor). The second band contained free base phthalocyanine 2d (5%). The third and the fourth bands gave compounds which had the same molecular mass, but displayed different absorption spectra. These complexes could be assigned as (tB$_4$Pc)Eu(E-PnPor)Eu (tBu$_4$Pc) 25b (1.3%) and (tBu$_4$Pc)Eu(tBu$_4$Pc)Eu(E-PnPor) 25c (12%) in order of elution from the adsorption column.

The monoiodo-derivative triple-decker complex 26c (FIG. 31) was isolated in 12% (40 mg) yield after two column chromatography procedures, with a small amount of impurity still detected by LD-MS. However, the molecular mass of the impurity could not be assigned to a known triple-decker complex.

Figure 32:
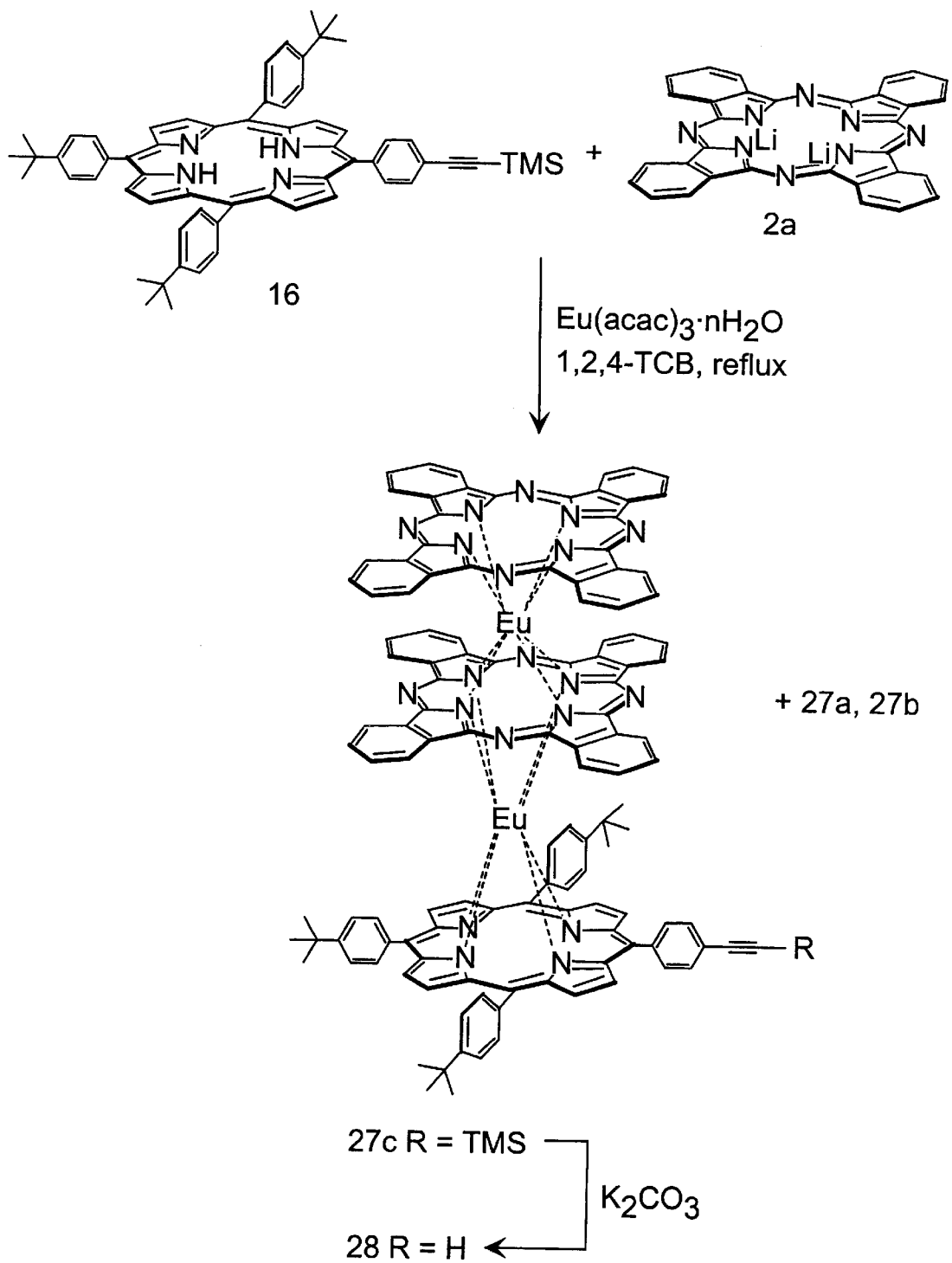
FIG. 32 illustrates the synthesis of a triple decker building block bearing a protected ethyne unit and the subsequent deprotection giving the free ethyne.

In the triple decker forming reaction, Eu(acac)$_3$.nH$_2$O and free base porphyrin 16 afforded the corresponding Eu(Por) acac complex. Treatment of the latter with lithium phthalocyanine 2a in refluxing 1,2,4-trichlorobenzene gave a mixture of products together with residual starting materials (FIG. 32). Column chromatography on silica gel with chloroform gave four bands. Further purification of the first fraction by SEC in THF afforded triple-decker complex 27a in 26% yield. UV-Vis spectroscopy and LD-MS analysis allowed the structure of 27a to be assigned as (EB-Por)Eu(Pc)Eu(EB-Por) sandwich complex. The third and the fourth bands gave compounds which had the same molecular mass, but displayed different absorption spectra. These complexes could be assigned as (Pc)Eu(Por)Eu(EB-Pc) 27b (1.6%) and (Pc)Eu(Pc)Eu(EB-Por) 27c (9.1%) in order of elution from the adsorption column. Treatment of 27c with K$_2$CO$_3$ (R. Wagner et al., *J. Am. Chem. Soc.* 1996, 118, 11166–11180) afforded the deprotected triple decker 28 in 94% yield.

Thiol-derivatized Triple Decker Sandwich Complexes. We have investigated several methods for attaching the thiol handle to the triple decker building blocks. Our studies have revealed the advantages of certain approaches and conditions for avoiding critical side reactions. These findings have emerged from the three methods described below.

Figure 33:
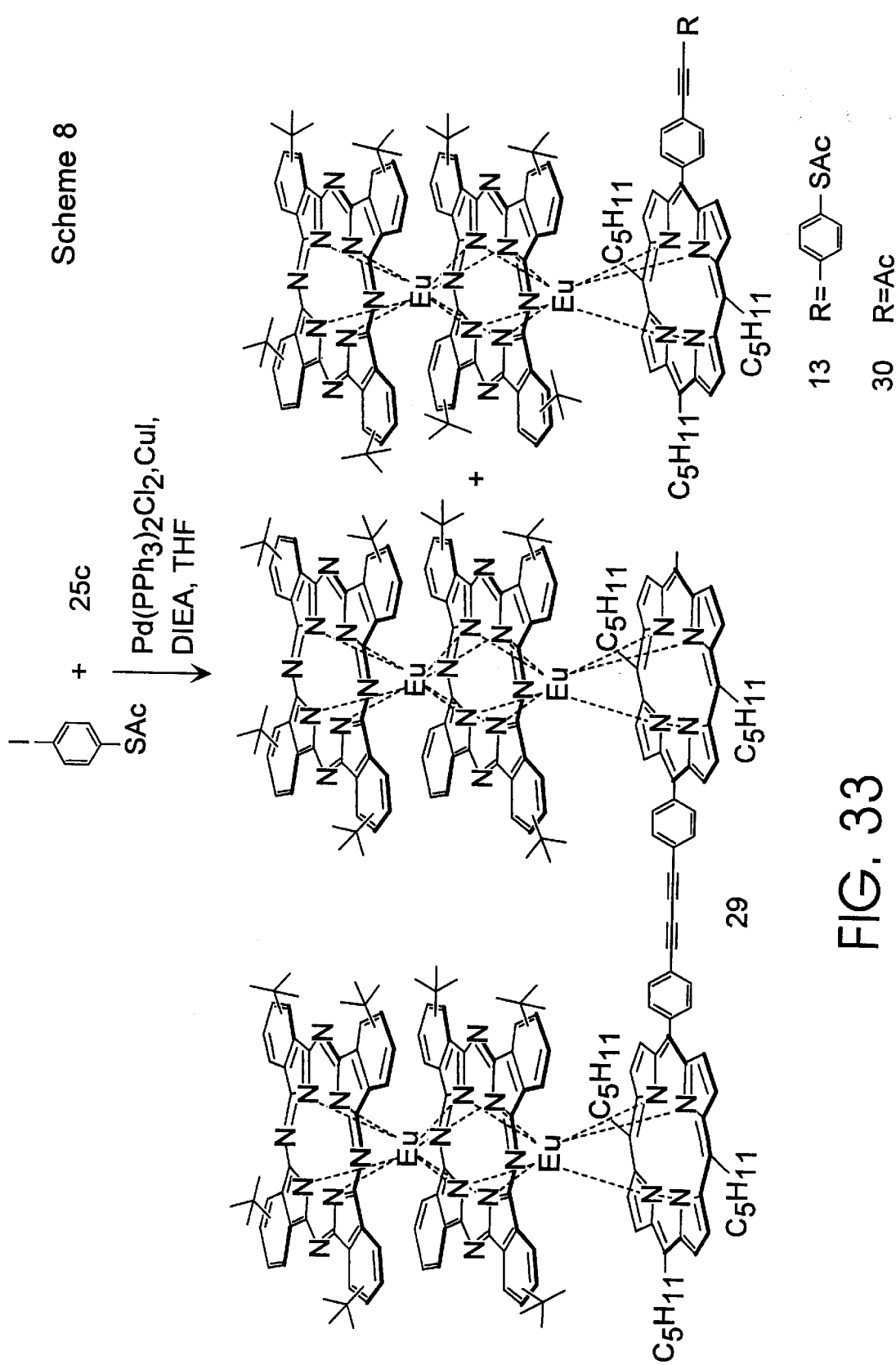
FIG. 33 illustrates the production of the desired S-(acetylthio)-derivatized triple decker (13) by Pd-mediated coupling as well as the formation of a by-product (30) derived from an acetyl transfer reaction and the butadiyne-linked dyad (29) derived from homo-coupling.

(1) In order to attach a protected thiol unit to the triple decker, ethynyl triple-decker 25c and 1-iodo-4-(S-acetylthio)benzene were reacted under Pd-coupling conditions in the presence of copper(I) iodide (FIG. 33) (L. Cassar, *J. Organomet. Chem.* 1975, 93, 253–257; H. Dieck et al., *J. Organomet. Chem.* 1975, 93, 259–263). Three main compounds were obtained. Because the S-acetylthio group can under(yo cleavage in the presence of most of the commonly used bases in Pd-coupling reactions, DIEA was used instead and no cleavage product was found in the reaction mixture (R. Hsung et al., *Tetrahedron Lett.* 1995, 26, 4525–4528). The mixture was separated by silica column chromatography followed by SEC. Based on molecular ion peak assignments upon LD-MS analysis, the structure of the less polar compound was assigned to a butadiyne-linked dyad of triple-deckers (29). Homo-coupling of ethynes yielding the butadiyne byproduct is a well-known side reaction in Sonogashira reactions in the presence of copper (K. Sonogashira et al., *Tetrahedron Lett.* 1975, 4467–4470). The second fraction contained two inseparable compounds. The LD-MS spectrum showed two major peaks at m/z 2439 and 2548. The latter corresponds to the desired S-(acetylthio)-derivatized triple decker 13, while the former is consistent with an acetylated derivative of the ethynyl triple-decker starting, material. We attribute the formation of the acetylated by-product to acetyl transfer from the 1-iodo-4-(S-acetylthio)benzene (or product derived therefrom), giving 30.

Figure 34:
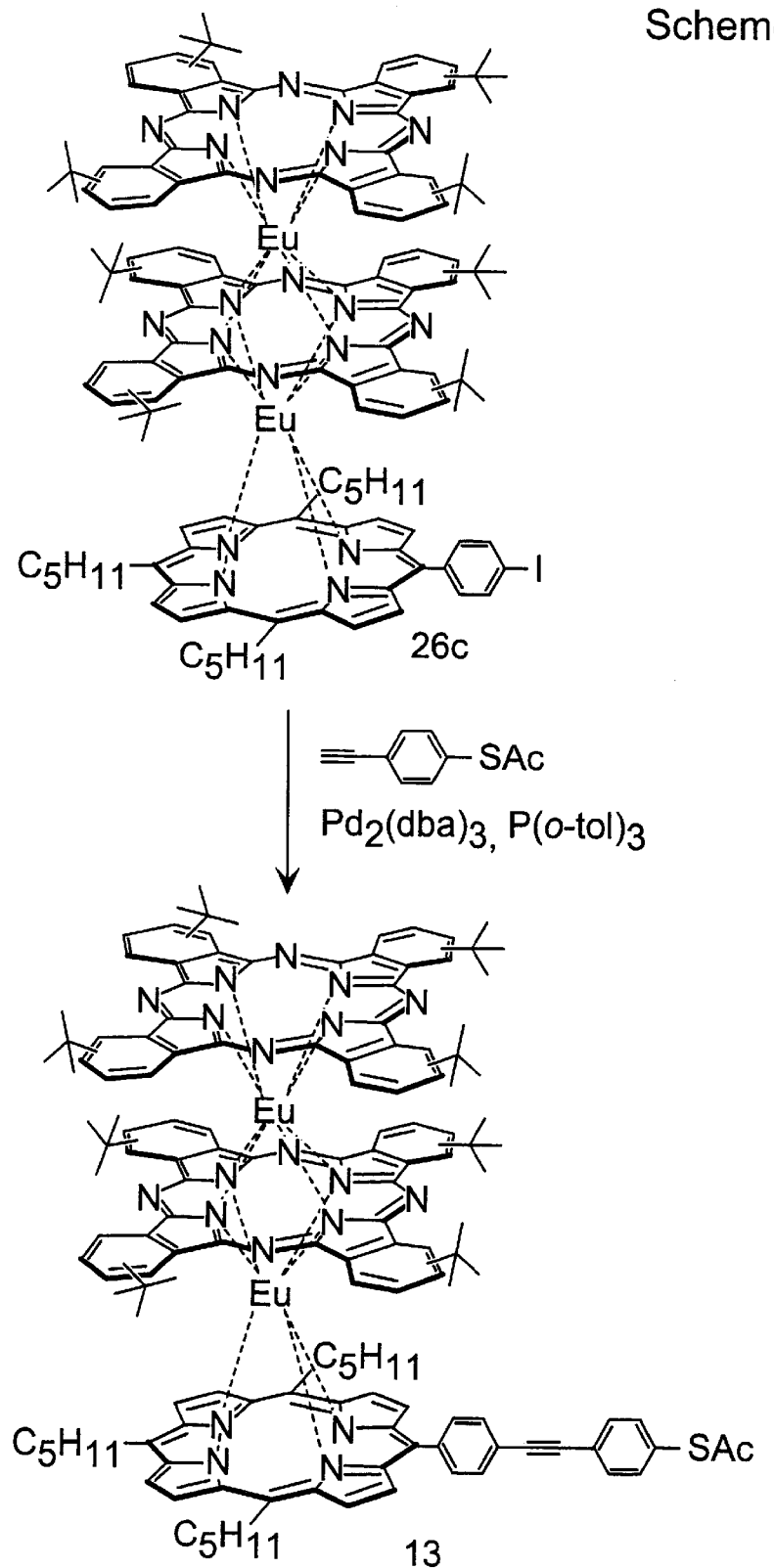
FIG. 34 illustrates the synthesis of an S-(acetylthio)-derivatized triple decker via an approach that avoids forming the triple decker by-product derived from an acetyl transfer reaction.

(2) The difficulties encountered in isolating the desired molecule 13 prompted the investigation of a different route. The homo-coupling of the ethynyl-substituted triple-decker yielding the butadiyne-linked dyad is readily avoided by use of an iodo-substituted triple-decker complex as the starting material. In this case any acetylation of the ethyne due to side reactions from the S-(acetylthio)benzene starting material would not affect the integrity of the triple decker product. Furthermore the omission of copper, which promotes the oxidative coupling of triple bonds, greatly suppresses homo-coupling. Thus, compound 26c was reacted with 1-ethynyl-4-(S-acetylthio)benzene (D. Pearson and J. Tour, *J. Org. Chem.* 1997, 62, 1376–1387) under mild copper-free Pd-mediated coupling conditions (R. Wagner et al., *J. Org. Chem.* 1995, 60, 5266–5273; R. Wagner et al., *Chem. Mater.* 1999, 10, 2974–2983) (triple-decker complex 3 mM with molar ratio of complex—(1), ethyne compound—(1), P(o-tol)$_3$—(1.2) and Pd$_2$(dba)$_3$—(0.15)) in toluene and DIEA (5:1) at 35° C). After purification, unreacted starting material 35 was recovered in 40% yield and the desired triple decker 13 was obtained in 14% yield (FIG. 34). Although the reaction in the absence of copper is slower, the product distribution is cleaner.

Figure 35A:
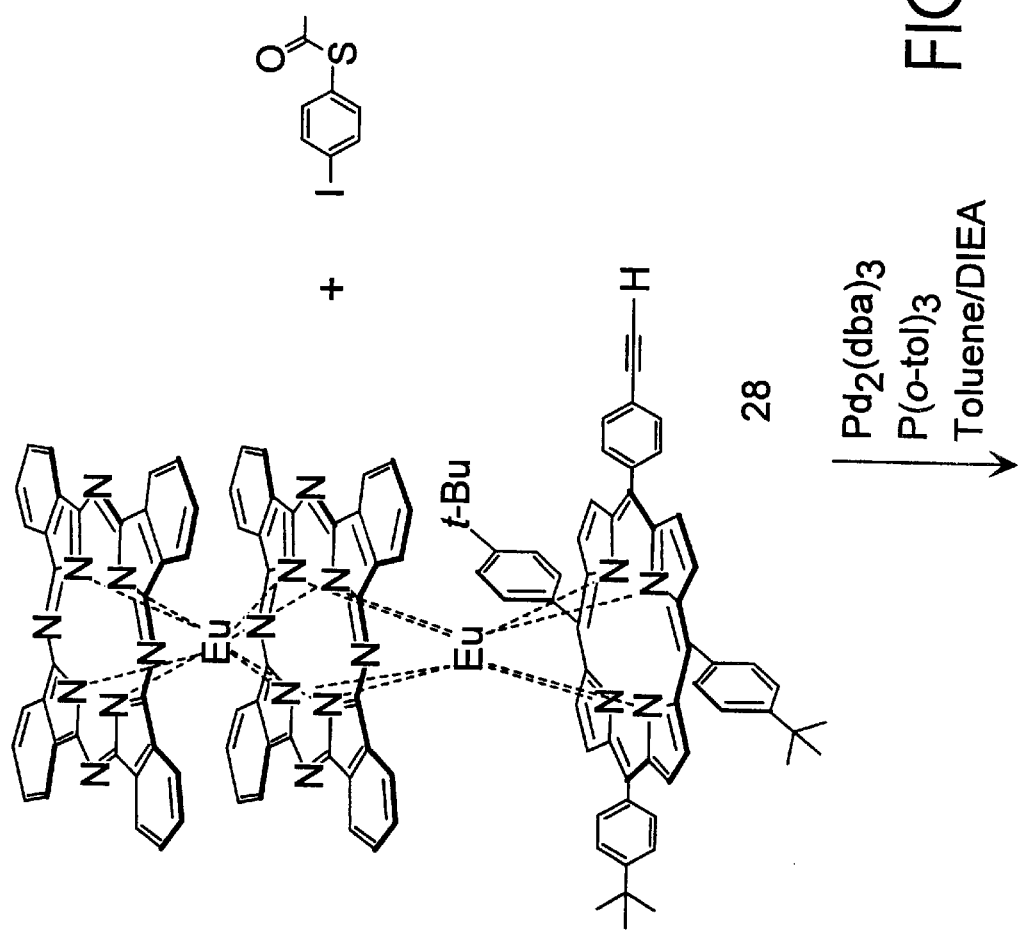
FIG. 35 illustrates the synthesis of an S-(acetylthio)-derivatized triple decker (15) and the production of a by-product (31) derived from an acetyl transfer reaction.
Figure 35B:
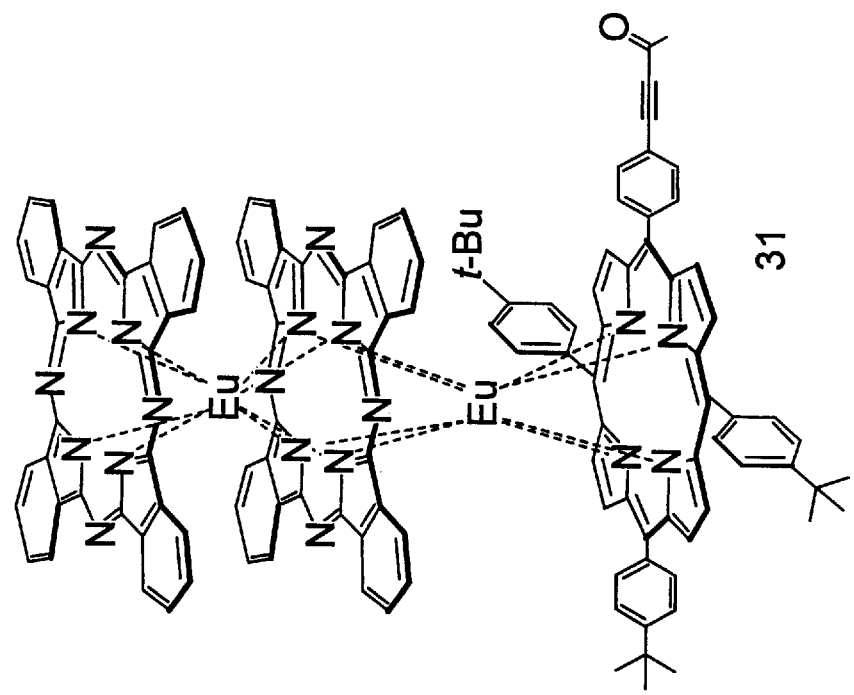
Figure 35B:
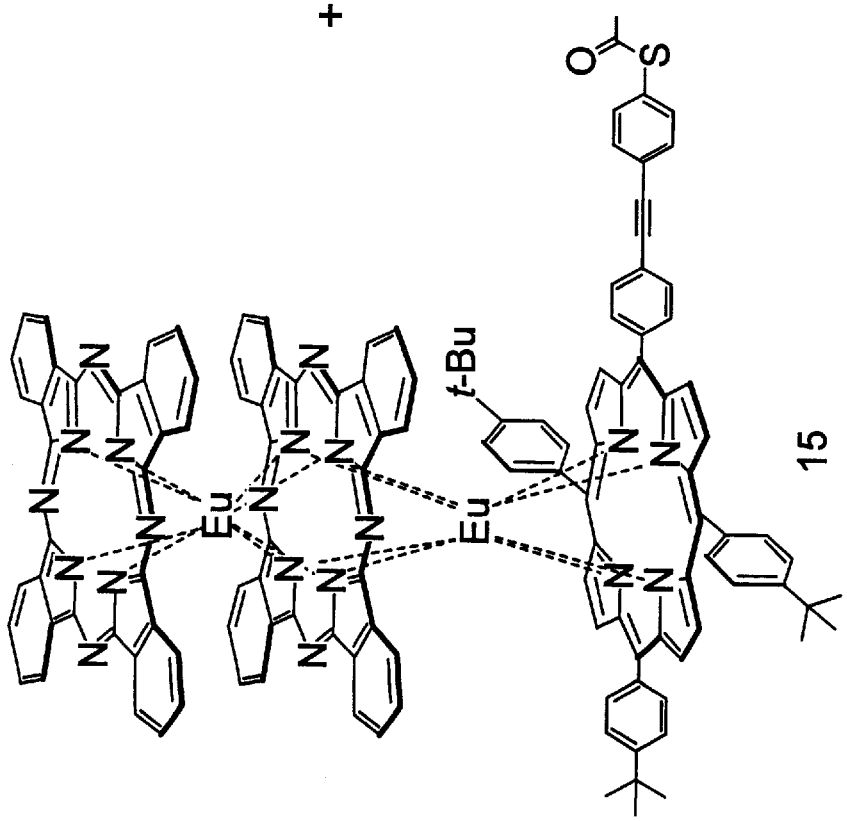

(3) The ethynyl-substituted triple decker (Pc)Eu(Pc)Eu(EB-Por) 28 and 4-iodo-1-(S-acetylthio)benzene were coupled under the Pd-coupling conditions (Pd$_2$(dba)$_3$, P(o-tol)$_3$) used for joining porphyrin building blocks (FIG. 35). LD-MS analysis of the crude reaction mixture revealed two dominant peaks (m/z 2179, 2287) corresponding to the acetylated product and the desired product, respectively. Column chromatography afforded the two separate species. $^1$H NMR analysis of the former species revealed a sharp singlet (2.86 ppm, 3H) consistent with an acetyl moiety. The desired S-acetylthio derivatized triple-decker 15 was obtained in 19% yield, which is quite low compared with the typical yield (50~60%) in the reaction between two porphyrin monomers under the same conditions. Thus, excluding copper from the coupling reaction avoids homo-coupling but does not suppress acetyl transfer reaction.

Conclusions. We have synthesized a library of triple-decker complexes comprised of different porphyrins and phthalocyanines substituted with various electron-donating substituents. Electrochemical examination of this library has revealed appropriate combinations of triple deckers that may be used in the design of an octal counter. As part of the synthesis component of this work, we have identified a suitable route for attaching the thiol linker which should avoid some problematic side reactions and thereby facilitate access to the desired thiol-derivatized triple deckers. The simplest way to avoid forming the acetylated triple decker by-product is to employ an iodo- rather than ethynyl-substituted triple-decker complexes. Two thiol-derivatized triple decker complexes have been prepared.

B. Experimental Section

General. $^1$H NMR spectra (300 MHz) and absorption spectra (HP 8451A, Cary 3) were collected routinely. All $^1$H NMR spectra were collected in CDCl$_3$ (300 MHz) unless noted otherwise. All absorption spectra were collected in toluene. Porphyrin-phthalocyanine sandwich complexes were analyzed by laser desorption (LD-MS) mass spectrometry (Bruker Proflex II) and high resolution fast atom bombardment (FAB-MS) on a JEOL (Tokyo, Japan) HX 110HF mass spectrometer. LD-MS analysis was done without a matrix or with the matrix POPOP. High resolution mass spectrometry was carried out at greater than unit resolution. Commercial sources provided dilithium phthalocyanine (Aldrich), Eu(acac)$_3$.nH$_2$O (Alfa Aesar) and Pd(PPh$_3$)$_2$Cl$_2$ (Aldrich). Unless otherwise indicated, all other reagents were obtained from Aldrich Chemical Company, and all solvents were obtained from Fisher Scientific.

Chromatography. Adsorption column chromatography was performed using flash silica gel (Baker, 60–200 mesh). Preparative-scale size exclusion chromatography (SEC) was performed using BioRad Bio-beads SX-1. A preparative-scale glass column (4.8×60 cm) was packed using Bio-Beads SX-1 in THF and eluted with gravity flow. Following purification, the SEC column was washed with two volume equivalents of THF. Analytical scale SEC was performed with a Hewlett-Packard 1090HPLC using a 1000 Å column (5 μL, styrene-divinylbenzene copolymer) with THF as eluent (0.8 mL/min).

Solvents. Toluene was distilled from $CaH_2$, THF (Fisher, certified ACS) was distilled from sodium, and triethylamine (Fluka, puriss) was distilled from $CaH_2$. Pyrrole (Acros) was distilled at atmospheric pressure from $CaH_2$. All other solvents were used as received.

General Procedure for the Preparation of Triple Deckers. A mixture of the porphyrin (0.06 mmol) and $Eu(acac)_3$ $nH_2O$ (88 mg, 0.17 mmol) in 1,2,4-trichlorobenzene (13 mL) was heated to reflux and stirred under argon for 4 h. The resulting cherry-red solution was cooled to rt, then the dilithium phthalocyanine (0.09 mmol) was added. The mixture was refluxed for an additional 5 h, then the volatile components were removed under vacuum. The residue was dissolved in $CHCl_3$ and loaded onto a silica gel column packed with the same solvent. Elution with $CHCl_3$ afforded three main bands. The first band (brown) contained mainly the triple-decker complex (Por)Eu(Pc)Eu(Por) and unreacted porphyrin starting material. The second main band (olive or black) contained the triple-decker complex (Pc)Eu(Por)Eu(Pc) in a very small amount, therefore often not isolated or characterized. The third main band (dark green) contained mainly the triple-decker complex (Pc)Eu(Pc)Eu(Por).

The first band collected was redissolved in THF and loaded onto a SEC column. Elution with the same solvent afforded (Por)Eu(Pc)Fu(Por) as the first band (greenish-brown), which after removal of the solvent afforded a brownish-black solid. The dark green band (third) collected was redissolved in toluene and loaded onto a silica gel column packed with the same solvent. Elution with toluene afforded the dark greenish-blue band containing (Pc)Eu(Pc)Eu(Por), which after removal of the solvent afforded a dark green solid. Final purification of each compound will be described specifically.

(T-Por)Eu($C_8$OPc)Eu(T-Por) (4a). The reaction of (T-Por) (12 mg, 0.017 mmol) and $Li_2[(m-OC_8H_{17})_8Pc]$ (40 mg,) was performed as described above. Chromatography (silica, $CHCl_3$) then SEC of the first band gave a greenish-brown solid. The greenish-brown solid was finally purified by chromatography (silica, hexanes:ethyl acetate (gradually from 10% to 30% ethyl acetate)) affording triple-decker complex 4a (12 mg, 42%.). $^1$H NMR ($CDCl_3$) δ 1.25(t, J=7.2 Hz, 24H), 1.7–2.0 (m, 32H), 2.13 (quint, J=7.5 Hz, 16H), 2.37 (quint, J=7.2 Hz, 16H), 2.79 (m, 16H), 3.11 (s, 24H), 3.36 (m, 16H), 4.29 (s, 16H), 5.17 (d, J=6.6 Hz, 8H), 6.0–6.2 (m, 16H), 6.79 (d, J=6.6 Hz, 8H), 9.1–9.3 (m, 8H), 12.10 (s, 8H), 12.83 (s, 8H); LD-MS obsd 3183.7; FAB-MS obsd 3179.54, calcd exact mass 3179.54 ($C_{192}H_{216}N_{16}O_8Eu_2$); $λ_{abs}$ 374, 419, 496, 611 nm.

($C_8$OPc)Eu($C_8$OPc)Eu(T-Por) (4c). Chromatography (of the third band) on silica eluted with a mixture of hexanes and THF (gradually from 0% to 20% THF) afforded pure compound (8 mg, 11%). $^1$H NMR ($CDCl_3$) δ 1.01 (t, J=6.9 Hz, 24H), 1.15 (t, J=7.1 Hz, 24H), 1.27 (s, 24H), 1.4–1.6 (m, 32H), 1.6–1.9 (m, 72H), 1.9–2.3 (m, 48H), 2.5–2.8 (m, 32H), 3.09 (s, 12H), 3.31 (brs, 12H), 4.95 (brs, 8H), 5.17 (m, 4H), 5.7–6.1 (m, 12H), 6.43 (m, 8H), 6.70 (d, J=6.6 Hz, 4H), 9.31 (m, 4H), 13.12 (s, 4H); LD-MS obsd 4047.3; FAB-MS obsd 4048.3, calcd exact mass 4048.4 ($C_{240}H_{324}N_{20}O_{16}EU_2$); $λ_{abs}$ 373, 423, 540, 631, 737 nm.

(T-Por)Eu(tBu$_4$Pc)Eu(T-Pgr) (6a). The reaction of (T-Por) (31 mg, 0.046 mmol) and $Li_2$(tBu$_4$Pc) (45 mg, 0.060 mmol) was performed as described above. Chromatography (silica, $CHCl_3$) then SEC gave a greenish-brown solid. The greenish-brown solid was finally purified by chromatography (silica, hexanes:ethyl acetate (gradually from 10% to 30% ethyl acetate)) (7 mg, 13%) $^1$H NMR ($CDCl_3$) δ 3.0–3.1 (m, 24H), 3.1–3.3 (m, 36H), 4.07 (d, J=5.7 Hz, 16H), 4.91 (q, J=8.1 Hz, 8H), 6.5–6.7 (m, 8H), 9.0–9.1 (m, 8H), 10.7–10.9 (m, 4H), 12.0–1.23 (m, 8H), 12.5–13.0 (m, 8H); LD-MS obsd 2388.0, 1562.7, 1547.2, 823.4; FAB-MS obsd 2378.72, calcd exact mass 2378.83 ($C_{144}H_{120}N_{16}Eu_2$); $λ_{abs}$ 362, 421, 493, 608 nm.

(tBu$_4$Pc)Eu(tBu$_4$Pc)Eu(T-Por) (6c). 1The dark greenish-black solid obtained from chromatography (toluene, as described above) was further purified by chromatography (silica, toluene) (19 mg, 17%). $^1$H NMR ($CDCl_3$) was collected though interpretation was precluded as the compound was isolated as a mixture of inseparable regioisomers. LD-MS obsd 2449.5; FAB-MS obsd 2447.05, calcd exact mass 2446.94 ($C_{144}H_{132}N_{20}Eu_2$); $λ_{abs}$ 346, 417, 526, 620, 727 nm.

(Pn-Por)Eu(tBu$_4$Pc)Eu(Pn-Por)9a). The reaction of (Pn-Por) (40 mg, 0.068 mmol) and $Li_2$(tBu$_4$Pc) (58 mg, 0.077 mmol) was performed as described above. Chromatography (silica, $CHCl_3$) then SEC gave a greenish-brown solid. The greenish-brown solid was finally purified by chromatography (silica, hexanes:ethyl acetate (gradually from 10% to 30% ethyl acetate)) (29 mg, 19%). 1H NMR ($CDCl_3$) 0.6–0.8 (m, 16H), 0.79 (t, J=7.5 Hz, 24H), 1.19 (m, 16H), 1.45 (m, 16H), 3.52 (s, 36H), 3.7–4.0 (m, 16H), 5.0–5.3 (m, 16H), 10.6–10.9 (m, 4H), 12.0–12.5 (m, 8H); LD-MS obsd 2218.82, 2162.0, 2149.0; FAB-MS obsd 2217.97, calcd exact mass 2218.07 ($C_{128}H_{152}N_{16}Eu_2$); Anal. Calcd: C, 69.30; H, 6.91; N, 10.10. Found: C, 69.04; H, 6.86; N, 9.82; $λ_{abs}$ 357, 427, 502, 566, 626 nm.

(tBu$_4$Pe)Eu(tBu$_4$Pc)Eu(Pn-Por) (9c). The dark greenish-black solid obtained from chromatography (toluene, as described above) was further purified by chromatography (silica, toluene) followed by again chromatography (silica, hexanes:ethyl acetate (gradually from 10% to 30% ethyl acetate)) (first band 11 mg, (17%). $^1$H NMR ($CDCl_3$) was collected though interpretation was precluded as the compound was isolated as a mixture of inseparable regioisomers. LD-MS obsd 2374.0; FAB-MS obsd 2366.11, calcd exact mass 2366.05 ($C_{136}H_{147}N_{20}Eu_2$)); $λ_{abs}$ 345, 413, 527, 583, 629, 736 nm.

(tBu$_4$Pc)Eu(tBu$_4$Pc)Eu(tBu$_4$PC) (9d). The dark greenish-black solid obtained from chromatography (toluene, as described above) was further purified by chromatography (silica, toluene) followed by chromatography again (silica, hexanes:ethyl acetate (gradually from 10% to 30% ethyl acetate)) (second band, 11 mg, 17%). The $^1$H NMR spectrum ($CDCl_3$) was collected though interpretation was precluded as the compound was isolated as a mixture of inseparable regioisomers. LD-MS obsd 2523.1; FAB-MS obsd 2514.96, calcd exact mass 2515.04 ($C_{144}H_{144}N_{24}Eu_2$); $λ_{abs}$ 341, 649 nm.

(Pn-Por)Eu(Me$_8$Pc)Eu(Pn-Por) (10a). The reaction of (Pn-Por) (50 mg, 0.085 mmol) and $Li_2$(Me$_8$Pc)(250 mg (compound used without purification) 0.39 mmol) was performed as described above. Chromatography (silica, $CHCl_3$) then SEC gave a greenish-brown solid. The greenish-brown solid was finally purified by chromatography (silica, hexanes:toluene (gradually from 50% to 100% toluene)) and chromatography (silica, hexanes:$CH_2Cl_2$ (gradually from 10% to 20% $CH_2Cl_2$) (7 mg, 8%), which slowly decomposes during purification. $^1$H NMR ($CDCl_3$) δ 0.6–0.8 (m, 16H), 0.90 (t, J=6.9 Hz, 24H ), 1.2–1.5 (m, 32H), 3.8–3.9 (m, 16H), 4.24 (s, 24H), 5.41 (s, 16H), 12.27 (s, 8H); LD-MS obsd 2109.2, 2051.5, 2037.6; FAB-MS obsd 2106.98, calcd exact mass 2106.96 ($C_{120}H_{136}N_{16}Eu_2$); $\lambda_{abs}$ 362, 428, 502, 567, 625 nm.

($Me_8Pc$)Eu($Me_8Pc$)Eu(Pn-Por) (10c). The dark greenish-black solid obtained from chromatography (toluene, as described above) was further purified by chromatography (silica, toluene) followed by chromatography again (silica, $CH_2Cl_2$) (3 mg, 2%); the compound slowly decomposed during purification. The $^1$H NMR ($CDCl_3$) spectrum was collected but the amount of material was insufficient to obtain a good spectrum. LD-MS obsd 2143.3, 1401.7; FAB-MS obsd 2142.79, calcd exact mass 2142.81 ($C_{120}H_{16}N_{20}Eu_2$); $\lambda_{abs}$ 351, 417, 631, 652, 684 nm.

(Pn-Por)Ce($Me_8Pc$)Ce(Pn-Por) (11a). A mixture of meso-tetrapentylporphyrin (75 mg, 0.13 mmol) and Ce(acac)$_3 \cdot nH_2O$ (140 mg,) in 1,2,4-trichlorobenzene (11 mL) was refluxed under a slow stream of argon for 24 h. After cooling, a solid sample of $Li_2$($Me_8Pc$) (610 mg, 0.45 mmol, impure) was added and the mixture was again refluxed Linder argon for 10 h. Evaporation under vacuum gave a dark green solid. The residue was dissolved in $CHCl_3$ and loaded onto a silica gel column packed with the same solvent. Elution with $CHCl_3$ afforded three main bands. The first band (green-brown) contained mainly the title compound and unreacted porphyrin starting material. The dark green band contained mainly the triple-decker complex ($Me_8Pc$)Ce(Pn-Por). The first band collected was redissolved in THF and loaded onto a SEC column. Elution with the same solvent afforded (Pn-Por)Ce($Me_8Pc$)Ce(Pn-Por) 11a as the first band (greenish-brown). The greenish-brown solid was finally purified by washing with MeOH (23 mg, 17%) $^1$H NMR ($CDCl_3$) δ −4.29 (brs, 16H), −2.15 (brs, 8H), −1.44 (s, 24H), 0.51 (m, 16H), 0.58 (t, J=6.7 Hz, 24H, 0.68 (m, 16H), 3.15 (s, 16H), 3.81 (s, 16H); LD-MS obsd 2090.6, 2032.7, 019.3, 1963.6, 1949.4, 1904.0, 1890.1; FAB-MS obsd 2106.98, calcd exact mass 2106.96 ($C_{120}H_{136}N_{16}Eu_2$); $\lambda_{abs}$ 363, 427, 498, 565, 615 nm.

Preparation of Triple Deckers Upon Reaction of Meso-tetrapentylporphyrin and Dilithium 2,3-naphthalocyanine (12a). A mixture of Pn-Por (66 mg 0.11 mmol) and Eu(acac)$_3 \cdot nH_2O$(140 mg, 0.28 mmol) in 1,2,4-trichlorobenzene (21 mL) was refluxed under a slow stream of argon for 4 h. After cooling, a solid sample of $Li_2Nc$ (100 mg, 0.14 mmol) was added and the mixture was again refluxed under argon for 5 h. Evaporation under vacuum gave a dark green solid. The residue was dissolved in $CHCl_3$ and loaded onto a silica gel column packed and eluted with $CHCl_3$. The first band collected was redissolved in THF and loaded onto a SEC column. Elution with the same solvent afforded (Pn-Por)Eu(2,3Nc)Eu(Pn-Por) 12a as the first band (greenish-brown). The greenish-brown solid was finally purified by chromatography (silica, $CH_2Cl_2$/hexanes, 3:1), (4 mg 3%). LD-MS obsd 2203.5, 2146.9, 2132.9; FAB-MS obsd 2194.89, calcd exact mass 2194.89 ($C_{128}H_{128}N_{16}Eu_2$); $\lambda_{abs}$ 330, 429, 543, 612 nm.

4-(3-Methyl-3-hydroxy-1-butyn-1-yl)benzaldehyde (17). 4-Bromobenzaldehyde (3.0 g, 16 mmol), Pd(PPh$_3$)$_2$Cl$_2$ (110 mg, 0.170 mmol) and CuI (16 mg, 0.07 mmol) were placed in a Schlenk flask. The flask was then evacuated and purged with argon (3 times) on the Schlenk line. Then freshly distilled and degassed TEA (32 mL) was added, and after purging with argon, 2-methyl-3-butyn-2-ol (1.90 mL, 19.4 mmol) was added. The reaction mixture was stirred for 2 h at 40° C. (The progress of the reaction was monitored by GC-MS). The reaction mixture was evaporated to dryness and then chromatographed (silica, $CH_2Cl_2$). Bulb-to-bulb distillation (93–95° C., 0.001 mm Hg) gave a pale yellowish oil (2.90 g, 95%). $^1$H NMR ($CDCl_3$) δ 1.61 (s, 6H), 2.23 (brs, 1H), 7.52 (AB/2, J=8.1 Hz, 2H), 7.79 (AB/2, J=8.1 Hz, 2H), 9.02 (s, 1H); $^{13}$C NMR δ 31.9, 66.1, 81.9, 98.8, 129.8, 130.1, 132.7, 35.9, 192.3; IR (film)ν(cm$^{-1}$) 790.4, 830.1, 906.3, 963.4, 1014.3, 1046.1, 1165.9, 1207.0, 1273.4, 1303.0, 1373.0, 1457.6, 1563.8, 1603.6, 1700.0, 2228.1, 2735.0, 2837.8, 2934.1, 2982.2, 3413.3; MS (EI$^+$) m/z 188 (M$^+$,35%), 173 (100%), 159 (10%); EI-MS obsd 188.0835, calcd exact mass 188.0837 ($C_{12}H_{12}O_2$).

5-[4-(3-Methyl-3-hydroxy-1-butyn-1-yl)phenyl] dipyrromethane (18).

Following a standard procedure, a solution of aldehyde 17 (2.5 g, 13 mmol) in pyrrole (23.0 mL, 330 mmol) was treated with TFA (72 μL, 1.3 mmol). Column chromatography (silica, $CH_2Cl_2$ gradually to $CH_2Cl_2$:MeOH (7.5%)) followed by crystallization from ethanol:water afforded white crystals (2.3 g, 56%). mp 145–146° C.; $^1$H NMR ($CDCl_3$) δ 1.62 (s, 6H), 1.89 (brs, 1H), 5.46 (s 1H), 5.89 (s, 2H), 6.17 (dd, J=5.7, 3.0 Hz, 2H), 6.07 (m, 2H), 7.1–7.2 (m, 2H), 7.3–7.4 (m, 2H); $^{13}$C NMR δ 32.2, 44.4, 66.3, 82.7, 94.5, 108.1, 109.1, 118.2, 122.0, 129.1, 132.5, 132.8, 143.1; Anal. Calcd for $C_{20}H_{20}N_2O$: C, 78.92; H, 6.62; N, 9.20. Found: C, 79.03; H, 6.69; N, 30 9.29.

5-[4-(3-methyl-3-hydroxy-1-butyn-1-yl)phenyl]-10,15,20-tri-n-pentylporphyrin (20). Following a standard procedure, dipyrromethane 18 (530 mg, 1.8 mmol) and dipyrromethane-dicarbinol 19 [prepared directly from the diacyldipyrromethane (720 mg, 1.8 mmol) and used without purification] in $CH_3CN$ was treated with TFA (1.6 mL, 29 mmol). Then DDQ (1.2 g, 5.3 mmol) was added and the reaction mixture was stirred for 1 h. Column chromatography on silica (toluene and $CH_2Cl_2$ (3:2)) gave meso-tetrapentylporphyrin (54 mg, 5.2%) and the title compound (275 mg, 23%). $^1$H NMR ($CDCl_3$) δ −2.68 (brs, 2H), 0.9–1.1 (m, 9H), 1.5–1.6 (m, 6H), 1.7–1.9 (m, 12H), 2.2–2.3 (brs, 1H), 2.4–2.6 (m, 6H), 4.8–5.0 (m, 6H), 7.84 (d, J=8.1 Hz, 2H), 8.14 (d, J=7.8 Hz, 2H), 8.78 (d, J=5.1 Hz, 2H), 9.37 (d, J=5.1 Hz, 2H), 9.49 (dd, J=9.6, 5.1 Hz, 4H); LD-MS obsd 680.6, 10 623.1; FAB-MS obsd 678.43 10, calcd exact mass 678.4298 ($C_{46}H_{54}N_4O$); $\lambda_{abs}$ ($CH_2Cl_2$) 422, 520, 554, 600, 658 nm; $\lambda_{em}$ ($\lambda_{exc}$ 520 nm) 661, 731 nm.

Zn(II)5-[4-(3-Methyl-3-hydroxy-1-butyn-1-yl)phenyl]-10,15,20-tri-n-pentylporphyrin (23). Porphyrin 20 (50 mg, 0.07 mmol) was treated with Zn(OAc). 2H$_2$O (1.5 g, 5.0 mmol) in $CH_2Cl_2$:MeOH (10:1, 66 mL). The traditional workup gave a purple solid (50 mg, 91%). $^1$H NMR ($CDCl_3$) δ 1.01 (m, 9H), 1.5–1.6 (m, 7H), 1.7–1.8 (m, 6H), 1.8 (s, 6H), 2.2–2.3 (m, 2H), 2.3–2.5 (m, 4H), 4.29 (t, J=8.6 Hz, 2H), 4.48 (t, J=8.0 Hz, 4H), 7.86 (AB/2, J=8.1 Hz, 2H), 8.13 (AB/2, J=7.8 Hz, 2H), 8.74 (AB/2, J=5.1 Hz, 2H), 8.89 (AB/2, J=4.2 Hz, 2H), 8.90 (AB/2, J=5.7 Hz, 2H), 9.23 (AB/2, J=4.2 Hz, 2H); LD-MS obsd 742.7, 685.4; FAB-MS obsd 740.3452, calcd exact mass 740.3433 ($C_{46}H_{52}N_4OZn$); $\lambda_{abs}$ ($CH_2Cl_2$) 421, 553, 593 nm; $\lambda_{em}$ ($\lambda_{exc}$ 570 nm) 560, 601, 651 nm.

Zn(II)-5-(4-Ethynylphenyl)-10,15,20-tri-n-pentylporphyrin (24). Porphyrin 23 (50 mg, 0.074 mmol) was dissolved in toluene (5 mL) and powdered NaOH (100 mg) was added. The reaction mixture was refluxed for 2 h. After cooling to rt, the mixture was placed on a silica column ($CH_2Cl_2$:hexanes, 3:2), affording 45 mg of a purple solid (98%). $^1$H NMR ($CDCl_3$) δ 1.0–1.1 (m, 9H), 1.4–1.9 (m, 12H), 2.1–2.2 (m, 2H), 2.3–2.5 (m, 4H), 3.43 (s, 1H), 4.0–4.2 (m, 2H), 4.4–45 (m, 4H), 8.01 (AB/2, J=8.1 Hz, 2H), 8.22 (AB/2, J=8.1 Hz, 2H), 8.71 (AB/2, J=4.2 Hz, 2H), 8.78 (AB/2, J=4.2 Hz, 2H), 8.81 (AB/2, J=5.1 Hz, 2H), 9.26 (AB/2, J=4.5 Hz, 2H); LD-MS obsd 684.9, 627.5; FAB-MS obsd 682.3029, calcd exact mass 682.3014 ($C_{43}H_{46}N_4Zn$); $\lambda_{abs}$ ($CH_2Cl_2$) 421, 553, 593 nm; $\lambda_{em}$ ($\lambda_{exc}$ 570 mm) 560, 601, 651 nm.

5-(4-Ethynylphenyl)-10,15,20-tri-n-pentylporphyrin (14). A solution of Zn-porphyrin 24 (45 mg, 0.066 mmol) in $CH_2Cl_2$ was treated with TFA (0.56 mL). The standard workup followed by chromatography afforded a purple solid (34 mg, 83%). $^1$H NMR (CDCl$_3$) δ −2.67 (s, 2H), 1.0–1.1 (m, 9H), 1.5–1.7 (m, 6H), 1.7–1.9 (m, 6H), 2.4–2.6 (m, 6H), 3.37 (s, 1H), 4.8–5.0 (m, 6H), 7.91 (d, J=7.2 Hz, 2H), 8.15 (d, J=8.1 Hz, 2H), 8.80 (d, J=5.1 Hz, 2H), 9.37 (d, J=4.5 Hz, 2H), 9.47 (dd, J=8.1 Hz, 4.2 Hz, 4H); LD-MS obsd 622.2, 564.8; FAB-MS obsd 620.3886, calcd exact mass 620.3879 ($C_{43}H_{48}N_4$); $\lambda_{abs}$ ($CH_2Cl_2$) 420, 519, 555, 597, 657 nm; $\lambda_{em}$ ($\lambda_{exc}$ 535 nm) 659, 728 nm.

Preparation of triple deckers upon reaction of (E-PnPor). Reaction of 5-(4-ethynylphenyl)-10,15,20-tri-n-pentylporphyrin (14) (35 mg 0.57 mmol), Eu(acac)$_3$·nH$_2$O (88 mg, 0.17 mmol) and Li$_2$(tBu$_4$Pc) (49 mg 0.065 mmol) in 1,2,4-trichlorobenzene (13 mL) gave three main products after column chromatography (silica, chloroform). The first band collected was redissolved in THF and loaded onto a SEC column. Elution with the same solvent afforded (E-PnPor)Eu(tBu$_4$Pc)Eu(E-PnPor) (25a) as the first band (greenish-brown), which after removal of the solvent afforded a greenish-black solid (14 mg, 11%). $^1$H NMR (CDCl$_3$) δ 0.85 (brs, 4H), 0.34 (t, J=6.9 Hz, 6H), 0.5–1.0 (m, 28H), 1.25 (m, 8H) 1.57 (m, 8H), 2.6 (brs, 4H), 3.47 (m, 38H), 3.57 (s, 2H), 4.28 (brs, 8H), 4.4–4.6 (m, 4H), 4.7–4.9 (m, 6H), 5.1–5.2 (m, 4H), 5.9–6.1 (m, 4H), 6.81 (d, J=6.6 Hz, 2H), 8.76 (d, J=6.6 Hz, 2H), 9.66 (d, J=5.7 Hz, 2H), 10.96 (m, 4H), 12.68 (m, 8H); LD-MS obsd 2284.9, 2227.2, 2215.8; FAB-MS obsd 2278.99, calcd exact mass 2278.99 ($C_{134}H_{140}N_{16}Eu_2$); $\lambda_{abs}$ 358, 428, 502, 566, 619 nm. The third band (dark green) collected was redissolved in toluene and loaded onto a silica gel column packed with the same solvent. Elution with toluene afforded the first band (dark greenish-blue) containing (tBu$_4$Pc)Eu(tBu$_4$Pc)Eu(E-PnPor) (25c), which after removal of the solvent afforded a dark green solid (16 mg, 12%). $^1$H NMR (CDCl$_3$) was collected though interpretation was precluded as the compound was isolated as a mixture of inseparable regioisomers. LD-MS obsd 2403.5; FAB-MS obsd 2396.96, calcd exact mass 2397.02 ($C_{139}H_{142}N_{20}Eu_2$); $\lambda_{abs}$ 345, 419, 530, 583, 627, 733 nm.

Preparation of Triple Deckers Upon Reaction of (I-PnPor). Reaction of 5-(4-iodophenyl)-10,15,20-tri-n-pentylporphyrin (100 mg, 0.14 mmol), Eu(acac)$_3$·nH$_2$O (213 mg, 0.42 mmol) and Li$_2$(tBu$_4$Pc) (120 mg 0.16 mmol) in 1,2,4-trichlorobenzene (32 mL) gave three triple deckers. The first band (red-brownish) collected was redissolved in THF and loaded onto a SEC column. Elution with the same solvent afforded (I-PnPor)Eu(tBu$_4$Pc)Eu(I-PnPor) (26a) as the first band (olive-brown), which after removal of the solvent afforded a brownish solid (28 mg, 16%). $^1$H NMR (CDCl$_3$) δ 0.81 (brs, 4H), 0.38 (t, J=6.9 Hz, 6H), 0.5–1.0 (m, 24H), 1.1–(m, 8H), 1.5–17 (m, 8H), 2.05 (s, 4H), 2.6–2.7 (m, 4H), 3.4–3.5 (m, 36H), 4.2–4.4 (m, 8H), 4.4–4.7 (m, 4H), 4.7–5.0 (m, 6H), 5.1–5.3 (m, 4H), 5.9–6.2 (m, 4H), 7.05 (d, J=7.5 Hz, 2H), 9.01 (d, J=6.6 Hz, 2H), 9.50 (d, J=6.0 Hz, 2H), 10.9–11.1 (m, 4H), 12.6–12.9 (m, 8H); LD-MS (with POPOP as a matrix) obsd 2491.0, 2442.3, 2434.23, 2363.73; FAB-MS obsd 2482.78, calcd exact mass 2482.78 ($C_{130}H_{138}N_{16}I_2Eu_2$); tabs 359, 428, 501, 569, 619 nm. The third band (dark green) collected was redissolved in toluene and loaded onto a silica gel column packed with the same solvent. Elution with toluene afforded the main band (dark greenish-blue) containing (tBu$_4$Pc)Eu(tBu$_4$Pc)Eu(I-PnPor) (26c), which after removal of the solvent afforded a dark green solid (40 mg, 12%). $^1$H NMR (CDCl$_3$) was collected though interpretation was precluded as the compound was isolated as a mixture of inseparable regioisomers. LD-MS obsd 2508.2, 2381.7; FAB-MS obsd 2498.92, calcd exact mass 2498.91 ($C_{137}H_{141}IN_{20}IEu_2$); $\lambda_{abs}$ 345, 416, 529, 583, 627, 732 nm.

Preparation of Triple Deckers Upon Reaction of EB-Por (27c). Reaction of 5,10,15-tris[4-tert-butylphenyl]-20-[4-(2-(trimethylsilyl)ethynyl)phenyl]porphyrin (88 mg, 0.10 mmol), Eu(acac)$_3$nH$_2$O (150 mg, 0.3 mmol) and Li$_2$Pc (80 mg, 0.15 mmol) in 1,2,4-trichlorobenzene (20 mL) resulted in four bands after column chromatography (silica, CHCl$_3$). The first band (olive-brown) collected was redissolved in THF and loaded onto a SEC column. Elution with the same solvent afforded (EB-Por)Eu(Pc)Eu(EB-Por) (27a) as the first band (greenish-brown), which after removal of the solvent and washing with CH$_3$OH afforded a greenish-black solid (34 mg, 26%). $^1$H NMR (CDCl$_3$) δ 0.62 (s, 18H), 1.89 (s, 54H), 3.83–4.03 (m, 16H), 4.76 (m, 9H), 6.71 (m, 6H), 6.84 (m, 2H), 9.00 (brs, 6H), 9.19 (m, 2H), 10.65 (brs, 8H), 11.46–11.60 (m, 8H), 12.73 (brs, 8H); LD-MS obsd 2574.1; FAB-MS obsd 2570.90, calcd exact mass 2570.91 ($C_{154}H_{136}N_{16}Si_2Eu_2$); $\lambda_{abs}$ 355, 421, 493, 559, 606 nm.

The third band (black) collected was also redissolved in THF and loaded onto a SEC column. Elution with THF afforded (Pc)Eu(EB-Por)Eu(Pc) (27b) as the second band (black), which after removal of the solvent and washing with CH$_3$OH afforded a black solid (3.5 mg, 1.6%). $^1$H NMR (CDCl$_3$) δ 0.85 (s, 18H), 2.89, 2.94 (m, 26H), 8.05 (brs, 16H), 9.59 (brs, 16H), 9.99 (m, 2H), 10.10 (m, 4H), 11.98–12.20 (m, 4H), 13.52 (m, 2H), 13.68 (m, 4H); LD-MS obsd 2209.1, 2206.2; FAB-MS obsd 2206.60, calcd exact mass 2206.60 ($C_{125}H_{94}N_{20}SiEu_2$); $\lambda_{abs}$ 343, 416, 519, 625, 653 nm.

The last band (green) collected was redissolved in toluene and loaded onto a short silica gel column packed with the same solvent. Elution with toluene afforded the first band (greenish-blue) (Pc)Eu(Pc)Eu(EB-Por) (27c), which after removal of the solvent and washing with CH$_3$OH afforded a green solid (20 mg, 9.1%). $^1$H NMR (CDCl$_3$) δ 0.68 (s, 9H), 1.86 (m, 27H), 3.20–3.29 (m, 8H), 7 4.71–4.91 (m, 4H), 6.67 (m, 3H), 6.91 (m, 1H), 8.72 (brs, 8H), 9.08–9.16 (m, 3H), 9.41 (m, 1H), 10.10 (brs, 8H), 11.10 (brs, 8H), 11.69 (m, 2H), 11.88 (m, 1H), 12.16 (m, 1H), 12.97 (brs, 8H); LD-MS obsd 2117.1 (M$^+$), 1181.4 [M$^+$-(EB-Por)Eu], 919.3 (M$^+$(Pc) Eu(Pc); FAB-MS obsd 2206.60, calcd exact mass 2206.60 ($C_{125}H_{92}N_{20}SiEu_2$); $\lambda_{abs}$ 342, 417, 522, 552, 618, 721 nm.

Formation of (Pc)Eu(Pc)Eu(E'B-Por) (28). A sample of (Pc)Eu(Pc)Eu(EB-Por) (27c) (20 mg, 0.009 mmol) was treated with K$_2$CO$_3$ and worked-up following the standard procedure. Column chromatography (silica, CHCl$_3$) afforded a black solid (18 mg, 94%). $^1$H NMR (CDCl$_3$) δ 1.96 (m, 27H), 3.30–3.38 (m, 8H), 3.71 (s, 1H), 4.77 (d, J=7.2 Hz, 3H), 5.00 (d, J=6.6 Hz, 1H), 6.70 (m, 3H), 6.95 (d, J=7.2 Hz, 1H), 8.76 (brs, 8H), 9.09–9.16 (m, 3H), 9.40 (m, 1H), 10.16 (brs, 8H), 11.17 (brs, 8H), 11.56 (m, 2H), 11.73 (m, 1H), 12.00 (m, 1H), 13.04 (brs, 8H); LD-MS obsd 2136.5 (M$^+$); FAB-MS obsd 2134.56, calcd exact mass 2134.56 ($C_{122}H_{84}N_{20}Eu_2$); $\lambda_{abs}$ 343, 415, 522, 552, 618, 722 nm.

S-Acetylthio-derivatized Triple Decker (13). Route 1: Samples of (tBu$_4$Pc)Eu(tBu$_4$Pc)Eu(E-PnPor) (25c) (39 mg, 16 μmol), 4-iodo-1-(S-acetylthio)benzene (44.5 mg, 0.16 mmol), Pd(PPh$_3$)$_2$Cl$_2$ (1.7 mg, 2.4 μmol) and CuI (0.22 mg, 1.1 μmol) were added to Schlenk flask. The flask was evacuated and purged with argon three times. Then deaerated THF (6.0 mL) and deaerated DIEA (1.5 mL) were added by syringe. The flask was immersed in an oil bath at 30° C. and stirred under argon. The reaction was monitored by TLC (silica, toluene:Et$_2$O, 60:1) and LD-MS. After 20 h, the solvent was removed under vacuum and the residue was dissolved in toluene and loaded onto a silica gel column packed with the same solvent. Elution with toluene and then toluene:ether (60:1) did not afford separation of products. The residue was redissolved in THF and loaded onto a SEC column. Elution with the same solvent afforded butadiyne-linked dyad 29 as the first band. The title compound 13 was eluted as the second band together with acetylated starting material 30, which were not separable by any chromatographic method examined.

Route 2: Samples of(tBu$_4$Pc)Eu(tBu$_4$Pc)Eu(I-PnPor) (26c) (35 mg, 14 μmol), 4-ethynyl-1-(S-acetylthio)benzene (3 mg, 14 μmol), Pd$_2$(dba)$_3$ (2.0 mg, 22 μmol) and P(o-tol)$_3$ (5.1 mg, 17 μmol) were added to Schlenk flask. The flask was evacuated and purged with argon three times. Then deaerated toluene (4.6 mL) and deaerated DIEA (0.9 mL) were added by syringe. The flask was immersed in an oil bath at 35° C. and stirred under argon. The reaction was monitored by TLC (silica, toluene) and LD-MS. After 44 h, the solvent was removed under vacuum, the residue dissolved in toluene, and loaded onto a silica gel column packed with the same solvent. Elution with toluene afforded the desired product together with a trace of unreacted starting material as the first band. The product thus obtained was further purified by a second column chromatography procedure (silica gel, toluene), affording a black solid (13) (5.0 mg, 14%). $^1$H NMR (CDCl$_3$) was collected though interpretation was precluded as the compound was isolated as a mixture of inseparable regioisomers. LD-MS obsd 2550.3, 2507.8, 2495.2, 2480.2; FAB-MS obsd 2547.05, calcd exact mass 2547.03 (C$_{147}$H$_{148}$N$_{20}$OSEu$_2$); λ$_{abs}$ 339, 415, 527, 577, 625, 723 nm.

S-Acetylthio-derivatized triple decker (15). Samples of (Pc)Eu(Pc)Eu(E'B-Por) (28) (15 mg, 7.0 μmol), 4-iodo-1-(S-acetylthio)benzene (2.0 mg, 7.0 μmol). Pd$_2$(dba)$_3$ (1.0 mg, 1.1 μmol) and P(o-tolyl)$_3$ (2.5 mg, 8.3 μmol) were added to a Schlenk flask. The flask was evacuated and purged with argon three times. Then deaerated toluene (3 mL) and deaerated N,N-diisopropylethylamine (0.6 mL) were added by syringe. The flask was immersed in an oil bath at 35 C and stirred under argon. The reaction was monitored by TLC (silica, toluene) and LD-MS. After 24 h, the solvent was removed under vacuum, the residue dissolved in toluene/ether (60:1), and loaded onto a silica gel column packed with the same solvent. Elution with toluene/ether (60:1) afforded the desired product together with trace of unreacted starting material as the first band. The product thus obtained was further purified by a second column chromatography procedure (silica gel, toluene), affording a black solid (15) (3.1 mg, 19%) after removal of the solvent and washing with CH$_3$OH. $^1$H NMR (CDCl$_3$) δ 1.91 (m, 27H), 2.62 (s, 3H), 3.28 (m, 8H), 4.70–4.80 (m, 3H), 4.98 (d, J=6.6 Hz, 1H), 6.68 (m, 4H), 6.94 (d, J=6.6 Hz, 1H), 7.54 (m, 1H), 7.71 (m, 1H), 8.03 (m, 1H), 8.71 (brs, 8H), 9.05–9.12 (m, 3H), 9.42 (m, 1H), 10.10 (brs, 8H), 11.11 (brs, 8H), 11.56 (m, 2H), 11.72 (m, 1H), 12.02 (m, 1H), 12.98 (brs, 8H); LD-MS obsd 2291.4 (M$^+$), 2250.2 (M$^+$—CH$_3$CO), 1181.0 (M$^+$-(Por)Eu), 1111.6 (M$^+$-(Pc)Eu(Pc)), 1067.8 (M$^+$-(Pc)Eu(Pc)—CH$_3$CO); FAB-MS obsd 2284.59, calcd exact mass 2284.58 (C$_{130}$H$_{90}$OSN$_{20}$Eu$_2$); λ$_{abs}$ 341, 419, 523, 618, 721 nm.

Electrochemistry. The solution and SAM electrochemical studies were conducted using standard instrumentation, techniques, and preparation strategies. The solvent was CH$_2$C$_{12}$; tetrabutylammonium hexafluorophosphate (TBAH, 0.1 M) (Aldrich, recrystallized three times from methanol and dried under vacuum at 110° C.) served as supporting electrolyte. The potentials reported are vs Ag/Ag$^+$; E (FeCp$_2$/FeCp$_2$$^+$)=0.19 V.

The foregoing is illustrative of the present invention, and is not to be construed as limiting thereof. The invention is defined by the following claims, with equivalents of the claims to be included therein.

TABLE 4

Yield of triple-decker complexes.

| Entry | Porphyrin | Phthalocyanine | Metal | Products | Yield [%] |
|---|---|---|---|---|---|
| 1 | 1a | 2a | Eu | 3a | 23 |
|   |    |    |    | 3b | 3 |
|   |    |    |    | 3c | 10 |
| 2 | 1a | 2b | Eu | 4a | 42 |
|   |    |    |    | 4c | 11 |
| 3 | 1a | 2d | Eu | 6a | 13 |
|   |    |    |    | 6b | 2.7 |
|   |    |    |    | 6c | 17 |
| 5 | 1b | 2d | Eu | 9a | 39 |
|   |    |    |    | 9c | 17 |
|   |    |    |    | 9d | 717 |
| 6 | 1b | 2e | Eu | 10a | 8 |
|   |    |    |    | 10d | 2.0 |
| 7 | 1b | 2e | Ce | 11a | 17 |
| 8 | 1b | 2f | Eu | 12a | 3 |

TABLE 5

Oxidation potentials for triple-decker complexes

| Compound | Oxidation potentials | | | | | | |
|---|---|---|---|---|---|---|---|
| | +4 | +3 | +2 | +1 | −1 | −2 | −3 |
| 3a | 1.18 | 0.93 | 0.61 | 0.19 | | | |
| 3c | +1.289 | +1.010 | +0.623 | +0.223 | −0.907 | −1.370 | −1.850 |
| 4a | +1.117 | +0.914 | +0.529 | +0.191 | −1.212 | −1.682 | |
| 4c |  |  | +0.349 | +0.056 | −1.173 | −1.545 | |
| 6a | +1.267 | +0.982 | +0.623 | +0.262 | −1.145 | −1.651 | |
| 6b | +1.170 | +0.932 | +0.457 | +0.272 | −1.115 | −1.444 | −1.810 |
| 6c |  | +1.014 | +0.564 | +0.133 | −1.029 | −1.508 | |
| 9a | +1.211 | +0.850 | +0.443 | +0.031 | −1.291 | −1.773 | |
| 9c | +1.264 | +0.888 | +0.447 | +0.086 | −1.090 | −1.514 | |
| 9d |  | +0.955 | +0.431 | +0.136 | −0.944 | −1.410 | −1.819 |
| 10a | +1.19 | +0.83 | +0.42 | 0.00 | | | |

TABLE 5-continued

Oxidation potentials for triple-decker complexes

| Com-pound | Oxidation potentials | | | | | | |
|---|---|---|---|---|---|---|---|
| | +4 | +3 | +2 | +1 | −1 | −2 | −3 |
| 10c | +1.17 | +0.82 | +0.36 | +0.013 | | | |
| 11a | +1.147 | +0.725 | +0.429 | +0.037 | | | |
| 12a | +1.071 | +0.781 | +0.345 | −0.126 | | | |

What is claimed is:

1. An apparatus for storing data, said apparatus comprising:
a fixed electrode electrically coupled to
a storage medium having a plurality of different and distinguishable oxidation states wherein data is stored in said oxidation states by the addition or withdrawal of one or more electrons from said storage medium via the electrically coupled electrode;
said storage medium comprising a polymer;
said polymer comprising a plurality of covalently joined monomeric units, each of said monomeric units comprising an independently selected sandwich coordination compound;
and wherein said storage medium comprises a plurality of double-decker or triple-decker sandwich coordination compounds.

2. An apparatus according to claim 1, wherein said storage medium comprises a plurality of heteroleptic sandwich coordination compounds.

3. An apparatus according to claim 1, wherein said storage medium comprises a plurality of heteroleptic sandwich coordination compounds.

4. The apparatus of claim 1, wherein said storage medium has a memory storage density of at least about 10 gigabits per cm² in a sheet-like device.

5. The apparatus of claim 1, wherein said storage medium is covalently linked to said electrode.

6. The apparatus of claim 1, wherein said storage medium is covalently linked to said electrode by thiol linkers.

7. The apparatus of claim 1, wherein said storage medium is juxtaposed in the proximity of said electrode such that electrons can pass from said storage medium to said electrode.

8. The apparatus of claim 1, wherein said storage medium is juxtaposed to a dielectric material embedded with counterions.

9. The apparatus of claim 1, wherein said storage medium and said electrode are fully encapsulated in an integrated circuit.

10. The apparatus of claim 1, wherein said storage medium is electronically coupled to a second electrode that is a reference electrode.

11. The apparatus of claim 1, wherein said storage medium is present on a single plane in said device.

12. The apparatus of claim 1, wherein said storage medium is present at a multiplicity of storage locations.

13. The apparatus of claim 12, wherein said apparatus comprises multiple planes and said storage locations are present on multiple planes of said apparatus.

14. The apparatus of claim 12, wherein said storage locations range from about 1024 to about 4096 different locations.

15. The apparatus of claim 14, wherein each location is addressed by a single electrode.

16. The apparatus of claim 14, wherein each location is addressed by two electrodes.

17. The apparatus of claim 1, wherein said electrode is connected to a voltage source.

18. The apparatus of claim 17, wherein said voltage source is the output of an integrated circuit.

19. The apparatus of claim 1, wherein said electrode is connected to a device to read the oxidation state of said storage medium.

20. The apparatus of claim 19, wherein said device is selected from the group consisting of a voltammetric device, an amperometric device, and a potentiometric device.

21. The apparatus of claim 20, wherein said device is a sinusoidal voltammeter.

22. The apparatus of claim 19, wherein said device provides a Fourier transform of the output signal from said electrode.

23. The apparatus of claim 19, wherein said device refreshes the oxidation state of said storage medium after reading said oxidation state.

24. The apparatus of claim 1, wherein said different and distinguishable ho oxidation states of said storage medium can be set by a voltage difference no greater than about 2 volts.

25. An information storage medium, said storage medium comprising at least one storage molecule such that said storage medium has at least two different and distinguishable non-neutral oxidation states;
wherein said storage molecule comprises a polymer;
said polymer comprising a plurality of covalently joined monomeric units, each of said monomeric units comprising an independently selected sandwich coordination compound;
and wherein said storage molecule comprises a plurality of double-decker or triple-decker sandwich coordination compounds.

26. A storage medium according to claim 25, wherein said storage molecule comprises a plurality of heteroleptic sandwich coordination compounds.

27. A storage medium according to claim 25, wherein said storage medium comprises a plurality of homoleptic sandwich coordination compounds.

28. The storage medium of claim 25, wherein each storage molecule is present at a discrete storage location on a substrate.

29. The storage medium of claim 25, wherein the storage molecule is in contact with a dielectric material embedded with counterions.

30. The storage medium of claim 25, wherein said storage medium has a memory storage density of at least about 10 gigabits per cm² in a sheet-like device.

31. The storage medium of claim 25, wherein said storage medium is juxtaposed to a dielectric material embedded with counterions.

32. The storage medium of claim 25, wherein said storage medium is present on a single plane in said device.

33. The storage medium of claim 25, wherein said storage medium is present at a multiplicity of storage locations.

34. The storage medium of claim 25, wherein said storage locations range from about 1024 to about 4096 different locations.

35. A method of storing data, said method comprising:
  (i) providing an apparatus according to claim 1; and
  (ii) applying a voltage to said electrode at sufficient current to set an oxidation state of said storage medium.

36. The method of claim 35, wherein said voltage ranges up to about 2 volts.

37. The method of claim 35, wherein said voltage is the output of an integrated circuit.

38. The method of claim 35, further comprising detecting the oxidation state of said storage medium and thereby reading out the data stored therein.

39. The method of claim 38, wherein said detecting the oxidation state of the storage medium further comprises refreshing the oxidation state of the storage medium.

40. The method of claim 38, wherein said detecting comprises analyzing a readout signal in the time domain.

41. The method of claim 38, wherein said detecting comprises analyzing a readout signal in the frequency domain.

42. The method of claim 41, wherein said detecting comprises performing a Fourier transform on said readout signal.

43. The method of claim 38, wherein said detecting utilizes a voltammetric method.

44. In a computer system, a memory device, said memory device comprising the apparatus of claim 1.

45. A computer system comprising a central processing unit, a selector device, and a memory device, said memory device comprising the apparatus of claim 1.

46. A computer system according to claim 45, further comprising a display.

* * * * *